US011036120B2

(12) United States Patent
Nagao et al.

(10) Patent No.: US 11,036,120 B2
(45) Date of Patent: *Jun. 15, 2021

(54) PROJECTOR INCLUDING PHOSPHOR

(71) Applicant: Panasonic Intellectual Property Management Co., Ltd., Osaka (JP)

(72) Inventors: Nobuaki Nagao, Gifu (JP); Mitsuru Nitta, Kyoto (JP); Yasuhisa Inada, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 24 days.

This patent is subject to a terminal disclaimer.

(21) Appl. No.: 15/933,624

(22) Filed: Mar. 23, 2018

(65) Prior Publication Data

US 2018/0217482 A1     Aug. 2, 2018

Related U.S. Application Data

(63) Continuation-in-part of application No. PCT/JP2017/019467, filed on May 25, 2017, which is
(Continued)

(30) Foreign Application Priority Data

Jul. 4, 2016 (JP) .............................. JP2016-132126
Feb. 16, 2017 (JP) .............................. JP2017-026910
Feb. 27, 2017 (JP) .............................. JP2017-035539

(51) Int. Cl.
*G03B 21/20* (2006.01)
*G03B 33/08* (2006.01)
(Continued)

(52) U.S. Cl.
CPC ........ *G03B 21/204* (2013.01); *C09K 11/0883* (2013.01); *C09K 11/62* (2013.01);
(Continued)

(58) Field of Classification Search
CPC .............. G03B 21/204; G03B 21/2066; G03B 21/2013; G03B 21/2053; G03B 33/08;
(Continued)

(56) References Cited

U.S. PATENT DOCUMENTS 4,507,585 A    3/1985 Inoue et al.
4,809,291 A    2/1989 Byer et al.
(Continued)

FOREIGN PATENT DOCUMENTS

CN    101220272 A    7/2008
CN    102361956 A    2/2012
(Continued)

OTHER PUBLICATIONS

International Search Report of PCT application No. PCT/JP2017/019467 dated Aug. 22, 2017.
(Continued)

*Primary Examiner* — Jerry L Brooks
(74) *Attorney, Agent, or Firm* — McDermott and Will and Emery LLP

(57) ABSTRACT

A projector includes a light source unit, a spatial light modulator configured to control light from the light source unit for each pixel to form an optical image, and a projection optical system configured to project the optical image formed by the spatial light modulator onto a target. The light source unit includes a solid-state light source and a wavelength convertor. The solid-state light source is configured to emit first light, the first light including blue light with a peak wavelength in a range of 430 to 470 nm, inclusive, and green light with a peak wavelength in a range of 480 to 550 nm,
(Continued)

inclusive. The wavelength convertor contains a red phosphor including Ce as a luminescent center that is configured to emit second light upon receiving the green light. The second light has a spectrum with a peak wavelength of 600 to 700 nm, inclusive. The red phosphor contains a nitride or an oxynitride as a host material.

19 Claims, 27 Drawing Sheets

Related U.S. Application Data a continuation-in-part of application No. PCT/JP2017/000935, filed on Jan. 13, 2017.

(51) Int. Cl.

| G03B 33/00 | (2006.01) |
| H01S 5/00 | (2006.01) |
| C09K 11/08 | (2006.01) |
| C09K 11/62 | (2006.01) |
| C09K 11/77 | (2006.01) |
| H01S 3/16 | (2006.01) |
| H01S 5/30 | (2006.01) |

(52) U.S. Cl.
CPC ...... *C09K 11/7774* (2013.01); *G03B 21/2066* (2013.01); *G03B 33/00* (2013.01); *G03B 33/08* (2013.01); *H01S 5/005* (2013.01); *G03B 21/2013* (2013.01); *G03B 21/2053* (2013.01); *H01S 3/1643* (2013.01); *H01S 5/3013* (2013.01)

(58) Field of Classification Search
CPC .. G03B 33/00; C09K 11/0883; C09K 11/062; C09K 11/7774
USPC .......................................................... 353/85
See application file for complete search history.

(56) References Cited

U.S. PATENT DOCUMENTS

| 5,202,891 | A | 4/1993 | Sleight et al. |
| 5,246,804 | A | 9/1993 | Furukawa et al. |
| 6,228,286 | B1 | 5/2001 | Leblans et al. |
| 6,569,156 | B1 | 5/2003 | Tankovich et al. |
| 7,094,362 | B2 | 8/2006 | Setlur et al. |
| 8,337,400 | B2 | 12/2012 | Mizuyoshi |
| 3,491,816 | A1 | 7/2013 | Hong et al. |
| 8,790,253 | B2 | 7/2014 | Sunagawa et al. |
| 8,858,429 | B2 | 10/2014 | Mizuyoshi et al. |
| 9,062,253 | B2 | 6/2015 | Won et al. |
| 9,526,408 | B2 | 12/2016 | Yamaguchi et al. |
| 9,725,648 | B2 | 8/2017 | Izawa et al. |
| 10,026,876 | B2 | 7/2018 | Hosokawa et al. |
| 10,411,170 | B2 | 9/2019 | Tragl et al. |
| 2004/0145308 | A1 | 7/2004 | Rossner et al. |
| 2005/0117334 | A1 | 6/2005 | Lee et al. |
| 2005/0242329 | A1 | 11/2005 | Fiedler et al. |
| 2006/0043879 | A1 | 3/2006 | Naitou |
| 2006/0197098 | A1 | 9/2006 | Aihara |
| 2007/0126011 | A1 | 6/2007 | Lee |
| 2007/0159066 | A1* | 7/2007 | Cheetham .......... C09K 11/0883 313/503 |
| 2007/0263678 | A1 | 11/2007 | Mizuuchi et al. |
| 2008/0150412 | A1 | 6/2008 | Yoshimatsu |
| 2008/0262316 | A1 | 10/2008 | Ajima et al. |
| 2009/0066230 | A1 | 3/2009 | Hirosaki et al. |
| 2009/0167149 | A1 | 7/2009 | Ito |
| 2009/0312607 | A1 | 12/2009 | Sunagawa et al. |
| 2010/0085728 | A1 | 4/2010 | Seto et al. |
| 2011/0198651 | A1 | 8/2011 | Chen et al. |
| 2012/0242912 | A1 | 9/2012 | Kitano |
| 2012/0256533 | A1 | 10/2012 | Seto et al. |
| 2012/0300178 | A1* | 11/2012 | Sugiyama ............ H04N 9/3164 353/31 |
| 2012/0302847 | A1 | 11/2012 | Ozawa et al. |
| 2013/0234588 | A1 | 9/2013 | Seto et al. |
| 2014/0131748 | A1 | 5/2014 | Song |
| 2014/0185282 | A1 | 7/2014 | Hsu et al. |
| 2014/0264402 | A1 | 9/2014 | Mei et al. |
| 2014/0285772 | A1 | 9/2014 | Tajiri |
| 2016/0150200 | A1* | 5/2016 | Saka .................. G03B 21/204 353/31 |
| 2016/0276549 | A1 | 9/2016 | Yamashita et al. |
| 2016/0330806 | A1 | 11/2016 | Yamashita et al. |
| 2017/0263592 | A1 | 9/2017 | Schmidt et al. |
| 2017/0307163 | A1 | 10/2017 | Nagasaki et al. |
| 2017/0331012 | A1 | 11/2017 | Heidemann et al. |
| 2017/0343188 | A1 | 11/2017 | Oshio et al. |
| 2018/0346808 | A1 | 12/2018 | Nitta et al. |
| 2019/0171093 | A1 | 6/2019 | Furuyama et al. |
| 2019/0177614 | A1 | 6/2019 | Nagao et al. |

FOREIGN PATENT DOCUMENTS

| CN | 102543986 A | 7/2012 |
| CN | 103148395 A | 6/2013 |
| CN | 103254900 A | 8/2013 |
| CN | 103715342 A | 4/2014 |
| EP | 2610217 A1 | 7/2013 |
| JP | 2005-167177 | 6/2005 |
| JP | 2005-167177 A | 6/2005 |
| JP | 2006-008721 A | 1/2006 |
| JP | 2006-073656 | 3/2006 |
| JP | 2006-073656 A | 3/2006 |
| JP | 2006-245443 A | 9/2006 |
| JP | 2007-158296 | 6/2007 |
| JP | 2007-158296 A | 6/2007 |
| JP | 2007-515527 A | 6/2007 |
| JP | 2007-231245 A | 9/2007 |
| JP | 2008-088362 A | 4/2008 |
| JP | 2008-177484 A | 7/2008 |
| JP | 2008-285659 A | 11/2008 |
| JP | 2009-512741 A | 3/2009 |
| JP | 2009-153712 A | 7/2009 |
| JP | 2009-189473 A | 8/2009 |
| JP | 2009-249445 A | 10/2009 |
| JP | 4729480 B2 | 7/2011 |
| JP | 2011-526066 A | 9/2011 |
| JP | 2012-114040 A | 6/2012 |
| JP | 2012-212129 | 11/2012 |
| JP | 2014-224230 A | 12/2014 |
| JP | 2016-028124 A | 2/2016 |
| JP | 2016-104232 A | 6/2016 |
| KR | 10-2010-0010922 A | 2/2010 |
| WO | 2007/041563 A2 | 4/2007 |
| WO | 2009/157999 A1 | 12/2009 |
| WO | 2015/025570 A1 | 2/2015 |
| WO | 2016/092743 A1 | 6/2016 |

OTHER PUBLICATIONS

International Search Report of PCT application No. PCT/JP2017/000935 dated Mar. 7, 2017.
Yongchao Jia et al., "First-principles study of Ce3+-doped lanthanum silicate nitride phosphors: Neutral excitation, Stokes shift, and luminescent center identification", Physical Review B93, 155111, Apr. 6, 2016.
Yun-Chen Wu et al., "a-(Y,Gd)FS:Ce3+: a novel red-emitting fluorosulfide phosphor for solid-state lighting", Journal of Materials Chemistry, 21, Oct. 21, 2011, pp. 15163-15166.
International Search Report of PCT application No. PCT/JP2017/019464 dated Jun. 27, 2017.
International Search Report of PCT application No. PCT/JP2017/019465 dated Aug. 22, 2017.
International Search Report of PCT application No. PCT/JP2017/019466 dated Aug. 22, 2017.
The Extended European Search Report dated Jun. 27, 2019 for the related European Patent Application No. 17823889.5.

(56) References Cited

OTHER PUBLICATIONS

The Extended European Search Report dated Jun. 28, 2019 for the related European Patent Application No. 17823890.3.
The Extended European Search Report dated Jun. 28, 2019 for the related European Patent Application No. 17823891.1.
The Extended European Search Report dated Jul. 2, 2019 for the related European Patent Application No. 17780614.8.
The Extended European Search Report dated Jun. 27, 2019 for the related European Patent Application No. 17734219.3.
Lihong Liu et al: "Yellow-Emitting Y3Si6N11: Ce3+0 Phosphors for White Light-Emitting Diodes (LEDs)", Journal of the American Ceramic Society., vol. 96, No. 6, Jun. 1, 2013 (Jun. 1, 2013), pp. 1688-1690,XP055450326.
Database WPI Week 201372 Thomson Scientific, London, GB; AN 2013-R71607, XP002792144.
R. Le Toquin et al., "Red-emitting cerium-based phosphor materials for solid-state lighting applications", Chemical Physics Letters, vol. 423, Issues4-6, Jun. 1, 2006, pp. 352-356.
Qiang-Qiang Zhu et al., "Extra-Broad Band Orange-Emitting Ce3+-Doped Y3Si5N9O Phosphor for Solid-State Lighting: Electronic, Crystal Structures and Luminescence Properties", Chemistry of Materials, vol. 28, Jun. 20, 2016, pp. 4829-4839.
English Translation of Chinese Search Report dated Jan. 27, 2021 for the related Chinese Patent Application No. 201780002095.2.
English Translation of Chinese Search Report dated Jan. 27, 2021 for the related Chinese Patent Application No. 201780002084.4.
English Translation of Chinese Search Report dated Jan. 6, 2021 for the related Chinese Patent Application No. 201780002085.9.
Notice of Allowance issued in U.S. Appl. No. 15/636,747, dated Oct. 17, 2018.
Non-Final Office Action issued in U.S. Appl. No. 15/723,240, dated May 1, 2020.
Non-Final Office Action issued in U.S. Appl. No. 15/933,606, dated Jun. 17, 2020.
English Translation of Chinese Search Report dated May 8, 2020 for the related Chinese Patent Application No. 201780002095.2.
English Translation of Chinese Search Report dated May 8, 2020 for the related Chinese Patent Application No. 201780002084.4.
Non-Final Office Action issued in U.S. Appl. No. 15/933,455, dated Sep. 5, 2019.
Notice of Allowance issued in U.S. Appl. No. 15/933,455, dated Mar. 10, 2020.
Non-Final Office Action issued in U.S. Appl. No. 16/245,101, dated Oct. 31, 2019.
Notice of Allowance issued in U.S. Appl. No. 16/245,101, dated Mar. 13, 2020.

* cited by examiner

PROJECTOR INCLUDING PHOSPHOR

BACKGROUND

1. Technical Field

The present disclosure relates to a projector including a phosphor.

2. Description of the Related Art

Projectors that project various enlarged images on a screen are widely used. Projectors concentrate light emitted from a light source onto a spatial light modulator, such as a digital micromirror device (DMD) or a liquid crystal display device. The light is modulated by image signals, and output from the spatial light modulator. The output light is displayed as color images on the screen.

In order to produce bright large-screen images, projectors require high-intensity light. In particular, systems used as projectors for projection mapping require a light source that can emit higher-intensity light.

Thus, in recent years, projectors that utilize a high-power solid-state light source, such as a light emitting diode (LED) or a laser diode (LD), have been proposed. In particular, light-emitting apparatuses in which LED light or LD light is combined with light emitted from a phosphor using LED light or LD light as excitation light are proposed as light sources for projectors (for example, Japanese Patent No. 5842162). Due to their small sizes and high-power, such light-emitting apparatuses including a solid-state light source, such as a LD, and a phosphor in combination are suitable for light sources for projectors.

SUMMARY

One non-limiting and exemplary embodiment provides a projector in which the power can be improved.

In one general aspect, the techniques disclosed here feature a projector that includes a light source unit, a spatial light modulator configured to control light from the light source unit for each pixel to form an optical image, and a projection optical system configured to project the optical image formed by the spatial light modulator onto a target. The light source unit includes a solid-state light source and a wavelength convertor. The solid-state light source is configured to emit first light, the first light including blue light with a peak wavelength in a range of 430 to 470 nm, inclusive, and green light with a peak wavelength in a range of 480 to 550 nm, inclusive. The wavelength convertor contains at least a red phosphor including Ce as a luminescent center. The red phosphor is configured to emit second light upon receiving the green light. The second light has a spectrum with a peak wavelength in a range of 600 to 700 nm, inclusive. The red phosphor contains a nitride or an oxynitride as a host material.

According to the present disclosure, the power can be improved.

It should be noted that general or specific embodiments of the present disclosure may be implemented as a phosphor, a device, an apparatus, a system, a vehicle, a method, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

Figure 1A:
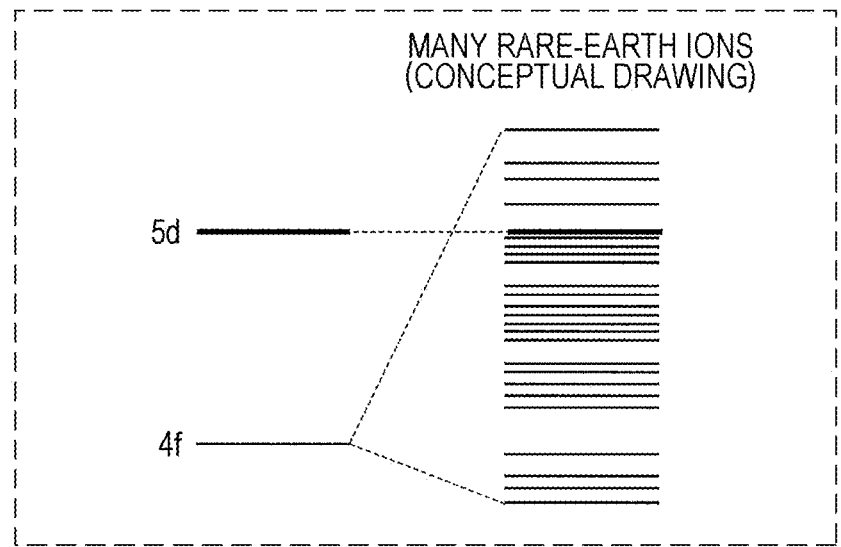
FIG. 1A is a schematic view of splitting of the 4f orbital and the 5d orbital of rare-earth ions.

DETAILED DESCRIPTION (Underlying Knowledge Forming Basis of the Present Disclosure)

A light-emitting apparatus including a solid-state light source, such as a LD, and a phosphor in combination may be used as a light source for a projector. The present inventors have found that such a light-emitting apparatus used as a light source for a projector has the following problems with a red light source.

When a light-emitting apparatus including a solid-state light source, such as a LD, and a phosphor in combination is used as a light source for a projector, red light may be produced by the following two methods.

In a first method, a known red phosphor including Eu as a luminescent center is used, and blue LED light or blue LD light is used as excitation light. In a second method, a yellow phosphor, such as YAG:Ce, is excited by blue LED light or blue LD light to produce yellow light, and a green component is removed from the yellow light with a filter to produce red light.

When excited by high-power light, however, red phosphors including Eu as a luminescent center have a problem of decreased emission quantum efficiency. This is because phosphors including Eu as a luminescent center have a longer emission lifetime than phosphors including Ce as a luminescent center and therefore tends to reach luminance saturation during high-energy excitation. Thus, the method using a red phosphor including Eu as a luminescent center could not produce high-power red light.

On the other hand, the method for removing a green component from yellow light emitted from a yellow phosphor with a filter wastes 60% or more of emission energy. Thus, even when a potentially high-power phosphor, such as YAG:Ce, is used in this method, the resulting red light has very low efficiency, and the output is insufficient as a light source for a projector.

Thus, the present inventors have extensively studied to provide a light source for a projector that can produce high-power red light and to provide a high-power projector.

Summary of Aspect of the Present Disclosure

A projector according to a first aspect of the present disclosure includes a light source unit, a spatial light modulator that controls light from the light source unit for each pixel to form an optical image, and a projection optical system that projects the optical image formed by the spatial light modulator onto a target. The light source unit includes a solid-state light source and a wavelength convertor. The solid-state light source emits first light, the first light including blue light with a peak wavelength in a range of 430 to 470 nm, inclusive, and green light with a peak wavelength in a range of 480 to 550 nm, inclusive. The wavelength convertor contains at least a red phosphor including Ce as a luminescent center. The red phosphor emits second light upon receiving the green light. The second light has a spectrum with a peak wavelength in a range of 600 to 700 nm, inclusive. The red phosphor contains a nitride or an oxynitride as a host material.

The projector according to the first aspect contains the red phosphor including the Ce luminescent center. The red phosphor is excited by green light with high absorption efficiency, and therefore high power can be produced. Thus, the first aspect can provide a high-power projector.

In a second aspect, for example, the peak wavelength of the green light emitted from the solid-state light source in the projector according to the first aspect may be in a range of 510 to 540 nm, inclusive.

In the red phosphor, a longer wavelength of excitation light (green light emitted from a solid-state light source) results in a smaller energy conversion loss (e.g., Stokes' loss) of the phosphor and higher energy conversion efficiency. Thus, the projector according to the second aspect can produce high power because the peak wavelength of the green light is 510 nm or more.

In a third aspect, for example, the solid-state light source of the projector according to the first or second aspect may include a GaN semiconductor laser.

The projector according to the third aspect can produce high power by using a GaN semiconductor laser.

In a fourth aspect, for example, the GaN semiconductor laser of the projector according to the third aspect may emit the blue light. The solid-state light source may further include a YAG:Nd solid-state laser that emits the green light and that includes a second harmonic generator.

The projector according to the fourth aspect can produce high power by using a GaN semiconductor laser and a YAG:Nd solid-state laser.

In a fifth aspect, for example, each of all phosphors in the wavelength convertor of the projector according to at least one aspect of the first to fourth aspects may have a 1/e afterglow value of not more than 100 ns.

Each of all phosphors in the projector according to the fifth aspect have good luminance saturation characteristics and can have high quantum efficiency even at high power. Thus, the projector according to the fifth aspect can have high quantum efficiency even at high power.

In a sixth aspect, for example, the red phosphor of the projector according to at least one aspect of the first to fifth aspects may contain a host material, the host material containing Y or a lanthanoid element other than Ce.

The red phosphor in the projector according to the sixth aspect contains a host material, the host material containing Y or a lanthanoid element other than Ce. Ions of the lanthanoid element other than Ce and Y have the same valence as $Ce^{3+}$. Furthermore, the ionic radii of the lanthanoid element other than Ce and Y are relatively close to the ionic radius of $Ce^{3+}$. Thus, the host material can stably take $Ce^{3+}$ into its crystal structure. Thus, the projector according to the sixth aspect containing the red phosphor can have high efficiency and can produce high power.

In a seventh aspect, for example, the red phosphor of the projector according to at least one aspect of the first to sixth aspects may contain a nitride or an oxynitride as a host material. Or, the red phosphor may contain an oxide as a host material.

A nitride or an oxynitride has high thermal conductivity and is less likely to become hot. Thus, the projector according to the seventh aspect can reduce the decrease in luminous efficiency of the phosphor caused by temperature quenching.

In an eighth aspect, for example, the red phosphor of the projector according to at least one aspect of the first to seventh aspects may contain a host material having a tetragonal crystal structure.

In a ninth aspect, for example, the red phosphor of the projector according to at least one aspect of the first to eighth aspects may contain a crystal phase having the chemical composition $Ce_xM_{3-x-y}\beta_6\gamma_{11-z}$, where M denotes one or two or more elements selected from the group consisting of Sc, Y, La, Pr, Nd, Sm, Eu, Gd, Tb, Dy, Ho, Er, Tm, Yb, and Lu, β includes Si in an amount of not less than 50% by mole, γ includes N in an amount of not less than 80% by mole, and x, y and z satisfies $0<x\le0.6$, $0\le y\le1.0$, and $0\le z\le1.0$.

The projector according to the ninth aspect can have high efficiency and can produce high power.

In a tenth aspect, for example, the red phosphor of the projector according to the ninth aspect may contain a crystal phase having the chemical composition $Ce_xM_{3-x}$ $Si_{6-q}Al_qN_{11-z}$, where q satisfies $0\le q\le2.0$. In other words, β in the chemical composition of the ninth aspect may be Si or Si and Al.

The projector according to the tenth aspect can have high efficiency and can produce high power.

In an eleventh aspect, for example, the red phosphor of the projector according to the tenth aspect may contain a crystal phase having the chemical composition $Ce_xLa_{3-x}$ $Si_{6-q}Al_qN_{11-z}$, where q satisfies $0<q\le2.0$. In other words, in the chemical composition of the tenth aspect, M may be La, and $0<q$.

The projector according to the eleventh aspect can have high efficiency and can produce high power.

In a twelfth aspect, for example, the red phosphor of the projector according to the tenth aspect may contain a crystal phase having the chemical composition $Ce_xY_pLa_{3-x-p}Si_6N_{11}$, where x and p satisfy $(1.5-x)\le p\le(3-x)$. In other words, in the chemical composition of the tenth aspect, β may be Si, and M may be Y and La.

The projector according to the twelfth aspect can have high efficiency and can produce high power.

In a thirteenth aspect, for example, the wavelength convertor of the projector according to at least one aspect of the first to twelfth aspects may further contain a phosphor containing a garnet crystal including Ce as a luminescent center. The phosphor may be a green phosphor or a yellow-green phosphor. Examples of the yellow-green phosphor include a yellow phosphor and a green phosphor. For example, the yellow phosphor has an emission peak wavelength in a range of 560 to 600 nm, inclusive. For example, the green phosphor has an emission peak wavelength of 500 nm or more and less than 560 nm, inclusive.

Containing at least two phosphors with different emission wavelengths, the projector according to the thirteenth aspect can control emission color. The phosphors for use in the projector according to the thirteenth aspect have good luminance saturation characteristics. Thus, the light source unit of the projector according to the thirteenth aspect can have high quantum efficiency even at high power.

In a fourteenth aspect, for example, in the projector according to at least one aspect of the first to thirteenth aspects, the solid-state light source may include a blue laser that emits the blue light and a green laser that emits the green light, and the projector may further include a dichroic mirror by which the blue light and the green light are coaxially multiplexed to be incident on the wavelength convertor.

The projector according to the fourteenth aspect can coaxially multiplex excitation lights to facilitate alignment correction of emission spots of phosphors and can reduce useless stray light.

In a fifteenth aspect, for example, the wavelength convertor of the projector according to at least one aspect of the first to fourteenth aspects may include a first phosphor layer containing the red phosphor and a second phosphor layer containing at least one selected from the group consisting of a yellow phosphor and a yellow-green phosphor.

The projector according to the fifteenth aspect can produce high power.

In a sixteenth aspect, for example, the excitation efficiency of the red phosphor of the projector according to the fifteenth aspect may be lower for the blue light than for the green light. The second phosphor may be excited upon receiving the blue light. The first phosphor layer may be closer to a light incident side of the wavelength convertor than the second phosphor layer.

In the projector according to the sixteenth aspect, the first phosphor layer containing the red phosphor including the Ce luminescent center is disposed on the light incident side. The excitation efficiency of the red phosphor is lower for blue light than for green light. Thus, in the projector according to the sixteenth aspect, a yellow phosphor and/or a yellow-green phosphor in the second phosphor layer can be efficiently excited.

In a seventeenth aspect, for example, the projector according to at least one aspect of the first to sixteenth aspects may further include a control circuit that controls the light source unit. The light source unit may further include a transmission-type wheel. The transmission-type wheel includes a transmission region and a red phosphor region, the red phosphor region including the wavelength convertor. The solid-state light source may include a blue laser that emits the blue light and a green laser that emits the green light. The control circuit may cause the blue laser and the green laser to emit the blue light and the green light, respectively, in a time-divided manner in synchronism with the rotation of the transmission-type wheel. The transmission region may transmit at least the green light. The spatial light modulator may control the light including the blue light, the green light, and the second light emitted from the light source unit for each pixel.

The projector according to the seventeenth aspect can control the blue laser and the green laser in a time-divided manner in synchronism with the rotation of the wheel and can thereby display blue, green, and red images with one spatial light modulator.

In an eighteenth aspect, for example, the projector according to at least one aspect of the first to sixteenth aspects may further include a control circuit that controls the light source unit. The light source unit may further include a reflection-type wheel. The reflection-type wheel includes a red phosphor region including the wavelength convertor. The solid-state light source may include a blue laser that emits the blue light and a green laser that emits the green light. The red phosphor region may have a first surface on which the green light is incident and a second surface opposite the first surface. The reflection-type wheel may further include a reflective layer. The reflective layer may include a first region disposed on a second surface side of the red phosphor region and a second region different from the first region. The first region may reflect the second light when the second light is incident on the first region. The second region may reflect the green light when the green light is incident on the second region. The control circuit may cause the blue laser and the green laser to emit the blue light and the green light, respectively, in a time-divided manner in synchronism with the rotation of the reflection-type wheel. The spatial light modulator may control blue light, green light, and red light emitted from the light source unit for each pixel.

The projector according to the eighteenth aspect can control the blue laser and the green laser in a time-divided manner in synchronism with the rotation of the wheel and can thereby display blue, green, and red images with one spatial light modulator.

In a nineteenth aspect, for example, the reflection-type wheel in the projector according to the eighteenth aspect may further include a scattering region containing a scatterer. The scattering region may have a third surface on which the green light and the blue light are incident and a fourth surface opposite the third surface. The second region of the reflective layer may be disposed on a fourth surface side of the scattering region and may reflect the blue light when the blue light is incident on the second region. The control circuit may cause the blue laser and the green laser to emit the blue light and the green light, respectively, in a time-divided manner in synchronism with the rotation of the reflection-type wheel such that (a) in case of red projection, the green light is incident on the red phosphor region of the reflection-type wheel, (b) in case of blue projection, the blue light is incident on the scattering region of the reflection-type wheel, and (c) in case of green projection, the green light is incident on the scattering region of the reflection-type wheel.

The projector according to the nineteenth aspect can output blue light and green light as incoherent light through the scattering region containing the scatterer and can be used as an eye-safe high-power projector.

Embodiments of the Present Disclosure

The embodiments of the present disclosure will be described in detail below. It goes without saying that the present disclosure is not limited to these embodiments, and these embodiments may be modified within the technical scope of the present disclosure. The same or substantially the same constituents are denoted by the same reference numerals and letters and will not be described again.

First Embodiment

A first embodiment describes an embodiment of a projector according to the present disclosure.

The projector of the first embodiment includes a light source unit, a spatial light modulator that controls light from the light source unit for each pixel to form an optical image, and a projection optical system that projects the optical image formed by the spatial light modulator onto a target screen. The light source unit includes a solid-state light source and a wavelength convertor, which converts the wavelength of output light emitted from the solid-state light source. The solid-state light source emits at least blue light and green light. The wavelength convertor contains at least a red phosphor including Ce as a luminescent center. The red phosphor has an emission spectrum with a peak wavelength in the range of 600 to 700 nm, inclusive. The blue light has a peak wavelength in the range of 430 to 470 nm, inclusive. The green light has a peak wavelength in the range of 480 to 550 nm, desirably 510 to 540 nm. The red phosphor has an emission peak wavelength in the range of 600 to 700 nm, inclusive.

The red phosphor including the Ce luminescent center for use in the projector according to the first embodiment (hereinafter also referred to as the "red phosphor in the first embodiment") will be described below.

The red phosphor in the first embodiment contains a host material and Ce as the luminescent center. The host material may contain Y or a lanthanoid element other than Ce. The host material may be a nitride or an oxynitride. The host material may have a tetragonal crystal structure. Furthermore, the host material may contain an oxide or may be an oxide. Sulfide phosphors are likely to be hydrolyzed and produce hydrogen sulfide. Thus, it is difficult to use sulfide phosphors from a practical standpoint. By contrast, many oxide, oxynitride, and nitride phosphors are stable in the air. Nitride phosphors require heat treatment in a high-pressure atmosphere and require large-scale facilities. On the other hand, oxides can be synthesized by firing in the air, require a simple synthesis process, and can be produced at low cost.

The red phosphor in the first embodiment may contain a crystal phase having the chemical composition $Ce_x M_{3-x-y} \beta_6 \gamma_{11-z}$, for example. The red phosphor containing the crystal phase having the chemical composition $Ce_x$ $M_{3-x-y}\beta_6\gamma_{11-z}$ is hereinafter also referred to as the red phosphor of a first example in the first embodiment. The variable x satisfies $0<x\le0.6$. Since x is more than 0, Ce can emit light. In order to increase emission intensity, x is desirably 0.0003 or more, more desirably 0.015 or more. The maximum value of x is not particularly limited as long as the phosphor can emit light. However, an excessively large x results in low emission intensity due to concentration quenching. Thus, the decrease in emission intensity can be reduced when x is 0.6 or less. In order to increase emission intensity, x is desirably 0.3 or less, more desirably 0.15 or less.

M denotes one or two or more rare-earth elements other than Ce. More specifically, M denotes one or two or more elements selected from the group consisting of Sc, Y, La, Pr, Nd, Sm, Eu, Gd, Tb, Dy, Ho, Er, Tm, Yb, and Lu. M may contain 90% or more by mole La. The element group other than La has an ionic radius close to that of La and therefore can occupy the M site.

The variable y satisfies $0\le y\le1.0$. When y is 1.0 or less, the structure of the crystal phase can be stabilized.

$\beta$ includes Si in an amount of not less than 50% by mole. More specifically, $\beta$ is Si alone, or includes Si in an amount of equal to or more than 50% by mole and less than 100% by mole and other element(s) in an amount of not more than 50% by mole. For example, $\beta$ may include one or two elements selected from the group consisting of Al and Ga. $(100x/6)\%$ or more by mole of $\beta$ may be the one or two elements. Thus, the amount of the one or two elements in $Ce_xM_{3-x-y}\beta_6\gamma_{11-z}$ may be greater than or equal to the amount of Ce. Furthermore, $(300x/6)\%$ or more by mole of $\beta$ may be the one or two elements. Thus, the amount of the one or two elements in $Ce_xM_{3-x-y}\beta_6\gamma_{11-z}$ may be at least three times the amount of Ce. $\beta$ may further other element(s) as long as the phosphor can emit light.

$\gamma$ includes N in an amount of not less than 80% by mole. More specifically, $\gamma$ is N alone, or includes N in an amount of equal to or more than 80% by mole and less than 100% by mole and other element(s) in an amount of not more than 20% by mole. For example, $\gamma$ may include oxygen (O). For example, substitution of Al (or Ga) at part of the Si sites around Ce or substitution of O at part of the N sites results in low symmetry of a ligand of Ce and emission of light with a longer wavelength.

The variable z satisfies $0\le z\le1.0$. A loss of N (that is, z of more than 0) results in low symmetry of a ligand of Ce and emission of light with a longer wavelength. When z is 1.0 or less, the structure of the crystal phase can be stabilized.

The red phosphor of the first example in the first embodiment has an emission spectrum with the maximum peak in the wavelength range of 600 to 800 nm. The maximum peak herein refers to the peak with the maximum value of the spectrum. A peak of the emission spectrum appears upon excitation at a wavelength of 535 nm, for example.

The red phosphor of the first example in the first embodiment has an excitation spectrum with a first peak in the wavelength range of 500 to 600 nm. The red phosphor of the first example in the first embodiment may have an excitation spectrum with an additional second peak with a wavelength of 350 nm or more and less than 500 nm. The first or second peak may be the maximum peak of the excitation spectrum.

The red phosphor of the first example in the first embodiment may have a 1/e emission lifetime of 100 ns or less. The emission lifetime has an influence on the luminance saturation characteristics. Phosphors containing Eu, such as a known red phosphor CASN:Eu, have a longer emission lifetime than phosphors containing Ce. Thus, phosphors containing Eu are likely to reach luminance saturation due to a decrease in quantum efficiency during high-energy excitation. Thus, the phosphor including the Ce luminescent center of the first embodiment is expected to be a red phosphor with higher quantum efficiency than known red phosphors even at high power.

The crystal phase having the chemical composition $Ce_xM_{3-x-y}\beta_6\gamma_{11-z}$ in the red phosphor of the first example in the first embodiment may be a tetragonal crystal. The crystal phase may contain a region with a space group P4bm (#100). The crystal phase of the red phosphor of the first example in the first embodiment may have almost the same crystal structure as a crystal represented by the general formula $La_3Si_6N_{11}$.

The red phosphor of the first example in the first embodiment may have diffraction peaks at (1) $2\theta=17.8$ to 18.8 degrees, (2) $2\theta=26.2$ to 27.2 degrees, (3) $2\theta=27.2$ to 28.2 degrees, (4) $2\theta=30.5$ to 31.5 degrees, (5) $2\theta=32.8$ to 33.8 degrees, and (6) $2\theta=35.8$ to 36.8 degrees in an X-ray diffraction pattern with Cu-K$\alpha$ radiation. These diffraction peaks may have Miller indices (001), (211), (310), (221), (311), and (410), respectively.

The crystal phase of the red phosphor of the first example in the first embodiment may have the following characteristics in XAFS measurement. In an EXAFS radial distribution function spectrum of the K absorption edge of Ce, the first neighbor shell of Ce may have a lower peak height than the second neighbor shell of Ce. The peak height of the first neighbor shell may be 0.8 to 0.9 times the peak height of the second neighbor shell.

The coordination number of the first neighbor shell of Ce obtained from the EXAFS radial distribution function spectrum of the K absorption edge of Ce may be seven coordination. In this case, for example, the coordination structure around Ce has a nitrogen defect around an A site of La in $La_3Si_6N_{11}$ and may be a coordination structure of seven coordination with low symmetry. A known crystal represented by the general formula $La_3Si_6N_{11}$ has a coordination structure of eight coordination with high symmetry. Thus, in the coordination structure of seven coordination with low symmetry, larger splitting of the 5d orbital and a smaller energy difference between the 5d orbital and the 4f orbital can induce the emission of light with a longer wavelength than before.

The crystal phase may be a crystal phase represented by the chemical composition $Ce_xM_{3-x-y}Si_{6-q}A_qN_{11-z}$, for example. M may denote one or two or more elements selected from the group consisting of Sc, Y, La, Pr, Nd, Sm, Eu, Gd, Tb, Dy, Ho, Er, Tm, Yb, and Lu. A may be one or two elements selected from the group consisting of Al and Ga. The variable x may satisfy $0<x\le0.6$. The variable y may satisfy $0\le y\le1.0$. The variable z may satisfy $0\le z\le1.0$. The variable q may satisfy $x\le q\le3.0$. When A denotes Al alone, q may satisfy $0<q<2.0$.

In the red phosphor in the first embodiment, for example, M of the chemical composition $Ce_xM_{3-x}Si_{6-q}Al_qN_{11-z}$ may be La alone. Thus, the red phosphor in the first embodiment may contain a crystal phase having the chemical composition $Ce_xLa_{3-x}Si_{6-q}Al_qN_{11-z}$. In this chemical composition, q may satisfy $0<q\le2.0$.

In the chemical composition $Ce_xM_{3-x}Si_{6-q}Al_qN_{11-z}$ of the red phosphor in the first embodiment, for example, M may be Y alone or Y and La, q may be 0, and z may be 0. Thus, the red phosphor in the first embodiment may contain a crystal phase having the chemical composition $Ce_xY_pLa_{1-p}Si_6N_{11}$. In this chemical composition, p may satisfy $(1.5-x)\le p\le(3-x)$.

<Method for Producing Red Phosphor of First Example in First Embodiment>

A method for producing a red phosphor containing the crystal phase represented by the chemical composition $Ce_xM_{3-x-y}Si_{6-q}A_qN_{11-z}$ as an example of the red phosphor of the first example in the first embodiment will be described below. In the following description, M denotes La. For example, a compound(s) containing Ce, La, Si, and Al may be used as a raw material. Al may be replaced by Ga. Alternatively, Ce alone, La alone, Si alone, and Al alone may be used as raw materials. Al alone may be replaced by Ga alone. The compound may be a compound that can be converted into a nitride by firing in a nitrogen atmosphere, a high-purity (purity of 99% or more) nitride, or a metal alloy. A small amount of fluoride (such as ammonium fluoride) may be added to promote the reaction.

For example, a Ce compound, a La compound, and a Si compound may be prepared at a chemical composition ratio represented by $Ce_xLa_{3-x-y}Si_6N_{11-z}$ ($0<x\leq0.6$, $0\leq y\leq1.0$, and $0\leq z\leq1.0$). Furthermore, an Al compound (or Al alone) may also be prepared. The Si compound may be replaced by Si alone. Specific raw materials may be a $CeF_3$ powder, a LaN powder, a $Si_3N_4$ powder, and an AlN powder, for example. The $CeF_3$ powder may be replaced by a CeN powder. The $Si_3N_4$ powder may be replaced by a powder of Si alone. The AlN powder may be replaced by a powder of Al alone. The amount of the LaN powder may be approximately 24% more than the theoretical value. LaN is likely to be decomposed during firing, and the addition of excess LaN in the preparation of the raw materials can reduce the production of a by-product $LaSi_3N_5$ crystals.

A phosphor is produced by firing a mixture of the raw materials. The raw materials may be mixed by wet blending in a solution or by dry blending of dry powders. Industrially commonly used ball mills, medium stirring mills, planetary mills, vibrating mills, jet mills, V-type mixers, and agitators may be used. The firing is performed in a high-pressure nitrogen atmosphere at a temperature in the range of 1500° C. to 2000° C. for approximately 1 to 50 hours. The pressure is typically 3 atm or more, desirably 4 atm or more, more desirably 8 atm or more. After firing, the phosphor may be washed in a 10% nitric acid solution for 1 hour, for example. The resulting phosphor powder may be ground again in a ball mill or a jet mill and, if necessary, may be washed or classified to adjust the particle size distribution and flowability of the phosphor powder.

The red phosphor in the first embodiment will be further described below. The following also describes how the present inventors have developed the red phosphor.

<Principle of Light Emission of Rare-Earth Phosphor>

The following describes how the present inventors have studied the principle of light emission of a rare-earth phosphor and have focused on a $Ce^{3+}$ phosphor.

The divalent or trivalent ions of Ce, Pr, Nd, Pm, Sm, Eu, Gd, Tb, Dy, Ho, Er, Tm, and Yb of rare-earth elements have a valence electron in the 4f orbital. Among these, most of the rare-earth ions have multiple electrons in the 4f orbital and, as conceptually illustrated in FIG. 1A, lifting of the 4f orbital degeneracy causes large splitting of the 4f orbital. Thus, transition from one 4f level to another 4f level (f-f transition) can be utilized to emit light. Because the f-f transition is forbidden transition, excited electrons characteristically have a long life. Thus, phosphors containing a rare-earth ion are often used as laser media. When such phosphors are used in incoherent light sources, such as general illumination, however, the emission intensity is immediately saturated.

Figure 1B:
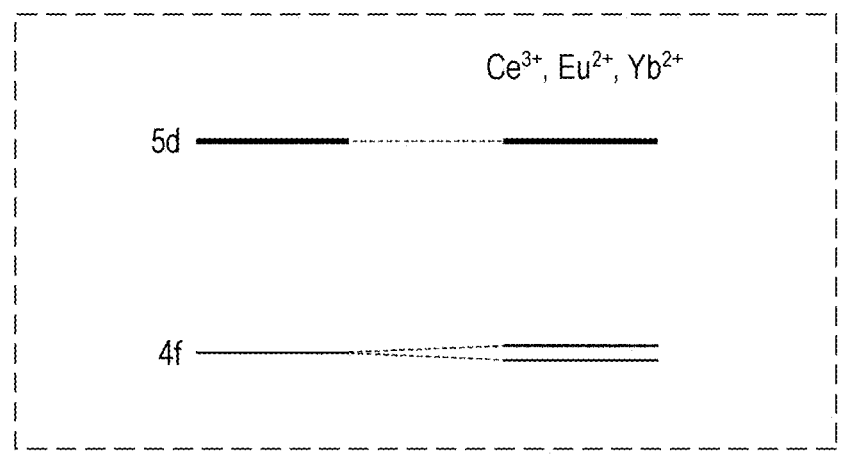
FIG. 1B is a schematic view of splitting of the 4f orbital and the 5d orbital of $Ce^{3+}$, $Eu^{2+}$, and $Yb^{2+}$.

$Ce^{3+}$ has only one valence electron in the 4f orbital. Thus, as conceptually illustrated in FIG. 1B, splitting of the 4f orbital is much smaller in $Ce^{3+}$ than in other rare-earth ions. Exceptionally, energy splitting of the 4f orbital in $Eu^{2+}$ and $Yb^{2+}$ is also small. This is because $Eu^{2+}$ has a semiclosed shell with seven electrons in the 4f orbital, and $Yb^{2+}$ has a closed shell with 14 electrons in the 4f orbital.

Due to the small splitting of the 4f orbital, $Ce^{3+}$, $Eu^{2+}$, and $Yb^{2+}$ have a large energy difference between the 4f ground level and the 5d orbital. Furthermore, there is no 4f orbital with large energy between the 4f ground level and the 5d orbital. Thus, transition between 4f and 5d (4f-5d transition) can be easily utilized.

The 4f-5d transition is allowed transition, and excited electrons therefore have short lives. Thus, excitation immediately induces light emission, and even excitation with strong excitation light is less likely to cause saturation (luminance saturation).

The present inventors have further focused on $Ce^{3+}$ out of $Ce^{3+}$, $Eu^{2+}$, and $Yb^{2+}$. $Ce^{3+}$ has only one electron involved in 4f-5d transition, and the 4f orbitals are completely vacant during transition from the 5d excited state to the 4f ground state; that is, the 4f orbital involved in transition has a high state density. Thus, the present inventors thought that $Ce^{3+}$ has the shortest emission lifetime. By contrast, $Eu^{2+}$ has six electrons in 4f after excitation of an electron to 5d, and $Yb^{2+}$ has 13 electrons remaining in 4f after excitation of an electron to 5d. Thus, $Eu^{2+}$ and $Yb^{2+}$ have a low state density in the 4f orbital and are expected to have a longer emission lifetime than $Ce^{3+}$. Thus, $Ce^{3+}$ phosphors have the shortest emission lifetimes among the rare-earth elements and are less likely to reach luminance saturation. Actually, YAG:Ce has a 1/e emission lifetime of approximately 70 ns, and CASN:Eu has a 1/e emission lifetime in the range of approximately 600 to 800 ns.

On the basis of these considerations, $Ce^{3+}$ phosphors are superior to $Eu^{2+}$ phosphors. Actually, almost all commercially available white LEDs include YAG:Ce. However, CASN:Eu is widely used as a red phosphor. The present inventors think that this is because $Ce^{3+}$ phosphors with red-light emission are difficult to develop, and promising materials have not been found. The reason for that and the principle that determines the emission wavelength will be described below.

<Emission Wavelength of Phosphor>

Phosphors with a $Ce^{3+}$ luminescent center and phosphors with a $Eu^{2+}$ luminescent center utilize transition from the ground state of the 4f orbital to the excited state of the 5d orbital (4f-5d transition). $Ce^{3+}$ and $Eu^{2+}$ introduced into a host crystal for a phosphor are mainly affected by the nearest bonded anion atom (ligand), and the energy of the 4f and 5d orbitals and the emission wavelength are changed. Thus, the emission wavelength of the phosphor depends on the host crystal.

Figure 2:
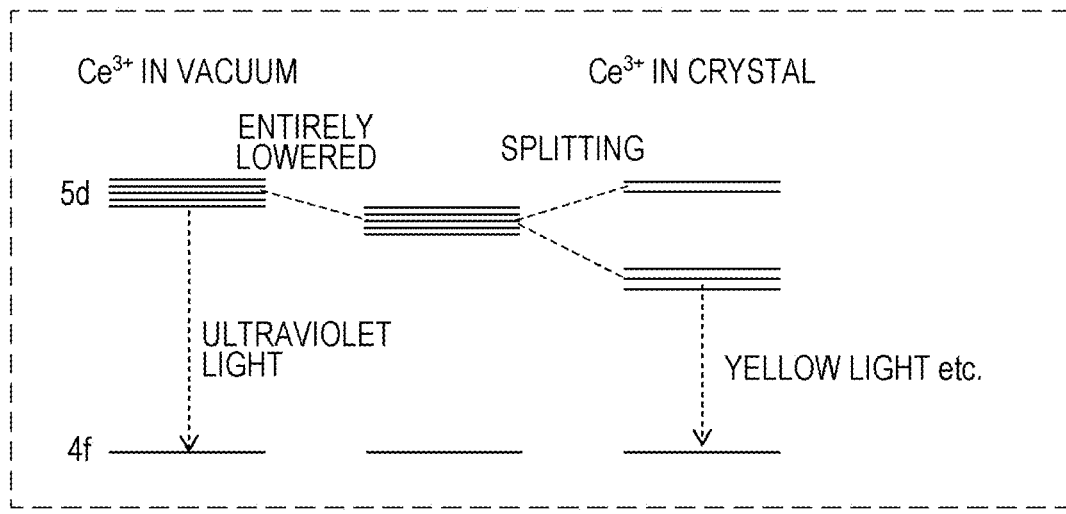
FIG. 2 is an energy level diagram of $Ce^{3+}$ in a vacuum and in a crystal.

The influence of the ligand includes the energy shift of the 4f or 5d orbital and the lifting of degeneracy of five levels of the 5d orbital (that is, splitting of the 5d orbital). The energy shift depends greatly on the expansion of the wave function of the 4f or 5d orbital and the positional relationship of the ligand. In the splitting of the 5d orbital, as illustrated in FIG. 2, the 5d orbital splits while the total energy of the five levels of the 5d orbital is maintained. Thus, an increase in the energy of one level is associated with a decrease in the energy of another level. Thus, splitting of the 5d orbital can be enlarged to decrease the lowest energy of the 5d orbital.

As illustrated in FIG. 2, light emission due to 4f-5d transition is caused by transition from the lowest energy level of the 5d orbital to 4f. Thus, $Ce^{3+}$ or $Eu^{2+}$ can be introduced into the crystal to decrease the 4f-5d energy difference and to increase the emission wavelength.

Although $Ce^{3+}$ in a vacuum (that is, not introduced into the crystal) has a large 4f-5d energy difference and emits light in a deep ultraviolet region, $Eu^{2+}$ emits blue light. Thus, $Eu^{2+}$ can emit red light with a smaller long-wavelength shift, and CASN:Eu is practically used. Practically used $Ce^{3+}$ phosphors having the longest wavelength are yellow phosphors YAG:Ce. Practically used $Ce^{3+}$ red phosphors have not been developed.

<Studied by the Present Inventors>

Figure 3:
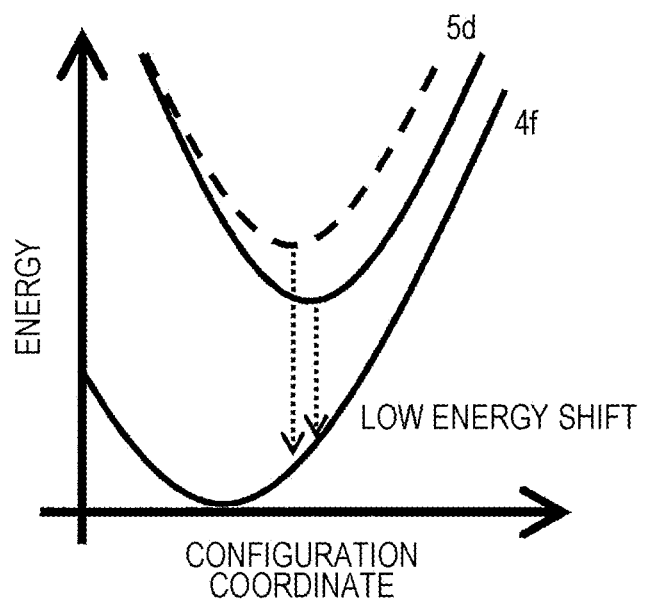
FIG. 3 is a configuration coordinate model diagram between the 4f orbital and the 5d orbital.

The present inventors have conducted studies considering that the 5d orbital or the 4f orbital is needed to be shifted to develop a Ce red phosphor, as illustrated in FIG. 3.

In order to shift the 5d orbital or the 4f orbital, it should be important for a ligand of $Ce^{3+}$ to satisfy (1) the short ligand distance and (2) low symmetry of the ligand.

Regarding (1), a short ligand distance between $Ce^{3+}$ and its nearest anion results in a large influence of the orbital of the anion on the 4f orbital, the 5d orbital, or both and a large energy shift of the 4f orbital, the 5d orbital, or both. This results in an increase in the energy of the 4f orbital or a decrease in the lowest energy level of the 5d orbital due to large splitting of the 5d orbital. These effects decrease the 4f-5d energy difference. Regarding (2), low symmetry of the ligand results in stabilization of the 5d orbital, which has a wave function extending in a direction in which no ligand exists. This decreases the 4f-5d energy difference.

On the basis of these guidelines, the present inventors have searched for a new material. More specifically, the present inventors examined the calculation of the emission wavelength by crystal structure simulation. Through these approaches, the present inventors have found new red phosphors that exhibit red. These approaches will be described below.

<Calculation of Emission Wavelength of Ce Phosphor>

In order to determine the relationship between the emission wavelength and the excitation wavelength of a phosphor including Ce as a luminescent center, the present inventors simulated the relationship between the emission wavelength and the excitation wavelength of various crystals doped with Ce. The results and discussion of the crystal structure simulation will be described below.

The present inventors calculated the emission wavelength using a technique described in the literature "Y Jia et al., Physical Review B 93, 155111 (2016)". In the technique, the excitation wavelength is calculated from the difference between the total energy at the equilibrium point of the ground state and the total energy of the excited state on the atomic coordinates. In the technique, the emission wavelength is calculated from the difference between the total energy at the equilibrium point at which the excited state is relaxed and the total energy of the ground state on the atomic coordinates. According to the literature, the calculated emission wavelengths and excitation wavelengths of three phosphors YAG:Ce, $LaSi_3N_5$:Ce, and $La_3Si_6N_{11}$:Ce agree well with experimental values. The present inventors calculated the emission wavelength and the excitation wavelength of $YAlO_3$:Ce as well as $LaSi_3N_5$:Ce and $La_3Si_6N_{11}$:Ce and confirmed that the calculation can precisely reproduce the experimental results as in the literature. Table 1 lists the excitation wavelength and the emission wavelength of each phosphor determined by the simulation.

TABLE 1

| | Chemical composition | | |
|---|---|---|---|
| | $(Y,Ce)AlO_3$ | $(La,Ce)Si_3N_5$ | $(La_3,Ce)Si_6N_{11}$ |
| Excitation wavelength (nm) | 310 | 366 | 470 |
| Emission wavelength (nm) | 349 | 445 | 543 |

<New Composition $(La,Y)_3Si_6N_{11}$:Ce Phosphor>

First, the present inventors intended to substitute $Y^{3+}$ at a $La^{3+}$ site of $La_3Si_6N_{11}$:Ce to shorten the ligand distance.

$Y^{3+}$ has a smaller ionic radius than $La^{3+}$. Thus, substitution of $Y^{3+}$ at a $La_3^{3+}$ site can decrease the lattice constant. A decrease in lattice constant is expected to shorten the ligand distance.

Figure 4:
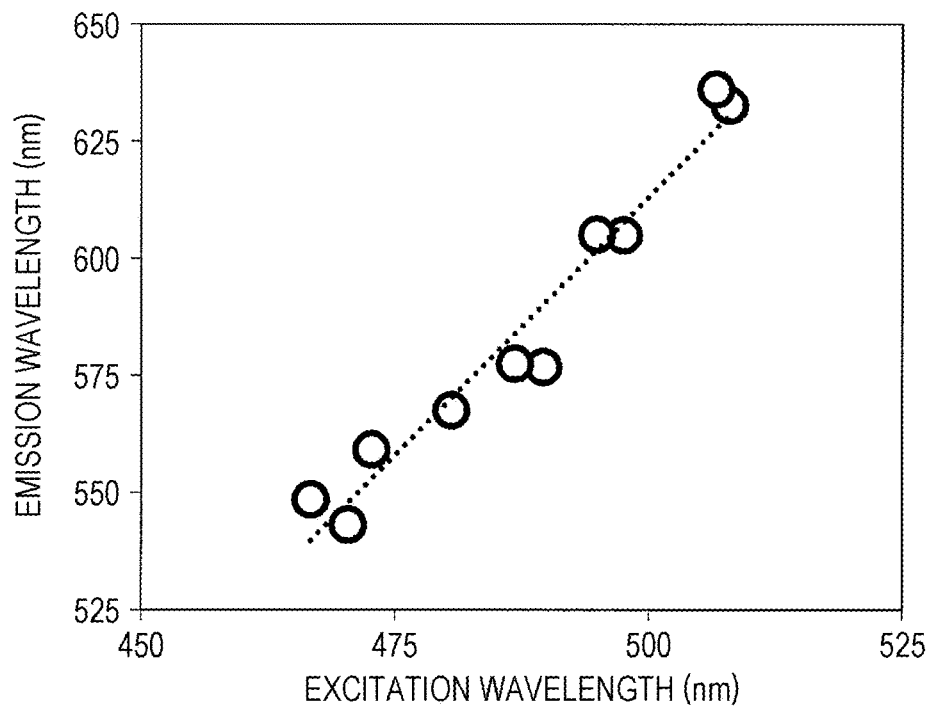
FIG. 4 is a graph showing the relationship between the excitation wavelength and the emission wavelength of a $(La,Y)_3Si_6N_{11}$:Ce phosphor.
Figure 5:
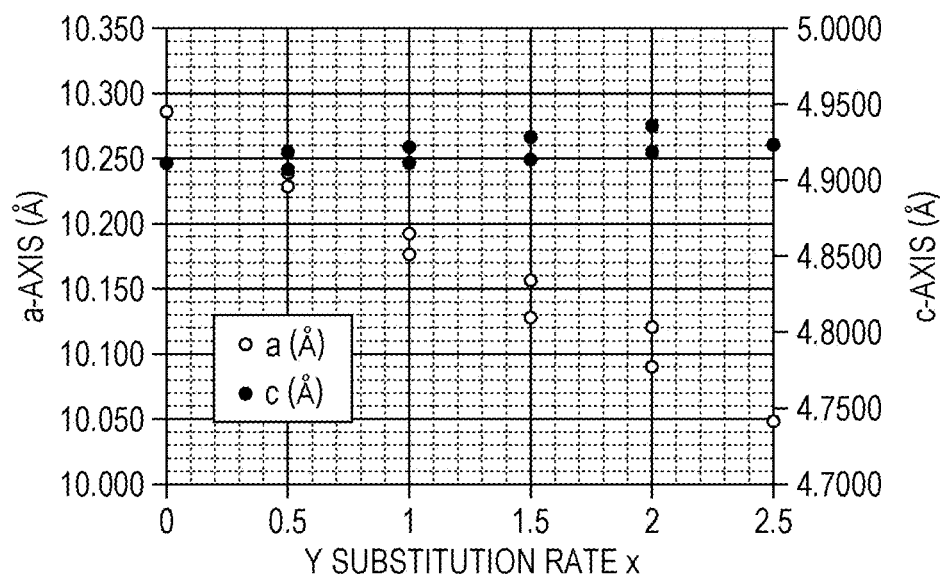
FIG. 5 is a graph showing the relationship between the $Y^{3+}$ substitution rate x and the lattice constant of the a-axis and the relationship between the $Y^{3+}$ substitution rate x and the lattice constant of the c-axis of the $(La,Y)_3Si_6N_{11}$:Ce phosphor.
Figure 6:
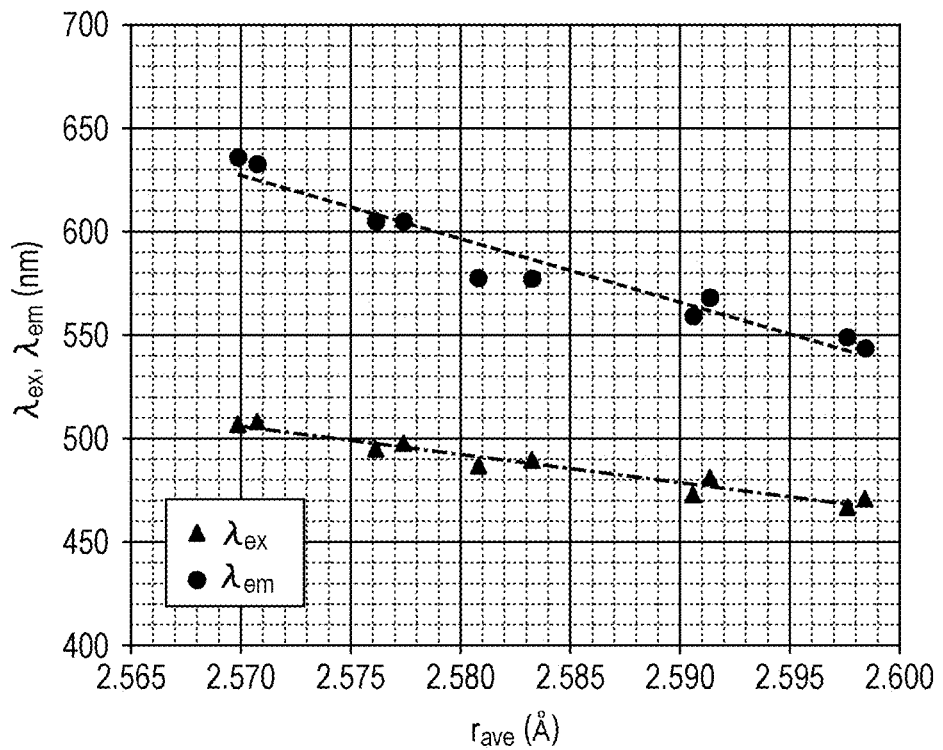
FIG. 6 is a graph showing the relationship between the average coordination distance $r_{ave}$ and the excitation wavelength $\lambda_{ex}$ and the relationship between the average coordination distance $r_{ave}$ and the emission wavelength $\lambda_{em}$ of the $(La,Y)_3Si_6N_{11}$:Ce phosphor.
Figure 7:
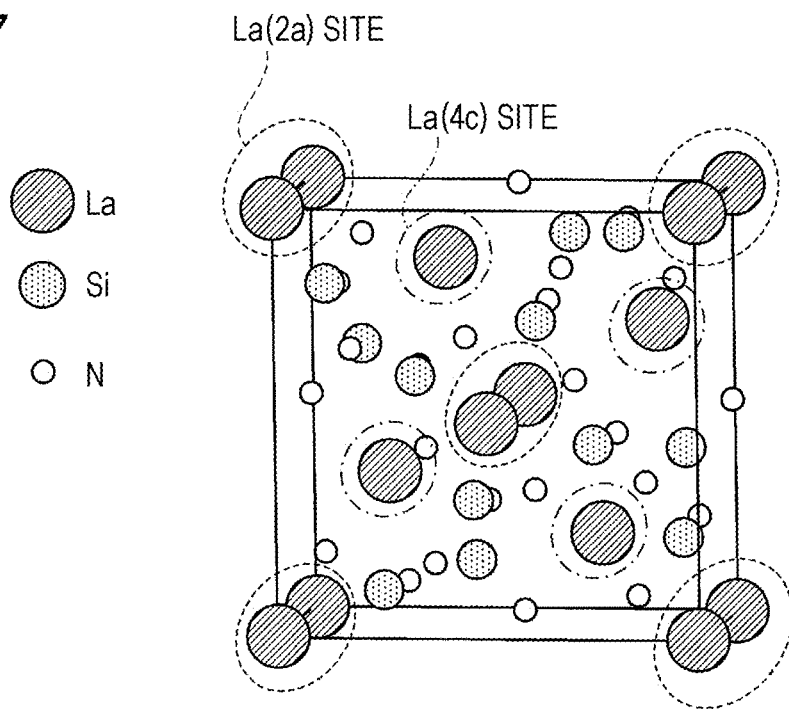
FIG. 7 is a schematic view of a $La_3Si_6N_{11}$ crystal structure and two different sites of La.
Figure 8A:
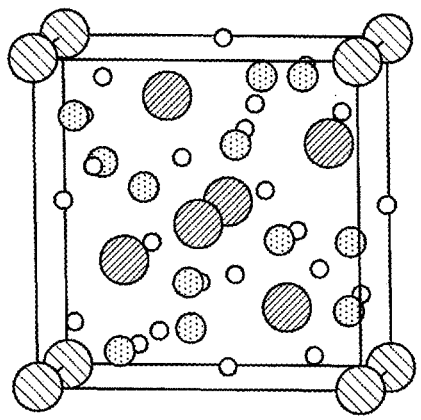
FIG. 8A is a schematic view of the crystal structure of a sample No. 1 of the $(La,Y)_3Si_6N_{11}$:Ce phosphor.
Figure 8B:
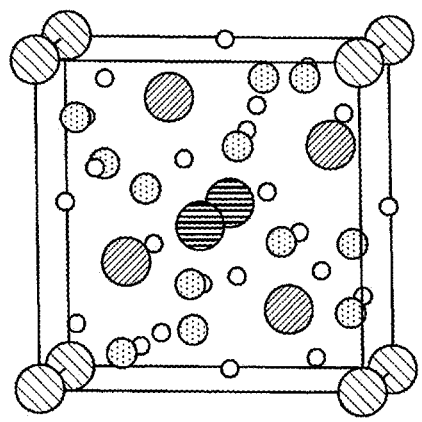
FIG. 8B is a schematic view of the crystal structure of a sample No. 2 of the $(La,Y)_3Si_6N_{11}$:Ce phosphor.
Figure 8C:
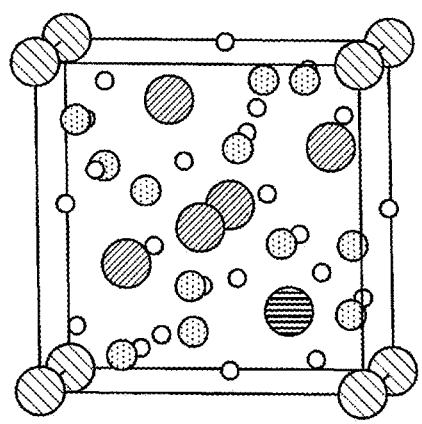
FIG. 8C is a schematic view of the crystal structure of a sample No. 3 of the $(La,Y)_3Si_6N_{11}$:Ce phosphor.
Figure 8D:
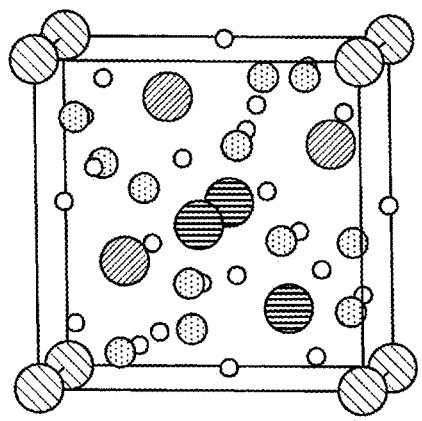
FIG. 8D is a schematic view of the crystal structure of a sample No. 4 of the $(La,Y)_3Si_6N_{11}$:Ce phosphor.
Figure 8E:
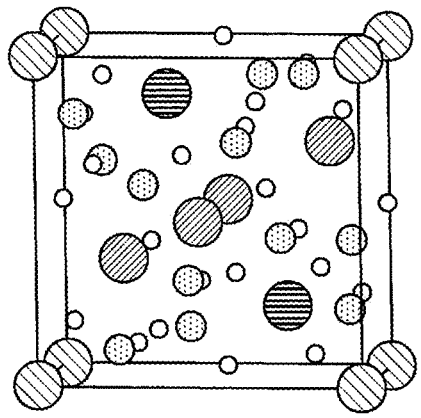
FIG. 8E is a schematic view of the crystal structure of a sample No. 5 of the $(La,Y)_3Si_6N_{11}$:Ce phosphor.
Figure 8F:
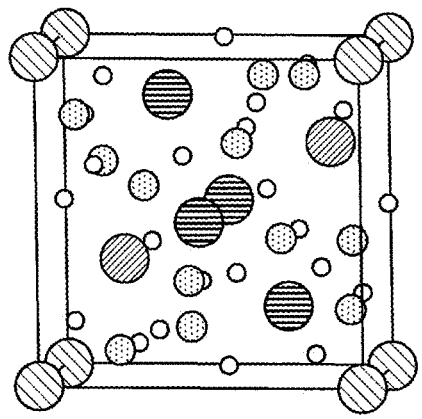
FIG. 8F is a schematic view of the crystal structure of a sample No. 6 of the $(La,Y)_3Si_6N_{11}$:Ce phosphor.
Figure 8G:
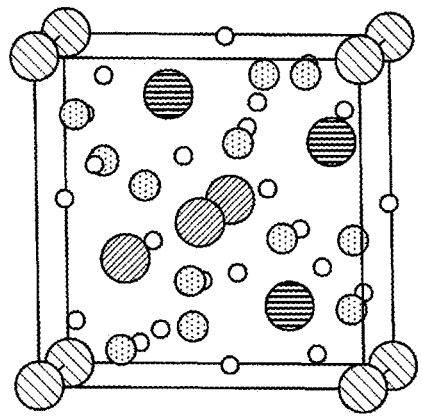
FIG. 8G is a schematic view of the crystal structure of a sample No. 7 of the $(La,Y)_3Si_6N_{11}$:Ce phosphor.
Figure 8H:
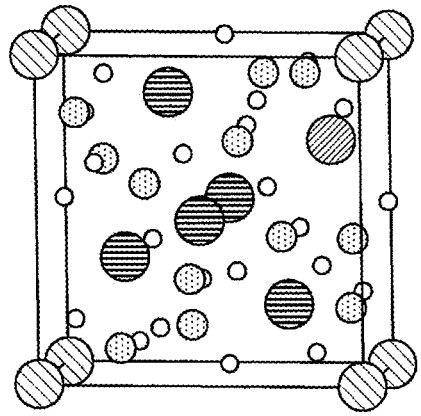
FIG. 8H is a schematic view of the crystal structure of a sample No. 8 of the $(La,Y)_3Si_6N_{11}$:Ce phosphor.
Figure 8I:
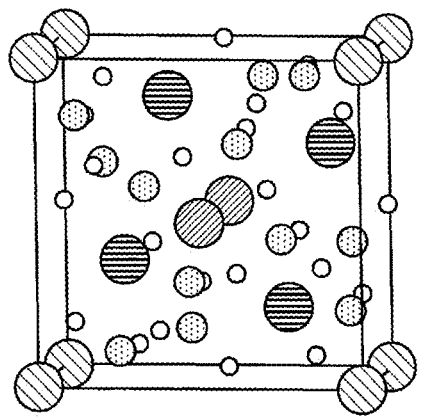
FIG. 8I is a schematic view of the crystal structure of a sample No. 9 of the $(La,Y)_3Si_6N_{11}$:Ce phosphor.
Figure 8J:
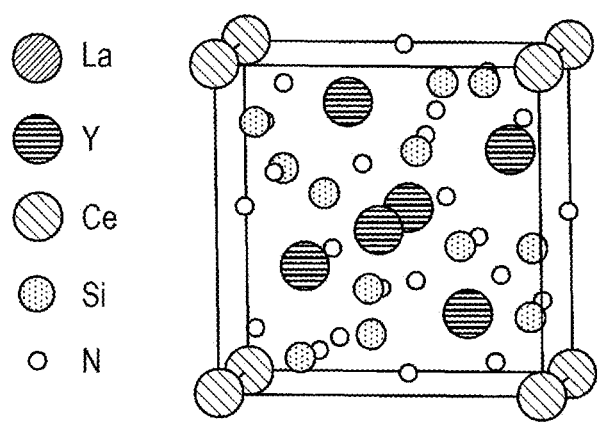
FIG. 8J is a schematic view of the crystal structure of a sample No. 10 of the $(La,Y)_3Si_6N_{11}$:Ce phosphor.
Figure 9:
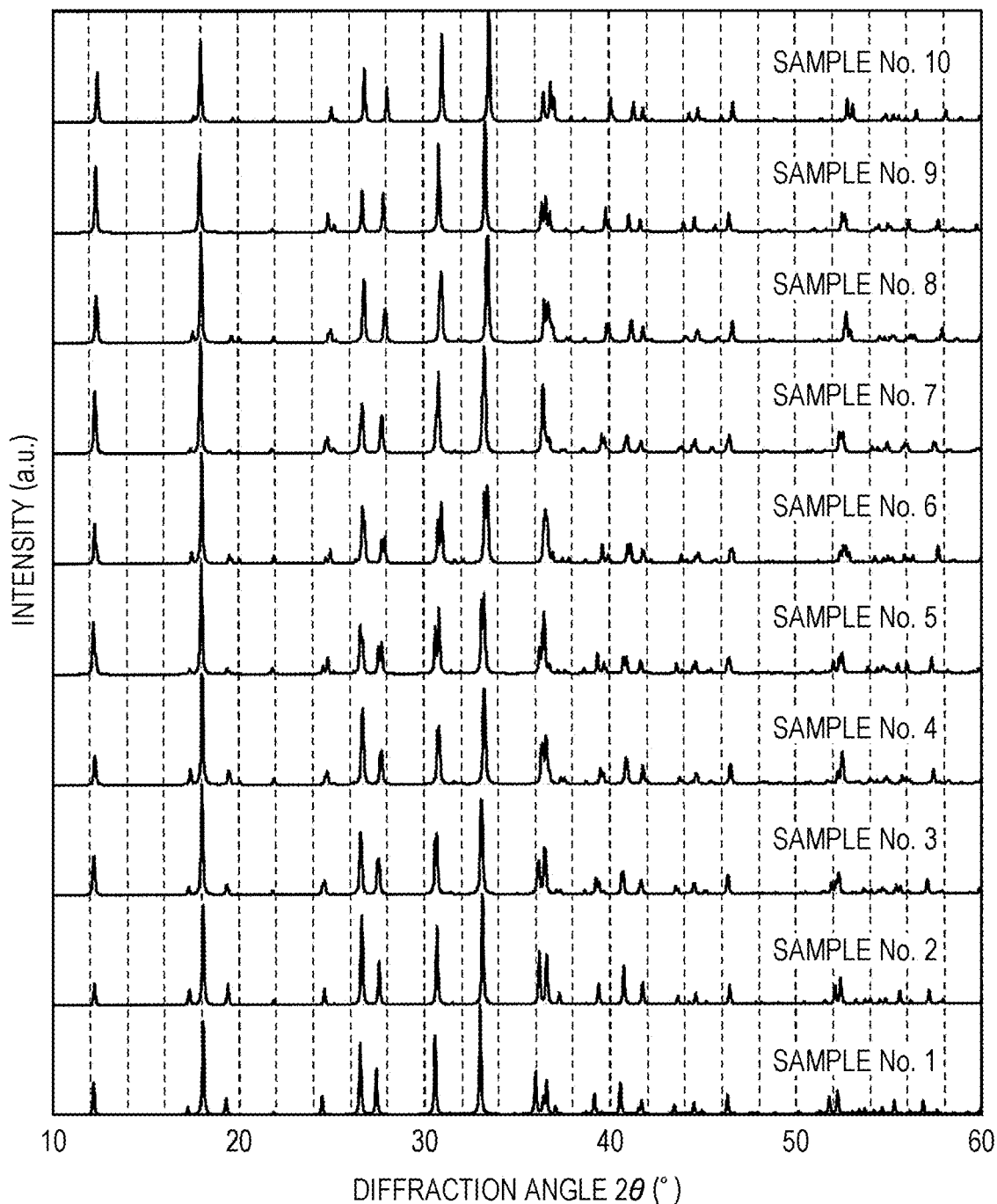
FIG. 9 is a graph of powder XRD diffraction patterns calculated from the crystal structures of the phosphors of the samples No. 1 to No. 10 illustrated in FIGS. 8A to 8J.

A new composition $(La,Y)_3Si_6N_{11}$:Ce phosphor was studied by the calculation technique. The phosphor of this composition includes substitution of $Y^{3+}$ at a $La^{3+}$ site of $La_3Si_6N_{11}$:Ce. $Y^{3+}$ has a smaller ionic radius than $La^{3+}$. Thus, the ligand distance of $Ce^{3+}$ is smaller in $(La,Y)_3Si_6N_{11}$ than in $La_3Si_6N_{11}$. This is expected to increase the emission wavelength. Table 2 shows the calculation results of the average coordination distance $r_{ave}$ between Ce and N, the excitation wavelength $\lambda_{ex}$, and the emission wavelength $\lambda_{em}$ with different $Y^{3+}$ substitution rates. FIG. 4 is a graph showing the relationship between the excitation wavelength and the emission wavelength. FIG. 5 shows the relationship between the $Y^{3+}$ substitution rate x and the lattice constant of the a-axis and the relationship between the $Y^{3+}$ substitution rate x and the lattice constant of the c-axis. FIG. 6 shows the relationship between the average coordination distance $r_{ave}$ and the excitation wavelength $\lambda_{ex}$ and the relationship between the average coordination distance $r_{ave}$ and the emission wavelength $\lambda_{em}$. FIG. 7 illustrates a $La_3Si_6N_{11}$ crystal structure and two different sites of La. In FIG. 7, La(2a) sites are indicated by broken lines, and La(4c) sites are indicated by dash-dot lines. FIGS. 8A to 8J illustrate the crystal structures of samples No. 1 to No. 10. FIG. 9 shows powder XRD diffraction patterns calculated from the crystal structures of the samples No. 1 to No. 10. The symbol * in Table 2 shows that the sample is a comparative example. In the column "Y substitution site and substitution rate" of Table 2, the Y substitution site and the substitution rate are represented by "Y substitution site←Y substitution rate".

TABLE 2

| Sample No. | Composition formula | Y substitution site and substitution rate | $r_{ave}$ (Å) | $\lambda_{ex}$ (nm) | $\lambda_{em}$ (nm) |
|---|---|---|---|---|---|
| *1 | $(La_{2.5},Ce_{0.5})Si_6N_{11}$ | — | 2.5984 | 470 | 543 |
| *2 | $(La_2,Y_{0.5},Ce_{0.5})Si_6N_{11}$ | La(2a)←$Y_{0.5}$ | 2.5976 | 467 | 549 |
| *3 | $(La_2,Y_{0.5},Ce_{0.5})Si_6N_{11}$ | La(4c)←$Y_{0.5}$ | 2.5913 | 481 | 568 |
| *4 | $(La_{1.5},Y_1,Ce_{0.5})Si_6N_{11}$ | La(2a)←$Y_{0.5}$, La(4c)←$Y_{0.5}$ | 2.5905 | 473 | 559 |
| *5 | $(La_{1.5},Y_1,Ce_{0.5})Si_6N_{11}$ | La(4c)←$Y_1$ | 2.5832 | 490 | 577 |
| *6 | $(La_1,Y_{1.5},Ce_{0.5})Si_6N_{11}$ | La(2a)←$Y_{0.5}$, La(4c)←$Y_1$ | 2.5808 | 487 | 578 |
| 7 | $(La_1,Y_{1.5},Ce_{0.5})Si_6N_{11}$ | La(4c)←$Y_{1.5}$ | 2.5774 | 498 | 605 |
| 8 | $(La_{0.5},Y_2,Ce_{0.5})Si_6N_{11}$ | La(2a)←$Y_{0.5}$, La(4c)←$Y_{1.5}$ | 2.5761 | 495 | 605 |
| 9 | $(La_{0.5},Y_2,Ce_{0.5})Si_6N_{11}$ | La(4c)←$Y_2$ | 2.5707 | 508 | 633 |
| 10 | $(Y_{2.5},Ce_{0.5})Si_6N_{11}$ | La(2a)←$Y_{0.5}$, La(4c)←$Y_2$ | 2.5698 | 507 | 636 |

Table 2 and FIG. 4 show that the emission wavelength tends to increase with the $Y^{3+}$ substitution rate. The excitation peak wavelength also increases with the emission wavelength. In the compositions of the samples 7 to 10 that emit red light at an emission wavelength of 600 nm or more, the peak excitation wavelength is in a green region of 490 nm or more. As is clear from FIG. 5, an increase in $Y^{3+}$ substitution rate results in a decrease in the lattice constant of the a-axis and an increase in the lattice constant of the c-axis. As is clear from Table 2 and FIG. 6, an increase in $Y^{3+}$ substitution rate results in a decrease in the average coordination distance $r_{ave}$ between Ce and N, and a decrease in $r_{ave}$ results in an increase in emission wavelength and excitation wavelength.

$Eu^{2+}$ has a much longer emission lifetime than $Ce^{3+}$. The emission lifetime correlates with the 4f-5d transition probability of $Eu^{2+}$ and $Ce^{3+}$, and a longer emission lifetime results in a lower transition probability. Thus, the excitation probability of 4f-5d transition of $Eu^{2+}$ is much lower than the excitation probability of 4f-5d transition of $Ce^{3+}$. However, the 5d excitation level of $Eu^{2+}$ is likely to overlap the conduction band of the host material $((La,Y)_3Si_6N_{11})$. This enables efficient energy absorption between the 4f ground level of $Eu^{2+}$ and the conduction band of the host material. The absorbed energy corresponds to energy in a blue light region. $Eu^{2+}$ has seven electrons in the 4f orbital. Each of the electrons has a wide energy level, and $Eu^{2+}$ therefore has a broad excitation wavelength. Thus, a red phosphor with a $Eu^{2+}$ luminescent center has a broad excitation wavelength with a peak in a blue region. Thus, a light source containing the red phosphor with the $Eu^{2+}$ luminescent center includes an excitation light source that can emit blue light with the highest absorption efficiency.

By contrast, the 5d excitation level of a phosphor with a $Ce^{3+}$ luminescent center is less likely to overlap the conduction band of the host material. Energy absorption between the 4f ground level and the conduction band of the host material is therefore not expected. Thus, 4f-5d transition is main energy absorption.

On the basis of the study results, the present inventors proved that the energy difference in 4f-5d transition of a red phosphor with $Ce^{3+}$ corresponds to the energy difference in a green light region. Thus, a red phosphor with $Ce^{3+}$ has higher absorption efficiency with an excitation light source of green light than with an excitation light source of blue light. The use of green light can increase light output. A method for converting green light to red light according to the present application can have a smaller energy conversion loss (e.g., Stokes' loss) and can emit higher-power light than a known method for converting blue light to red light.

From these results, the present inventors have developed a new red phosphor containing a crystal phase having the chemical composition $Ce_xY_pLa_{3-x-p}Si_6N_{11}$, where $0<x\le0.6$ and $(1.5-x)\le p\le(3-x)$ are satisfied. This new red phosphor is hereinafter referred to as a red phosphor of a second example in the first embodiment and will be described in detail below.

In the chemical composition of the red phosphor of the second example in the first embodiment, x satisfies $0<x\le0.6$. Since x is more than 0, Ce can emit light. In order to increase emission intensity, x is desirably 0.0003 or more, more desirably 0.015 or more. The maximum value of x is not particularly limited as long as the phosphor can emit light. However, an excessively large x results in low emission intensity due to concentration quenching. Thus, the decrease in emission intensity can be reduced when x is 0.6 or less. In order to increase emission intensity, x is desirably 0.3 or less, more desirably 0.15 or less.

In the red phosphor of the second example in the first embodiment, in order to increase the emission wavelength and the excitation wavelength, it is desirable to increase substitution of Y for La. Thus, in the chemical composition of the red phosphor of the second example in the first embodiment, x and β desirably satisfy $(1.5-0.5x)\le p\le(3-x)$, more desirably $1.5\le p\le(3-x)$.

The red phosphor of the second example in the first embodiment has an emission spectrum peak in the wavelength range of 600 to 660 nm. The red phosphor of the second example in the first embodiment may have an emission spectrum peak with a wavelength of 605 nm or more, for example. The red phosphor of the second example in the first embodiment may have an emission spectrum peak with a wavelength of 640 nm or less or an emission spectrum peak with a wavelength of 636 nm or less, for example.

The red phosphor of the second example in the first embodiment has an excitation spectrum peak in the wavelength range of 480 to 550 nm. The red phosphor of the second example in the first embodiment may have an excitation spectrum peak with a wavelength of 490 nm or more or an excitation spectrum peak with a wavelength of 495 nm or more, for example. The red phosphor of the second example in the first embodiment may have an excitation spectrum peak with a wavelength of 530 nm or less or an excitation spectrum peak with a wavelength of 508 nm or less, for example.

When the excitation spectrum peak in the wavelength range of 480 to 550 nm is referred to as a first excitation spectrum peak, the red phosphor of the second example in the first embodiment may further have a second excitation spectrum peak in the wavelength range of 350 nm or more and less than 480 nm. The first or second excitation spectrum peak may be the maximum peak of the excitation spectrum.

The crystal phase of the red phosphor of the second example in the first embodiment may have a 1/e emission lifetime of 100 ns or less. The emission lifetime has an influence on the luminance saturation characteristics. Phosphors containing Eu, such as a known red phosphor CASN:Eu, have a longer emission lifetime than phosphors containing Ce. Thus, phosphors containing Eu are likely to reach luminance saturation due to a decrease in quantum efficiency during high-energy excitation. Thus, the red phosphor including the Ce luminescent center of the first embodiment is expected to be a red phosphor with higher quantum efficiency than known red phosphors even at high power.

The host material of the red phosphor of the second example in the first embodiment may contain a tetragonal crystal. In other words, a crystal phase having the chemical composition $Ce_xY_pLa_{3-x-p}Si_6N_{11}$ in the red phosphor of the second example in the first embodiment may have a tetragonal crystal structure. The crystal phase may have almost the same crystal structure as a crystal represented by the general formula $La_3Si_6N_{11}$.

The crystal phase of the red phosphor of the second example in the first embodiment may have a crystal structure in which Ce substitutes at least part of the La(2a) sites of the $La_3Si_6N_{11}$ crystal structure. The crystal phase of the red phosphor of the second example in the first embodiment may have a crystal structure in which Y substitutes at least part of the La(4c) sites of the $La_3Si_6N_{11}$ crystal structure or a crystal structure in which Y substitutes the majority of the La(4c) sites of the $La_3Si_6N_{11}$ crystal structure.

As illustrated in FIG. 7, La in the $La_3Si_6N_{11}$ crystal structure has two coordination states: the La(2a) sites and the La(4c) sites. The La(2a) sites have high symmetry, and the La(4c) sites have low symmetry. For example, substitution of Ce with a large ionic radius for La at a La(2a) site with high symmetry decreases the enthalpy of formation by approximately 48 meV as determined by first principle calculation and is thermodynamically stable. From this standpoint, the crystal phase of the phosphor of the first embodiment desirably has a crystal structure in which Ce substitutes at least part of the La(2a) sites of the $La_3Si_6N_{11}$ crystal structure. Furthermore, for example, substitution of Y for La at a La(4c) site with low symmetry enlarges the splitting of the 5d orbital of Ce due to large lattice distortion. This decreases the energy difference between the 4f orbital and the 5d orbital and can shift the excitation wavelength and the emission wavelength to the long wavelength side. From this standpoint, the crystal phase of the phosphor of the first embodiment desirably has a crystal structure in which Y substitutes at least part of the La(4c) sites of the $La_3Si_6N_{11}$ crystal structure. Furthermore, the crystal phase of the phosphor of the first embodiment more desirably has a crystal structure in which Y substitutes the majority of the La(4c) sites of the $La_3Si_6N_{11}$ crystal structure.

<Method for Producing Red Phosphor of Second Example in First Embodiment>

A method for producing the red phosphor of the second example in the first embodiment will be described below.

For example, a Ce compound, a La compound, a Si compound, and a Y compound may be used as raw materials, or each of Ce, La, Si, and Y may be used as a raw material. The compound may be a compound that can be converted into a nitride by firing in a nitrogen atmosphere, a high-purity (purity of 99% or more) nitride, or a metal alloy. A small amount of fluoride (such as ammonium fluoride) may be added to promote the reaction.

For example, a Ce compound, a La compound, a Si compound, and a Y compound may be prepared at a chemical composition ratio represented by $Ce_xY_yLa_{3-x-y}Si_6N_{11}$ ($0<x\leq0.6$, $(1.5-x)\leq y\leq(3-x)$). The Si compound may be replaced by Si alone. Specific raw materials may be a $CeF_3$ powder, a LaN powder, a $Si_3N_4$ powder, and a YN powder, for example. The $CeF_3$ powder may be replaced by a CeN powder. The $Si_3N_4$ powder may be replaced by a powder of Si alone. The amount of the LaN powder may be approximately 24% more than the theoretical value. LaN is likely to be decomposed during firing, and the addition of excess LaN in the preparation of the raw materials can reduce the production of a by-product $LaSi_3N_5$ crystals.

The red phosphor of the second example in the first embodiment is produced by firing a mixture of the raw materials. The raw materials may be mixed by wet blending in a solution or by dry blending of dry powders. Industrially commonly used ball mills, medium stirring mills, planetary mills, vibrating mills, jet mills, V-type mixers, and agitators may be used. The firing is performed in a high-pressure nitrogen atmosphere at a temperature in the range of 1500° C. to 2000° C. for approximately 1 to 50 hours. The pressure is typically 3 atm or more, desirably 4 atm or more, more desirably 8 atm or more. After firing, the phosphor may be washed in a 10% nitric acid solution for 1 hour, for example. The resulting phosphor powder may be ground again in a ball mill or a jet mill and, if necessary, may be washed or classified to adjust the particle size distribution and flowability of the phosphor powder.

<New Composition $La_3(Si,Al)_6N_{11}$:Ce Phosphor>

In order to increase the emission wavelength of a phosphor to provide a Ce red phosphor, the present inventors intended to reduce the symmetry of a ligand of Ce. More specifically, the present inventors intended to introduce $Al^{3+}$ into $La_3Si_6N_{11}$:Ce.

$Al^{3+}$ has a much smaller ionic radius than $La^{3+}$. Thus, substitution of $Al^{3+}$ at a $La_3^{3+}$ site greatly distorts the crystal and is expected to reduce the symmetry of the ligand. Alternatively, having an ionic radius similar to that of $Si^{4+}$, $Al^{3+}$ may occupy a $Si^{4+}$ site. In this case, $N^{3-}$ may be simultaneously substituted by $O^{2-}$ to adjust the valence. Furthermore, substitution of $Al^{3+}$ at three $Si^{4+}$ sites may be accompanied by a loss of $N^{3-}$. In both cases, the symmetry of the ligand is reduced.

On the basis of these findings, the present inventors have found a crystal structure that potentially includes a ligand with lower symmetry than a ligand of Ce in known LSN:Ce yellow phosphors, as described later. For example, a phosphor having the chemical composition LSN:Ce disclosed in Japanese Patent No. 4459941 as an example of known LSN:Ce yellow phosphors has an emission peak wavelength in the range of 574 to 594 nm and an excitation peak wavelength in the range of 455 to 460 nm.

The results and discussion of the crystal structure simulation will be described below. In order to examine a site of the $La_3Si_6N_{11}$ crystal structure that can be substituted by Ce, first principle calculation was used in substitution of Ce at a La site of $La_3Si_6N_{11}$ and in structural optimization. CASTEP available from Dassault Systemes Biovia K.K. was used for the first principle calculation. GGA was used as a functional, and PBE was used for exchange-correlation interaction.

Figure 10:
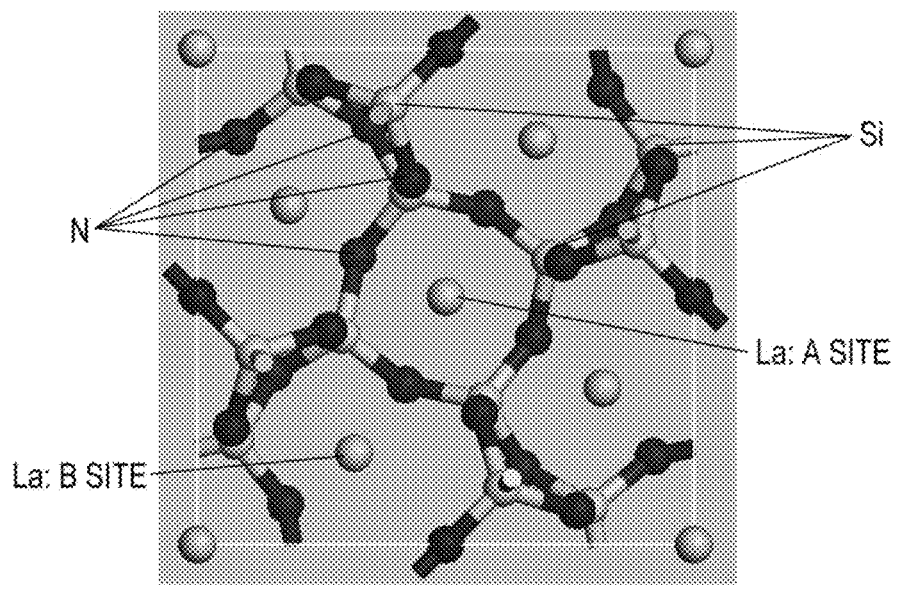
FIG. 10 is a schematic view of a 1×1×3 supercell structure of $La_3Si_6N_{11}$ after structural optimization.
Figure 11:
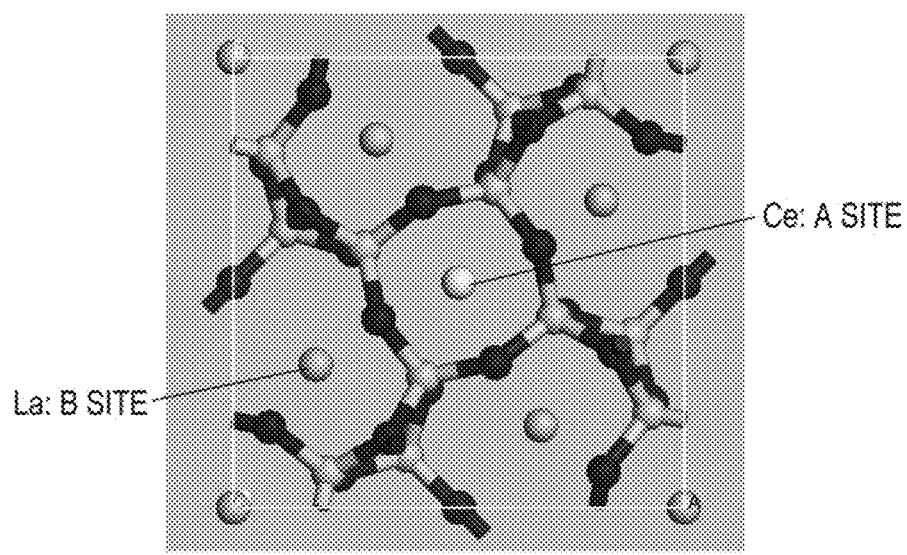
FIG. 11 is a schematic view of a 1×1×3 supercell structure of $La_3Si_6N_{11}$:Ce after substitution of Ce for La at an A site and after structural optimization.
Figure 12:
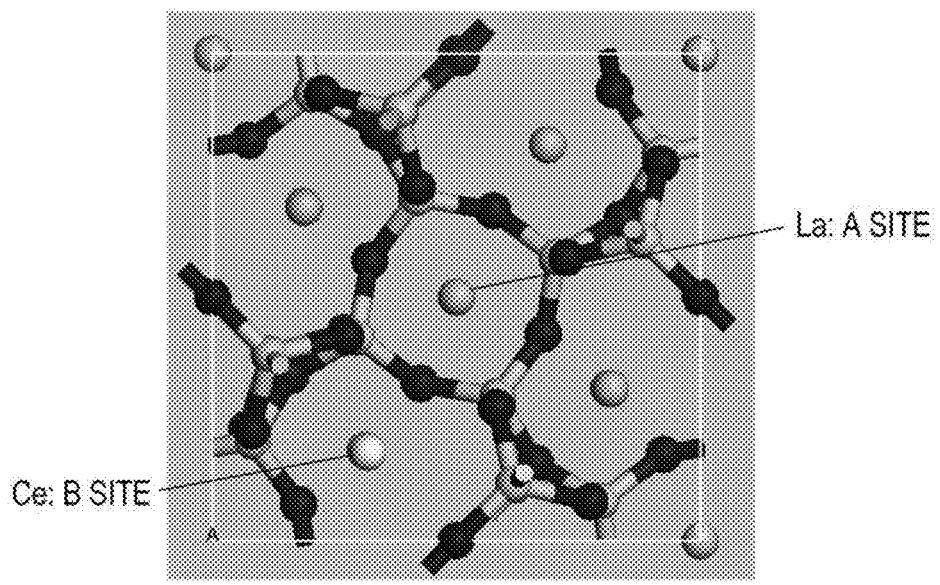
FIG. 12 is a schematic view of a 1×1×3 supercell structure of $La_3Si_6N_{11}$:Ce after substitution of Ce for La at a B site and after structural optimization.

FIG. 10 illustrates the structural optimization results of the 1×1×3 supercell of $La_3Si_6N_{11}$. The space group of a unit cell of $La_3Si_6N_{11}$ is P4bm (#100). The coordination state of La includes an A site with high symmetry and a B site with low symmetry. FIG. 11 illustrates a crystal structure 1 including substitution of Ce for La at an A site and subjected to structural optimization. FIG. 12 illustrates a crystal structure 2 including substitution of Ce for La at a B site and subjected to structural optimization.

FIG. 11 shows that eight N atoms are located at almost equal distances around Ce at an A site. Two quadrangular pyramids with Ce at the vertex share the vertex and have eight coordination geometry with square bottoms twisted 45 degrees with respect to each other. The eight coordination geometry includes a ligand of Ce with high symmetry FIG. 12 shows that eight N atoms are located at different distances and angles around Ce at a B site. A ligand of Ce has lower symmetry at the B site than at the A site.

Table 3 lists the Ce—N distance and its standard deviation of the crystal structure 1 including substitution of Ce for La at an A site of the $La_3Si_6N_{11}$ crystal structure and the crystal structure 2 including substitution of Ce for La at a B site of the $La_3Si_6N_{11}$ crystal structure for quantification of symmetry.

TABLE 3

| | Ce-N distance (Å) | | | | | | | | Standard deviation |
|---|---|---|---|---|---|---|---|---|---|
| | Ce-N1 | Ce-N2 | Ce-N3 | Ce-N4 | Ce-N5 | Ce-N6 | Ce-N7 | Ce-N8 | σCe-N |
| Crystal structure 1 | 2.628 | 2.614 | 2.621 | 2.629 | 2.650 | 2.646 | 2.662 | 2.665 | 0.019 |
| Crystal structure 2 | 2.508 | 2.366 | 2.508 | 2.366 | 2.696 | 2.775 | 2.697 | 2.774 | 0.171 |
| Crystal structure 3 | 2.717 | 2.462 | 3.593 | 3.007 | 2.810 | 3.595 | 2.469 | 2.735 | 0.450 |
| Crystal structure 4 | 3.099 | 2.303 | 3.670 | 3.107 | 2.551 | 3.670 | 2.314 | 2.578 | 0.560 |

The results also show that the Ce ligand has lower symmetry in the crystal structure 2 including substitution of Ce for La at a B site than in the crystal structure 1 including substitution of Ce for La at an A site.

In order to determine which of La at an A site or La at a B site is easy to substitute by Ce, the enthalpy of formation of each crystal was calculated by first principle calculation. It was found that the crystal structure 1 including substitution of Ce for La at an A site is more stable than the crystal structure 2 including substitution of Ce for La at a B site with the enthalpy of formation being lower by 48 meV in the crystal structure 1 than in the crystal structure 2.

Thus, in known LSN:Ce yellow phosphors, Ce is located at an energetically stable A site at which a ligand has high symmetry, for example, as in the crystal structure 1. This probably results in yellow light emission.

These analysis results show that the equilibrium point of the 4f orbital and the 5d orbital shifts due to low symmetry of a ligand of Ce in $La_3Si_6N_{11}$:Ce including substitution of Ce for La at a B site as in the crystal structure 2. Thus, it is possible to emit light with a longer wavelength than light emitted from known LSN:Ce yellow phosphors.

The red phosphor of the first embodiment may contain Al in the starting material, and therefore Al may be incorporated into the crystal phase of the phosphor. Furthermore, O in the raw materials may be incorporated into the phosphor crystal phase. Si and Al as well as N and O are interchangeable due to their similar ionic radii. The ionic radii are Al>Si and N>O. Thus, substitution of Al for Si increases the lattice constant, and substitution of O for N decreases the lattice constant. Simultaneous substitution of Al for Si and O for N can further stabilize the crystal. Simultaneous substitution of Al for Si and O for N can also maintain the valence of the crystal. Thus, the numbers of moles of Al and O in the crystal phase may be the same.

Figure 13:
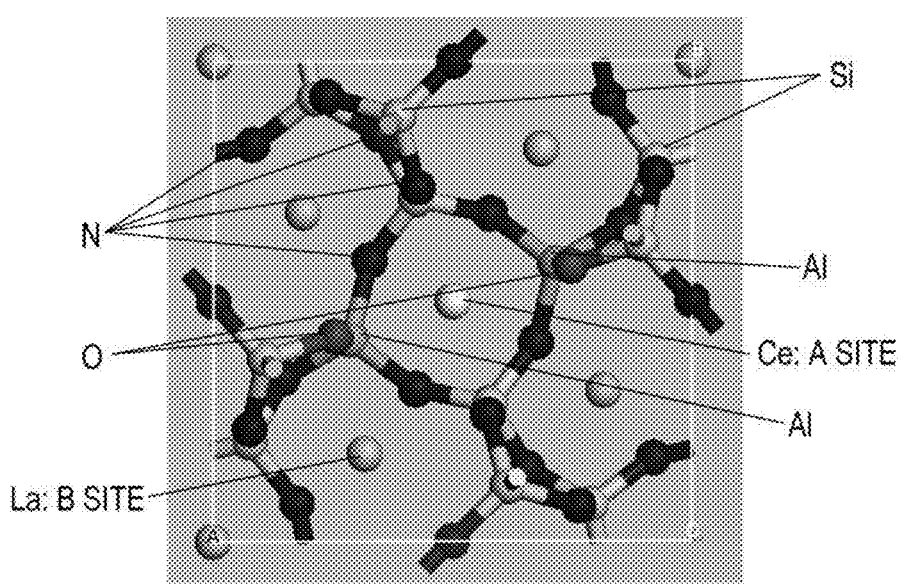
FIG. 13 is a schematic view of a 1×1×3 supercell structure of $La_3Si_6N_{11}$:Ce after substitution of Ce for La at an A site, substitution of Al at a Si site, and substitution of O at a N site, and after structural optimization.
Figure 14:
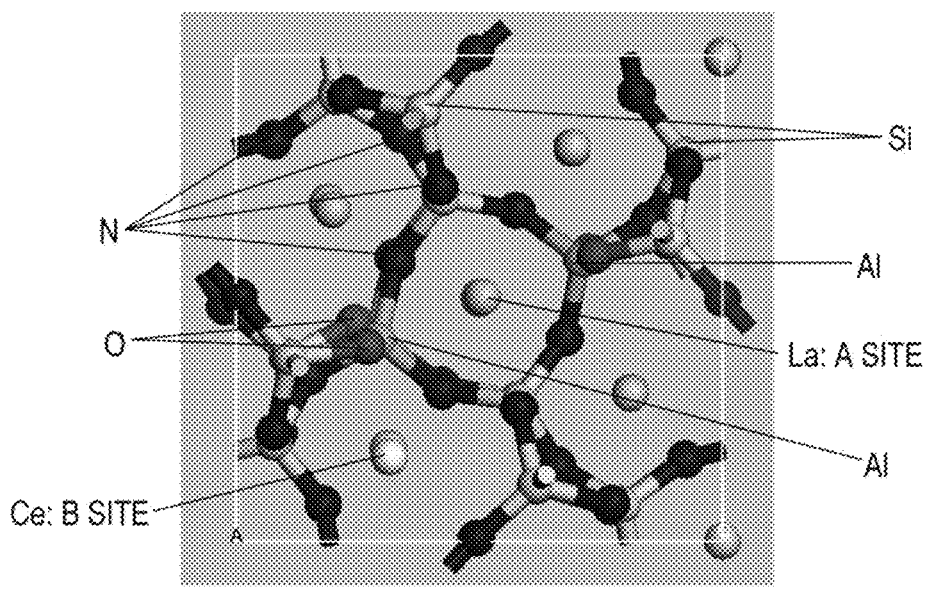
FIG. 14 is a schematic view of a 1×1×3 supercell structure of $La_3Si_6N_{11}$:Ce after substitution of Ce for La at a B site, substitution of Al at a Si site, and substitution of O at a N site, and after structural optimization.

From these viewpoints, and in order to reduce symmetry, a crystal structure including substitution of Al at part of the Si sites and substitution of O at part of the N sites near Ce of $La_3Si_6N_{11}$:Ce was studied. FIG. 13 illustrates a crystal structure 3 including substitution of Ce for La at an A site in the original crystal structure and subjected to structural optimization. FIG. 14 illustrates a crystal structure 4 including substitution of Ce for La at a B site in the original crystal structure and subjected to structural optimization. Table 3 lists the Ce—N distance and its standard deviation of the crystal structure 3 and the crystal structure 4. The standard deviations of the crystal structure 3 and the crystal structure 4 are larger than that of the crystal structure 1, thus showing a decrease in the symmetry of a ligand of Ce.

These analysis results show that the equilibrium point of the 4f orbital and the 5d orbital of a crystal structure including substitution of Al at part of the Si sites and substitution of O at part of the N sites near Ce of $La_3Si_6N_{11}$:Ce, such as the crystal structure 3 or the crystal structure 4, shifts due to low symmetry of a ligand of Ce, and therefore such a structure can emit light with a longer wavelength than light emitted from known LSN:Ce yellow phosphors. In this case, in order to emit light with a longer wavelength than light emitted from known LSN:Ce yellow phosphors, it is desirable that the crystal phase contain a larger amount of Al or O or both than Ce.

Furthermore, a crystal structure including substitution of Al at part of the Si sites near Ce of $La_3Si_6N_{11}$:Ce and including a defect at a N site was examined. In order to adjust the valence in substitution of $Al^{3+}$ for $Si^{4+}$, it is desirable that substitution of three $Al^{3+}$ ions for three $Si^{4+}$ ions be simultaneously accompanied by a loss of one $N^{3-}$. Substitution of Al for coordinating Si near Ce simultaneous with a loss of N reduces the symmetry of a ligand of Ce. Thus, it is possible to emit light with a longer wavelength than light emitted from known LSN:Ce yellow phosphors.

In this case, in order to emit light with a longer wavelength than light emitted from known LSN:Ce yellow phosphors, it is desirable that at least the amount of Al be greater than or equal to the amount of Ce. Furthermore, substitution of Al at three Si sites can provide charge compensation for a N defect. Thus, it is desirable that the amount of Al be at least three times the amount of Ce.

The results of the crystal structure simulation show that a phosphor having any of the following crystal structures can emit light with a longer wavelength than light emitted from known LSN:Ce yellow phosphors: (1) a crystal structure including substitution of Ce for La at a B site of a $La_3Si_6N_{11}$ crystal, (2) a crystal structure including substitution of Ce at at least one of an A site and a B site of La of a $La_3Si_6N_{11}$ crystal and substitution of Al—O for part of Si—N near Ce, and (3) a crystal structure including substitution of Ce at an A site and/or a B site of La of a $La_3Si_6N_{11}$ crystal, substitution of Al for Si near Ce, and a loss of N.

The simulation results suggest the reason why the phosphor of the first embodiment emits red light with a longer wavelength than light emitted from known LSN:Ce yellow phosphors. The simulation results are described by way of example only and do not limit the crystal structure of the phosphor of the first embodiment.

From these results, the present inventors have found a new red phosphor containing a crystal phase having the chemical composition $Ce_xLa_{3-x}Si_{6-q}Al_qN_{11-z}$. In the new red phosphor, x, q, and z satisfy $0<x\leq0.6$, $0<q\leq3.0$, and $0\leq z<1.0$. This new red phosphor is hereinafter referred to as a red phosphor of a third example in the first embodiment and will be further described in the following examples.

Examples 1 to 4 and Comparative Example 1

A method for producing a phosphor will be described below. A LaN powder, a $Si_3N_4$ powder, an AlN powder, and a CeF$_3$ powder were prepared as starting materials. First, the LaN powder, the Si$_3$N$_4$ powder, and the CeF$_3$ powder were weighed and mixed at a composition represented by the general formula La$_{2.91}$Ce$_{0.09}$Si$_6$N$_{11}$. The amount of the LaN powder was 24% more than the theoretical value. The mixed powder was mixed with the AlN powder in the amount listed in Table 4. In Comparative Example 1, no AlN powder was added. The mixing method was dry blending with a mortar in a glove box in a nitrogen atmosphere. The mixed raw powders were placed in a boron nitride crucible. The raw powders were fired in a 0.5 MPa nitrogen atmosphere at 1900° C. for 2 hours. The fired sample was washed in a 10% nitric acid solution for 1 hour. Examples 1 to 4 and Comparative Example 1 were produced from the starting materials listed in Table 4 in this way.

TABLE 4

| | LaN | Si$_3$N$_4$ | AlN | CeF$_3$ | x | Emission peak wavelength | Excitation peak wavelength |
|---|---|---|---|---|---|---|---|
| Example 1 | 1.316 g | 0.659 g | 0.096 g | 0.042 g | 0.09 | 642 nm | 540 nm |
| Example 2 | 1.206 g | 0.604 g | 0.265 g | 0.038 g | 0.09 | 642 nm | 537 nm |
| Example 3 | 1.113 g | 0.557 g | 0.407 g | 0.035 g | 0.09 | 642 nm | 539 nm |
| Example 4 | 0.932 g | 0.467 g | 0.682 g | 0.030 g | 0.09 | 641 nm | 539 nm |
| Comparative example 1 | 1.380 g | 0.691 g | 0 g | 0.044 g | 0.09 | 536 nm | 450 nm |

Comparative Example 2

A Ca$_3$N$_2$ powder, a Si$_3$N$_4$ powder, an AlN powder, and a EuN powder were prepared as starting materials. The Ca$_3$N$_2$ powder, the Si$_3$N$_4$ powder, the AlN powder, and the EuN powder were weighed and mixed at a composition represented by the general formula Ca$_{0.97}$Eu$_{0.03}$AlSiN$_3$. The mixing method was dry blending with a mortar in a glove box in a nitrogen atmosphere. The mixed raw powders were placed in a boron nitride crucible. The raw powders were fired in a 0.5 MPa nitrogen atmosphere at 1600° C. for 2 hours. The fired sample was washed in a 10% nitric acid solution for 1 hour. Comparative Example 2 represented by CASN:Eu was produced in this way.

<Evaluation of Emission/Excitation Spectrum>

Figure 15:
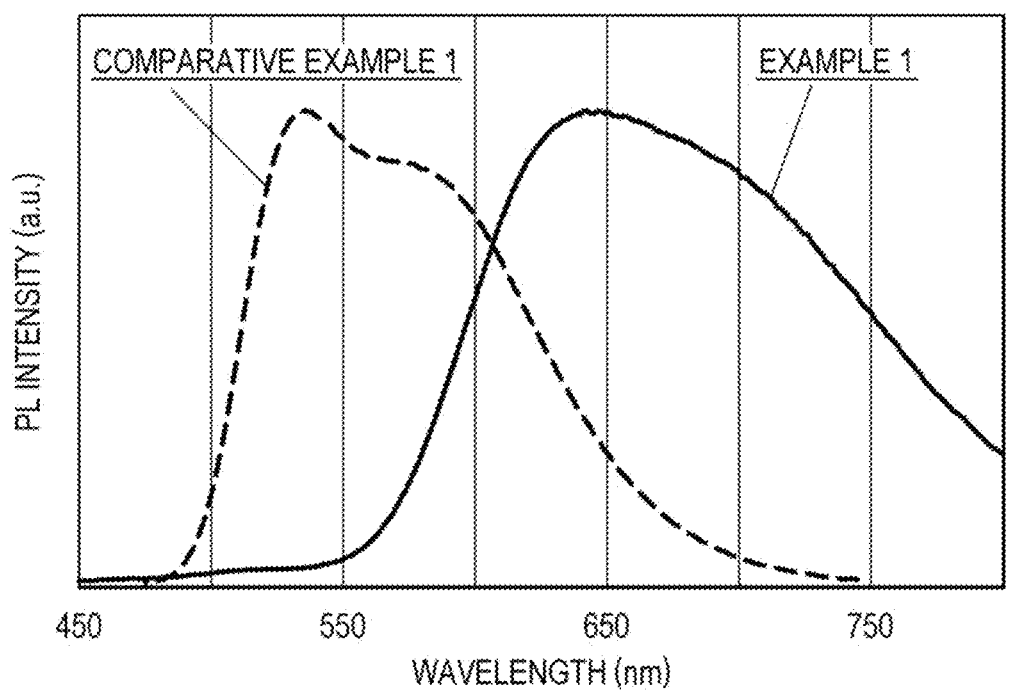
FIG. 15 is a graph of emission spectra of Example 1 and Comparative Example 1.
Figure 16:
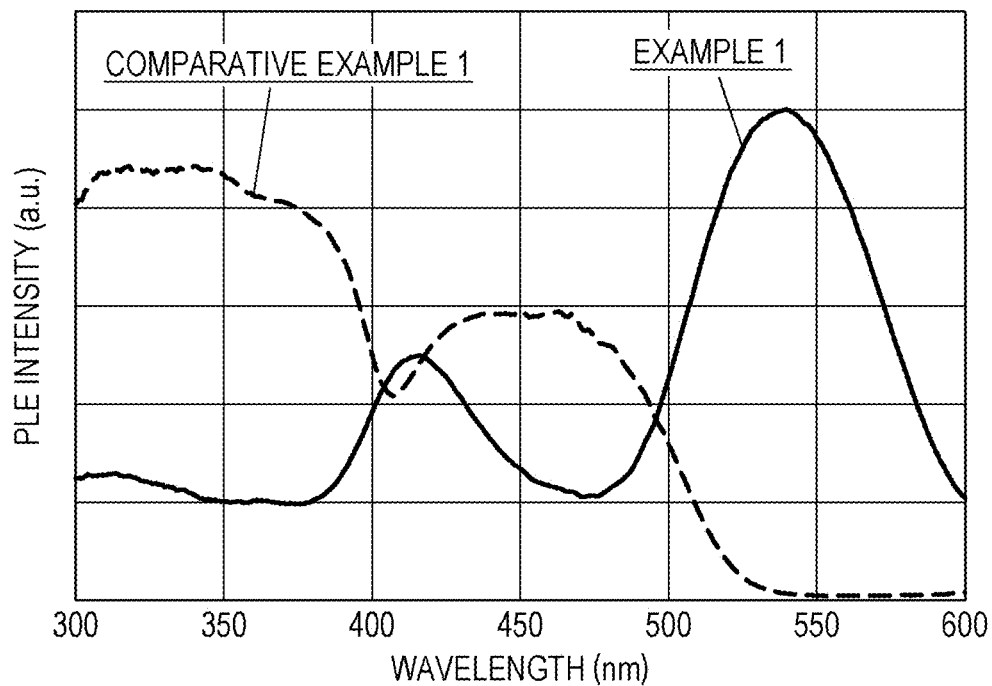
FIG. 16 is a graph of excitation spectra of Example 1 and Comparative Example 1.

The emission spectra and excitation spectra of Examples 1 to 4 and Comparative Example 1 were measured with a spectrofluorophotometer (FP-6500 manufactured by JASCO Corporation). FIG. 15 shows the emission spectra of Example 1 and Comparative Example 1. FIG. 16 shows the excitation spectra of Example 1 and Comparative Example 1. Table 4 lists the emission peak wavelength in the range of 450 to 800 nm and the excitation peak wavelength in the range of 400 to 600 nm. A Xe lamp was used as an excitation light source. The emission spectrum was measured while the excitation peak wavelength of each sample listed in Table 4 was used as the wavelength of the excitation light source. The excitation spectrum was measured while the emission peak wavelength of each sample listed in Table 4 was used as the monitor wavelength.

Comparative Example 1 containing no AlN in the starting materials emitted yellow light with an emission peak wavelength of 536 nm. The excitation peak wavelength was 450 nm. It is generally known that a phosphor crystal represented by La$_3$Si$_6$N$_{11}$ doped with Ce has an emission peak (approximately 535 nm) on the short wavelength side and an emission peak (approximately 580 nm) on the long wavelength side. These are almost the same as the emission peak on the short wavelength side and the emission peak on the long wavelength side of the phosphor described in Japanese Patent No. 5842162. The position of the excitation peak wavelength was also almost the same as in Japanese Patent No. 5842162.

Examples 1 to 4 emitted red light with an emission peak wavelength of approximately 640 nm. It was found that Examples 1 to 4 had an excitation peak at a wavelength of approximately 540 nm. These demonstrate that Examples 1 to 4 had different light-emitting properties from those of Comparative Example 1. Examples 1 to 4 had an additional excitation spectrum peak in the wavelength range of 350 nm or more and less than 500 nm.

<Evaluation of Emission Lifetime>

Figure 17:
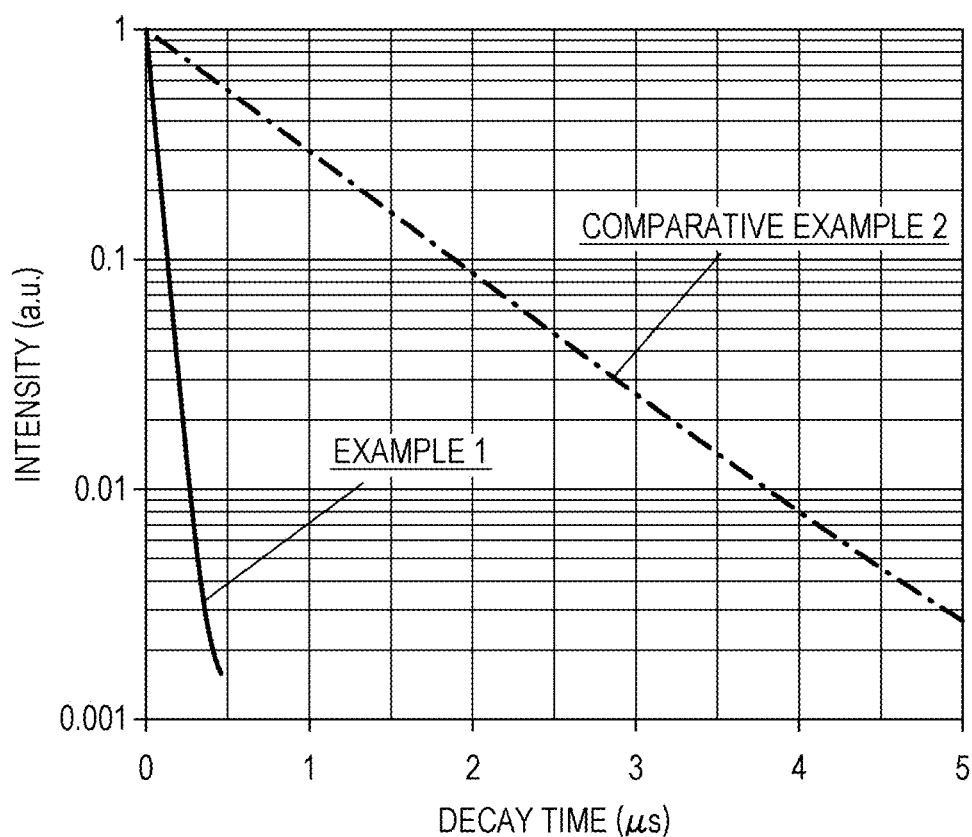
FIG. 17 is a graph of afterglow spectra of Example 1 and Comparative Example 2.

The emission lifetimes of Examples 1 to 4 and Comparative Examples 1 and 2 were measured with a fluorescence lifetime measuring apparatus (Quantaurus-Tau compact fluorescence lifetime measurement system manufactured by Hamamatsu Photonics K.K.). FIG. 17 shows the afterglow spectra of Example 1 and Comparative Example 2, wherein emission intensity changes are plotted as a function of time after the excitation light is blocked. Table 5 lists the 1/e emission lifetimes of Examples 1 to 4 and Comparative Examples 1 and 2.

TABLE 5

| | 1/e emission lifetime |
|---|---|
| Example 1 | 54 ns |
| Example 2 | 55 ns |
| Example 3 | 54 ns |
| Example 4 | 53 ns |
| Comparative example 1 | 42 ns |
| Comparative example 2 | 820 ns |

Example 1 had a 1/e emission lifetime of 54 ns. Examples 1 to 4 and Comparative Example 1 had a 1/e emission lifetime of approximately 50 ns, thus confirming that the 1/e emission lifetime is 100 ns or less. It is known that the emission lifetime of Ce generally ranges from approximately 10 to 100 ns. Thus, the light emission in Examples 1 to 4 and Comparative Example 1 is probably emitted from Ce.

CASN:Eu of Comparative Example 2 had an emission lifetime of 820 ns. The emission lifetime has an influence on the luminance saturation characteristics. It is known that as compared with phosphors containing Ce, phosphors containing Eu are more likely to reach luminance saturation due to a decrease in quantum efficiency during high-energy excitation. The phosphors of Examples 1 to 4 and Comparative Example 1 have much shorter emission lifetimes than CASN:Eu and are less likely to reach luminance saturation. Thus, the phosphors of Examples 1 to 4 and Comparative Example 1 in combination with a high-power excitation light source can provide a high-power light-emitting device.

<Evaluation of Crystal Structure>

The X-ray powder diffraction patterns of Examples 1 to 4 and Comparative Example 1 were measured with an X-ray diffractometer (RINT2100 manufactured by Rigaku). The measurement was performed with Cu-Kα radiation under the conditions listed in Table 6.

TABLE 6

| Start angle | Final angle | Sampling width | Scanning speed | Tube voltage | Tube current | Divergence slit | Scattering slit | Light-receiving slit |
|---|---|---|---|---|---|---|---|---|
| 10° | 60° | 0.02° | 4°/min | 40 kV | 40 mA | 1° | 1° | 0.15 mm |

Figure 18:
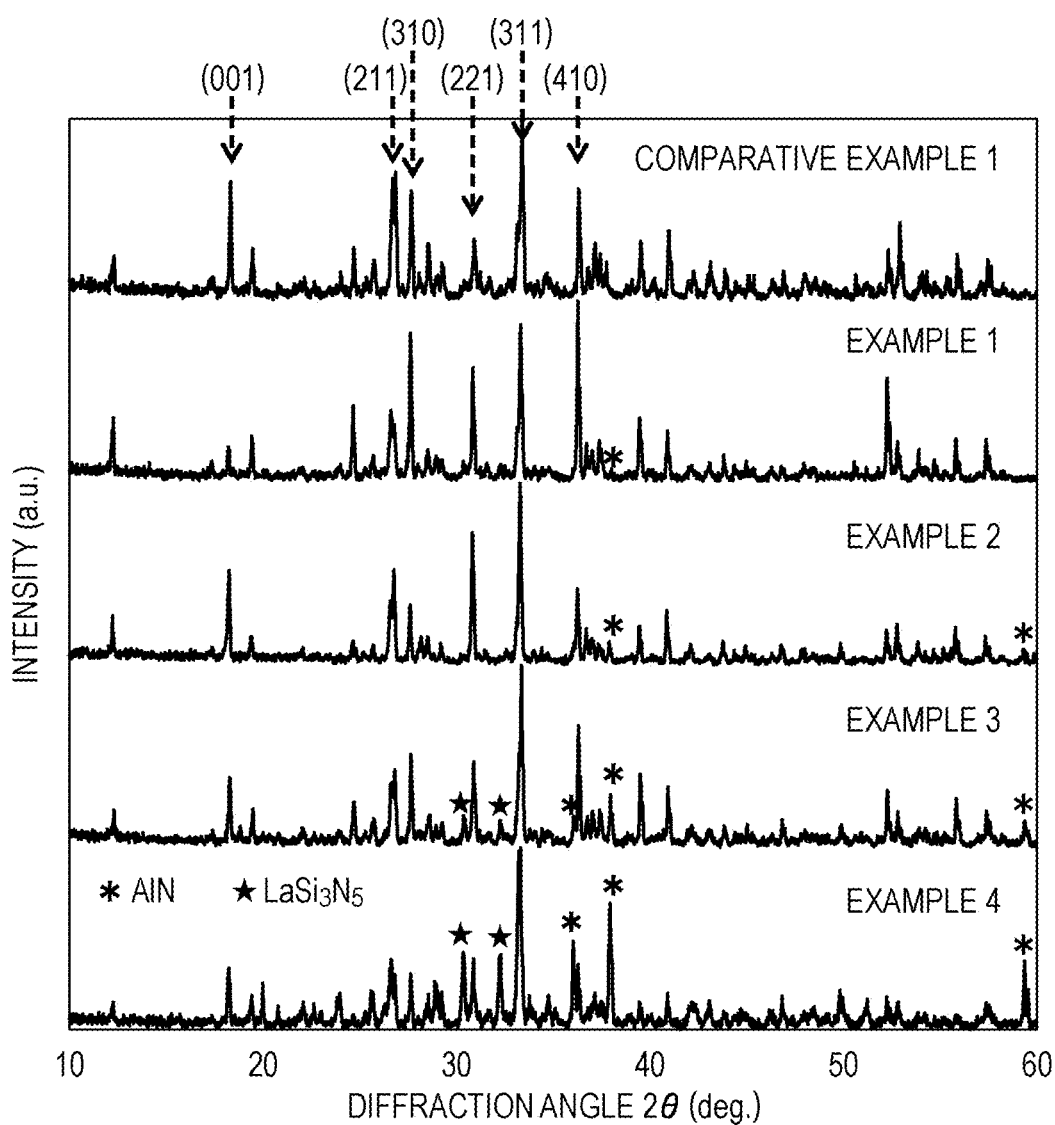
FIG. 18 is a graph of XRD diffraction patterns of Examples 1 to 4 and Comparative Example 1.
Figure 19A:
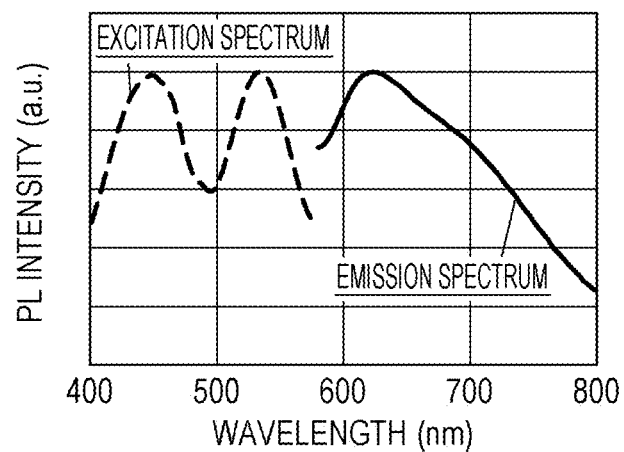
FIG. 19A is a graph of an emission spectrum and an excitation spectrum of Example 5.
Figure 19B:
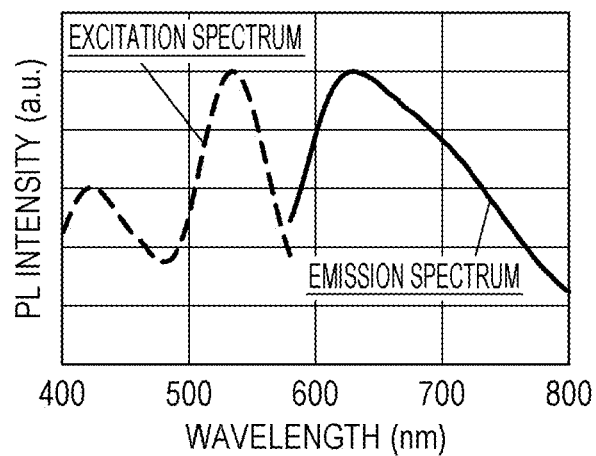
FIG. 19B is a graph of an emission spectrum and an excitation spectrum of Example 6.
Figure 19C:
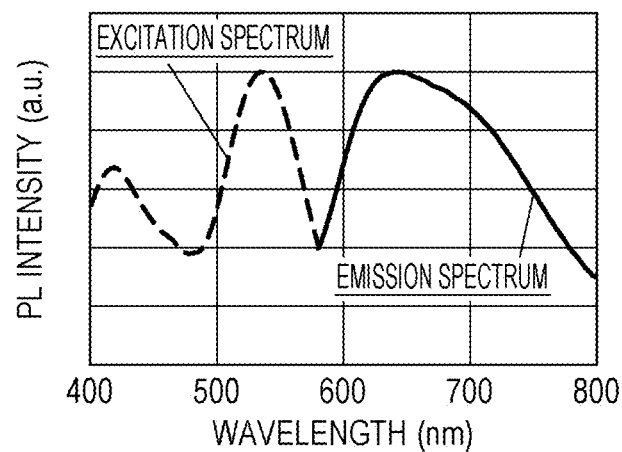
FIG. 19C is a graph of an emission spectrum and an excitation spectrum of Example 7.
Figure 19D:
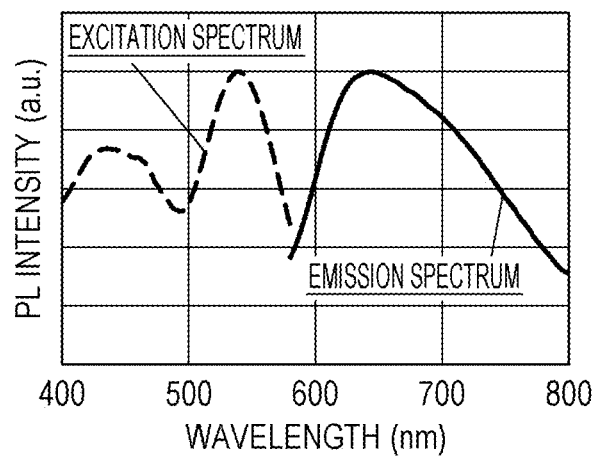
FIG. 19D is a graph of an emission spectrum and an excitation spectrum of Example 8.
Figure 19E:
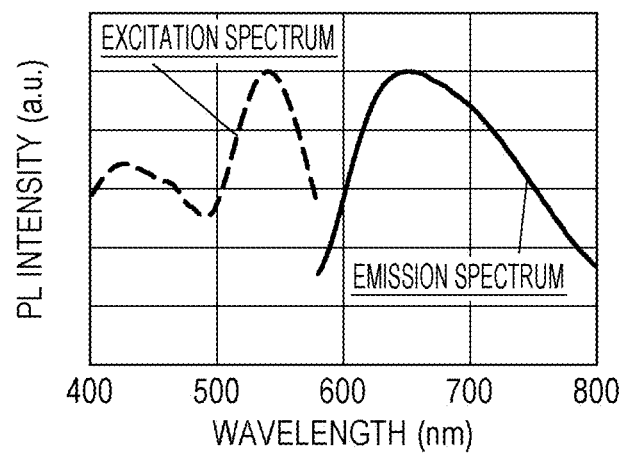
FIG. 19E is a graph of an emission spectrum and an excitation spectrum of Example 9.
Figure 19F:
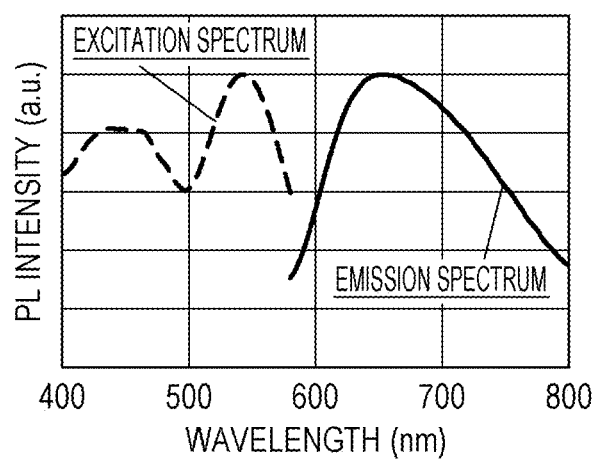
FIG. 19F is a graph of an emission spectrum and an excitation spectrum of Example 10.

FIG. 18 shows the X-ray diffraction patterns. FIG. 18 shows that although the X-ray diffraction patterns of Examples 1 to 4 slightly shift to the low angle side relative to the X-ray diffraction pattern of Comparative Example 1, these X-ray diffraction patterns are almost the same.

Among the diffraction peaks, six diffraction peaks corresponding to the $La_3Si_6N_{11}$ crystal type are designated as peaks 1 to 6 from the low angle side. Table 7 lists 2θ of each of the diffraction peaks.

TABLE 7

|  | Peak 1 | Peak 2 | Peak 3 | Peak 4 | Peak 5 | Peak 6 |
|---|---|---|---|---|---|---|
| Example 1 | 18.20° | 26.62° | 27.60° | 30.84° | 33.30° | 36.26° |
| Example 2 | 18.24° | 26.76° | 27.60° | 30.82° | 33.28° | 36.24° |
| Example 3 | 18.28° | 26.80° | 27.64° | 30.88° | 33.36° | 36.30° |
| Example 4 | 18.24° | 26.62° | 27.64° | 30.88° | 33.30° | 36.04° |
| Comparative example 1 | 18.32° | 26.84° | 27.68° | 30.90° | 33.38° | 36.30° |

Table 7 shows that the X-ray diffraction patterns of the phosphors had diffraction peaks in the range of (1) 2θ=17.8 to 18.8 degrees, (2) 2θ=26.2 to 27.2 degrees, (3) 2θ=27.2 to 28.2 degrees, (4) 2θ=30.5 to 31.5 degrees, (5) 2θ=32.8 to 33.8 degrees, and (6) 2θ=35.8 to 36.8 degrees, corresponding to the peaks 1 to 6, respectively. The peaks 1 to 6 had Miller indices of (001), (211), (310), (221), (311), and (410), respectively. Furthermore, FIG. 18 shows that the diffraction intensity of the diffraction peak corresponding to AlN or $LaSi_3N_5$ increases with the amount of AlN added. For AlN, this is probably because AlN added remained unreacted. For $LaSi_3N_5$, this is probably because a deviation from the stoichiometry composition of the $La_3Si_6N_{11}$ crystal facilitated the formation of the $LaSi_3N_5$ phase.

The space group of the phosphor of Example 1 was analyzed with a single-crystal X-ray structure analyzer (VariMax manufactured by Rigaku). As a result, it was found that the space group was a tetragonal crystal. Thus, Examples 1 to 4 and Comparative Example 1 have almost the same crystal structure as a crystal represented by the general formula $La_3Si_6N_{11}$.

Examples 5 to 10

A method for producing a phosphor will be described below. A LaN powder, a $Si_3N_4$ powder, an AlN powder, and a CeN powder were prepared as starting materials. First, the LaN powder, the $Si_3N_4$ powder, and the CeN powder were weighed and mixed at a composition represented by the general formula $La_{3-x}Ce_xSi_6N_{11}$. The amount of the LaN powder was 24% more than the theoretical value. The mixed powder was mixed with the AlN powder. The mixing method was dry blending with a mortar in a glove box in a nitrogen atmosphere. The mixed raw powders were placed in a boron nitride crucible. The raw powders were fired in a 0.5 MPa nitrogen atmosphere at 1900° C. for 2 hours. The fired sample was washed in a 10% nitric acid solution for 1 hour. Examples 5 to 10 were produced from the starting materials listed in Table 8 in this way.

TABLE 8

|  | LaN | $Si_3N_4$ | AlN | CeN | x | Emission peak wavelength | Excitation peak wavelength |
|---|---|---|---|---|---|---|---|
| Example 5 | 1.028 g | 0.505 g | 0.074 g | 0.004 g | 0.015 | 624 nm | 534 nm |
| Example 6 | 1.024 g | 0.505 g | 0.074 g | 0.008 g | 0.03 | 630 nm | 534 nm |
| Example 7 | 1.007 g | 0.505 g | 0.074 g | 0.025 g | 0.09 | 644 nm | 536 nm |
| Example 8 | 0.991 g | 0.505 g | 0.074 g | 0.042 g | 0.15 | 644 nm | 540 nm |
| Example 9 | 0.974 g | 0.505 g | 0.074 g | 0.058 g | 0.21 | 650 nm | 541 nm |
| Example 10 | 0.957 g | 0.504 g | 0.074 g | 0.075 g | 0.27 | 653 nm | 542 nm |

<Evaluation of Emission/Excitation Spectrum>

The emission spectra and excitation spectra of Examples 5 to 10 were measured with a spectrofluorophotometer (FP-6500 manufactured by JASCO Corporation). FIGS. 19A to 19F show the emission spectra and the excitation spectra of Examples 5 to 10, respectively. A Xe lamp was used as an excitation light source. The emission spectrum was measured while the excitation peak wavelength of each sample listed in Table 8 was used as the wavelength of the excitation light source. The excitation spectrum was measured while the emission peak wavelength of each sample listed in Table 8 was used as the monitor wavelength. All samples of Examples 5 to 10 emitted red light with an emission peak wavelength of 600 nm or more. The emission peak wavelength ranged from 624 to 653 nm.

All samples of Examples 5 to 10 had an excitation peak wavelength of 500 nm or more. The excitation peak wavelength ranged from 534 to 542 nm. An increase in the Ce concentration (x) of the phosphor results in an increase in overlap of the wave function of the excitation level between Ce atoms. This also results in an increase in excitation level energy width, formation of a band, and a decrease in energy difference from the ground level. Thus, an increase in Ce concentration caused a shift of the emission peak wavelength to the long wavelength side.

Examples 5 to 10 also had an additional excitation spectrum peak in the wavelength range of 350 nm or more and less than 500 nm.

<Evaluation of Internal Quantum Efficiency>

Figure 20:
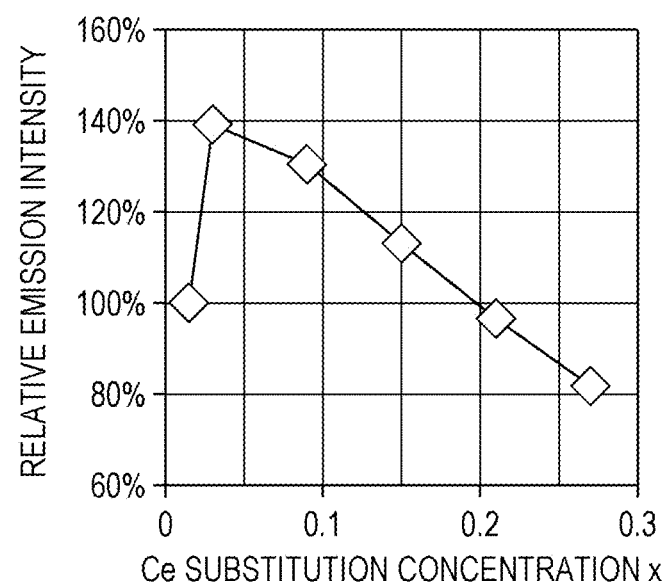
FIG. 20 is a graph showing the relationship between the Ce substitution concentration and the relative emission intensity of Examples 5 to 10.

The internal quantum efficiency (IQE) of Examples 5 to 10 was measured with an absolute PL quantum yield measurement system (C9920-02 manufactured by Hamamatsu Photonics K.K.). FIG. 20 shows the relative emission intensity of Examples 5 to 10. The relative emission intensity in the present example refers to the relative value of each sample with respect to the IQE of Example 5 (100%).

FIG. 20 shows that the relative emission intensity varies with the Ce concentration x of the phosphor. For example, at a Ce substitution concentration x of more than 0.03, the relative emission intensity decreases with increasing Ce substitution concentration x. This is probably due to concentration quenching. Since x is more than 0, Ce can emit light. FIG. 20 shows that x is desirably 0.015 or more, for example. The maximum value of x is not particularly limited as long as the phosphor can emit light. However, an excessively large x results in low emission intensity due to concentration quenching. Thus, x is desirably 0.6 or less. FIG. 20 shows that x is desirably 0.3 or less, more desirably 0.15 or less, for example. For example, at a Ce substitution concentration x in such a range, the phosphor can have higher emission intensity.

<Evaluation of Emission Lifetime>

The emission lifetimes of Examples 5 to 10 were measured with a fluorescence lifetime measuring apparatus (Quantaurus-Tau compact fluorescence lifetime measurement system manufactured by Hamamatsu Photonics K.K.). Table 9 lists the 1/e emission lifetimes of Examples 5 to 10.

TABLE 9

|  | 1/e emission lifetime |
| --- | --- |
| Example 5 | 64 ns |
| Example 6 | 60 ns |
| Example 7 | 56 ns |
| Example 8 | 49 ns |
| Example 9 | 45 ns |
| Example 10 | 42 ns |

In Examples 5 to 10, the 1/e emission lifetime was 100 ns or less. Thus, the phosphors of Examples 5 to 10 in combination with a high-power excitation light source can provide a high-power light-emitting device. An increase in Ce concentration facilitates energy transfer between adjacent Ce atoms and causes energy migration. During energy migration, an electron trapped in a crystal defect is relaxed by non-radiative transition. Thus, an increase in Ce concentration results in an increase in the non-luminescence (non-radiative transition) probability of an electron with a relatively low transition probability, thus resulting in a shorter emission lifetime.

<Evaluation of Crystal Structure>

The X-ray powder diffraction patterns of Examples 5 to 10 and Comparative Example 1 were measured with an X-ray diffractometer (RINT2100 manufactured by Rigaku). The measurement was performed with Cu-Kα radiation under the conditions listed in Table 10.

TABLE 10

| Start angle | Final angle | Sampling width | Scanning speed | Tube voltage | Tube current | Divergence slit | Scattering slit | Light-receiving slit |
| --- | --- | --- | --- | --- | --- | --- | --- | --- |
| 10° | 60° | 0.01° | 1°/min | 40 kV | 40 mA | 1° | 1° | 0.15 mm |

Figure 21:
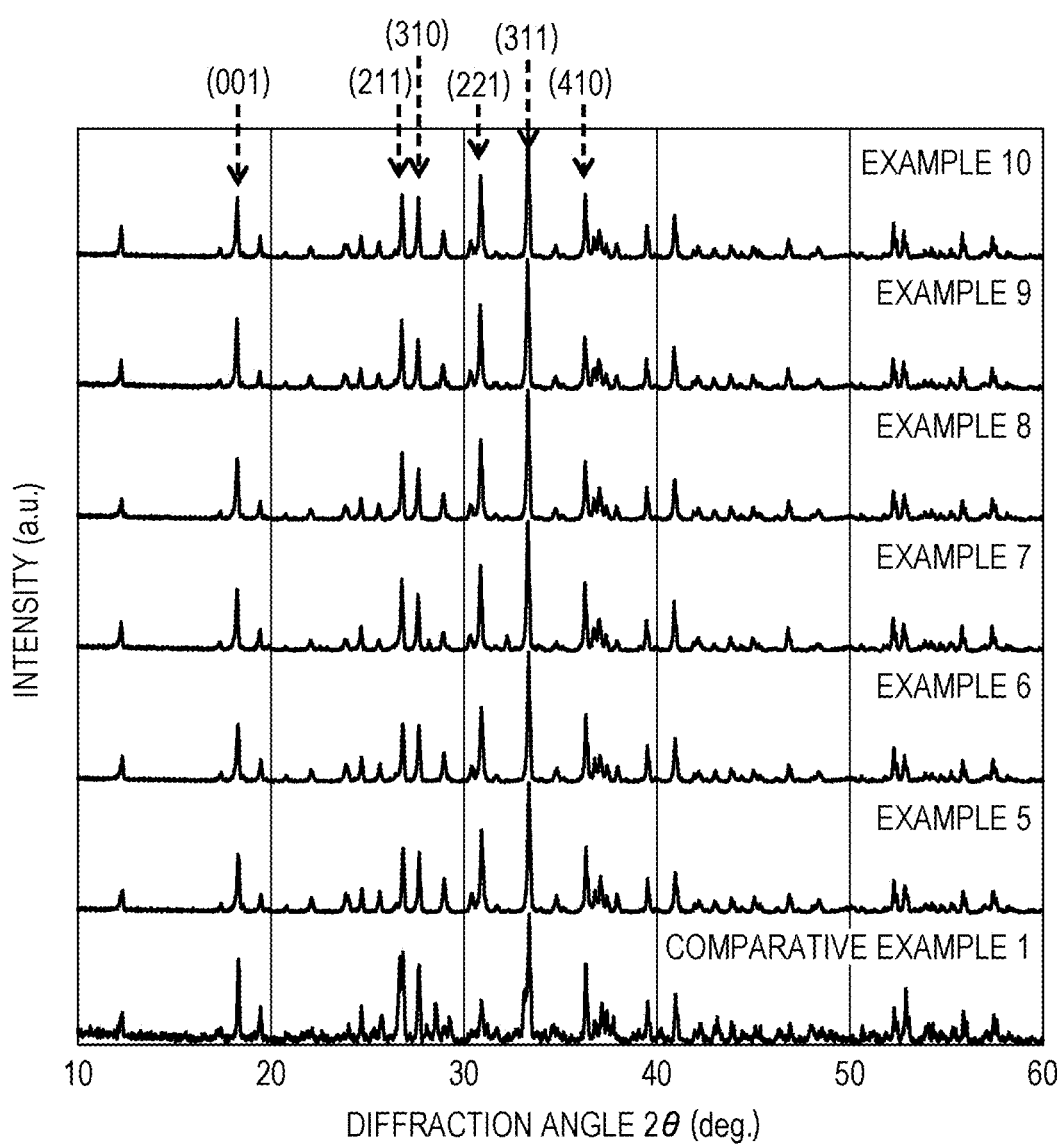
FIG. 21 is a graph of XRD diffraction patterns of Examples 5 to 10 and Comparative Example 1.

FIG. 21 shows measured X-ray diffraction patterns. Although the X-ray diffraction patterns of Examples 5 to 10 slightly shift to the low angle side relative to the X-ray diffraction pattern of Comparative Example 1, these X-ray diffraction patterns are almost the same.

Among the diffraction peaks, six diffraction peaks corresponding to the $La_3Si_6N_{11}$ crystal type are designated as peaks 1 to 6 from the low angle side. Table 11 lists 2θ of each of the diffraction peaks.

TABLE 11

|  | Peak 1 | Peak 2 | Peak 3 | Peak 4 | Peak 5 | Peak 6 |
| --- | --- | --- | --- | --- | --- | --- |
| Example 5 | 18.31° | 26.85° | 27.68° | 30.92° | 33.37° | 36.32° |
| Example 6 | 18.30° | 26.84° | 27.67° | 30.91° | 33.36° | 36.32° |
| Example 7 | 18.25° | 26.78° | 27.62° | 30.86° | 33.32° | 36.27° |
| Example 8 | 18.25° | 26.80° | 27.65° | 30.86° | 33.31° | 36.29° |
| Example 9 | 18.24° | 26.78° | 27.61° | 30.84° | 33.30° | 36.27° |
| Example 10 | 18.26° | 26.81° | 27.64° | 30.87° | 33.33° | 36.29° |

Table 11 shows that the X-ray diffraction patterns of the phosphors had diffraction peaks in the range of (1) 2θ=17.8 to 18.8 degrees, (2) 2θ=26.2 to 27.2 degrees, (3) 2θ=27.2 to 28.2 degrees, (4) 2θ=30.5 to 31.5 degrees, (5) 2θ=32.8 to 33.8 degrees, and (6) 2θ=35.8 to 36.8 degrees, corresponding to the peaks 1 to 6, respectively. The peaks 1 to 6 had Miller indices of (001), (211), (310), (221), (311), and (410), respectively. These results show that the space group of the phosphors of Examples 5 to 10 is a tetragonal crystal, as in Examples 1 to 4 and Comparative Example 1, and has almost the same crystal structure as a crystal represented by the general formula $La_3Si_6N_{11}$.

Example 11 and Comparative Example 3

A method for producing a phosphor will be described below. A LaN powder, a $Si_3N_4$ powder, an AlN powder, and a CeN powder were prepared as starting materials. First, the LaN powder, the $Si_3N_4$ powder, and the CeN powder were weighed and mixed at a composition represented by the general formula $La_{3-x}Ce_xSi_6N_{11}$. The amount of the LaN powder was 24% more than the theoretical value. The mixed powder was mixed with the AlN powder. The mixing method was dry blending with a mortar in a glove box in a nitrogen atmosphere. The mixed raw powders were placed in a boron nitride crucible. The raw powders were fired in a 0.5 MPa nitrogen atmosphere at 1900° C. for 2 hours. The fired sample was washed in a 3% hydrochloric acid solution for 24 hours. Example 11 and Comparative Example 3 were produced from the starting materials listed in Table 12 in this way.

As in Examples 1 to 10, red-light emission with an emission peak wavelength of 600 nm or more was observed in Example 11. The excitation peak wavelength was 500 nm or more.

TABLE 12

|  | LaN | $Si_3N_4$ | AlN | CeN | x | Emission peak wavelength | Excitation peak wavelength |
| --- | --- | --- | --- | --- | --- | --- | --- |
| Example 11 | 6.271 g | 3.305 g | 0.483 g | 0.490 g | 0.27 | 642 nm | 531 nm |
| Comparative example 3 | 6.271 g | 3.305 g | 0 g | 0.490 g | 0.27 | 536 nm | 450 nm |

<Evaluation of Emission Lifetime>

The emission lifetimes of Example 11 and Comparative Example 3 were measured with a fluorescence lifetime measuring apparatus (Quantaurus-Tau compact fluorescence lifetime measurement system manufactured by Hamamatsu Photonics K.K.). Table 13 lists the 1/e emission lifetimes of Example 11 and Comparative Example 3.

TABLE 13

|  | 1/e emission lifetime |
| --- | --- |
| Example 11 | 49 ns |
| Comparative example 3 | 38 ns |

In Example 11, the 1/e emission lifetime was 100 ns or less.

<Evaluation of Crystal Structure>

Figure 22A:
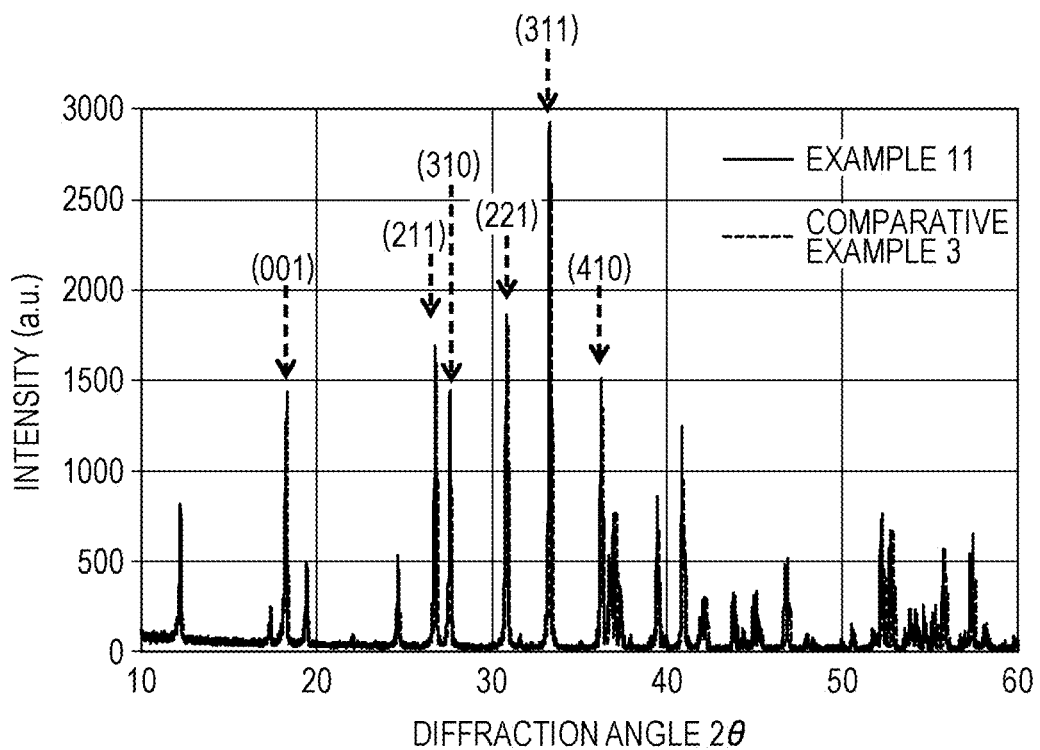
FIG. 22A is a graph of XRD diffraction patterns of Example 11 and Comparative Example 3.
Figure 22B:
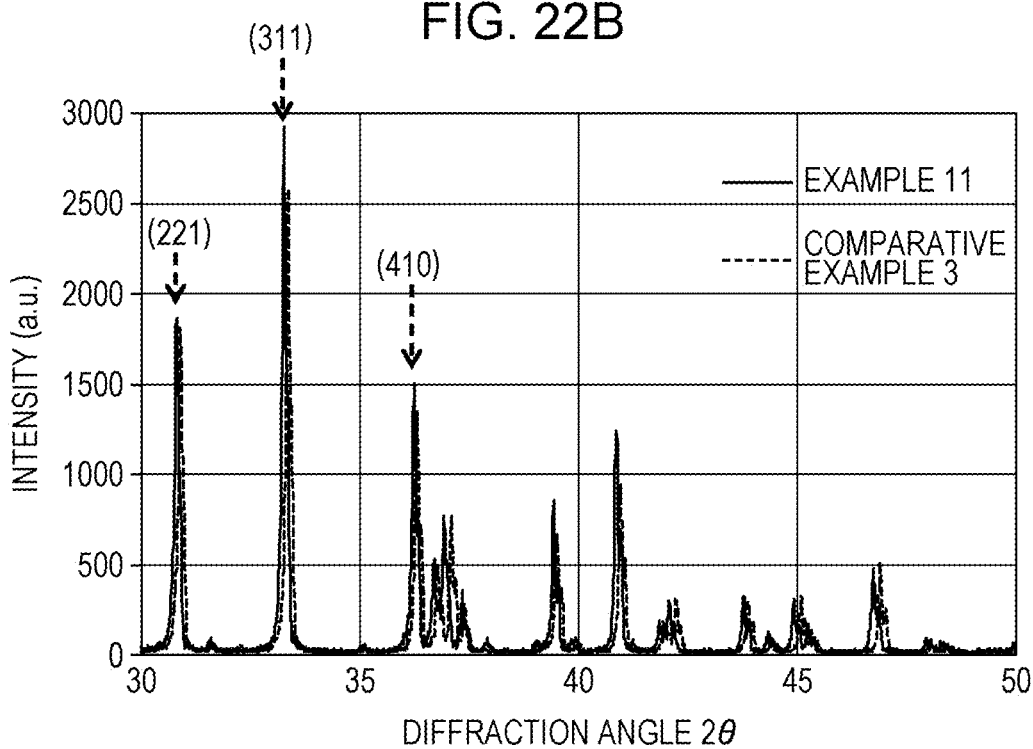
FIG. 22B is a graph of enlarged XRD diffraction patterns of Example 11 and Comparative Example 3.

The X-ray powder diffraction patterns of Example 11 and Comparative Example 3 were measured with an X-ray diffractometer (RINT2100 manufactured by Rigaku). The measurement was performed with Cu-Kα radiation under the conditions listed above in Table 12. FIGS. 22A and 22B show measured X-ray diffraction patterns.

The X-ray diffraction pattern of Example 11 was almost the same as the X-ray diffraction pattern of Comparative Example 3. The X-ray diffraction peaks in Example 11 shift slightly to the low-angle side with respect to the X-ray diffraction peaks in Comparative Example 3.

Among the diffraction peaks, six diffraction peaks corresponding to the $La_3Si_6N_{11}$ crystal type are designated as peaks 1 to 6 from the low angle side. Table 14 lists 2θ of each of the diffraction peaks.

TABLE 14

| | Peak 1 | Peak 2 | Peak 3 | Peak 4 | Peak 5 | Peak 6 |
|---|---|---|---|---|---|---|
| Example 11 | 18.23° | 26.75° | 27.60° | 30.82° | 33.28° | 36.25° |
| Comparative example 3 | 18.30° | 26.84° | 27.66° | 30.91° | 33.37° | 36.32° |

Table 14 shows that the X-ray diffraction patterns of the phosphors had diffraction peaks in the range of (1) 2θ=17.8 to 18.8 degrees, (2) 2θ=26.2 to 27.2 degrees, (3) 2θ=27.2 to 28.2 degrees, (4) 2θ=30.5 to 31.5 degrees, (5) 2θ=32.8 to 33.8 degrees, and (6) 2θ=35.8 to 36.8 degrees, corresponding to the peaks 1 to 6, respectively. The peaks 1 to 6 had Miller indices of (001), (211), (310), (221), (311), and (410), respectively. These results show that the space group of the phosphor of Example 11 is a tetragonal crystal, as in Examples 1 to 10 and Comparative Examples 1 and 3, and has almost the same crystal structure as a crystal represented by the general formula $La_3Si_6N_{11}$.

<Evaluation of Composition>

The composition analysis of Example 11 and Comparative Example 3 was performed by inductively coupled plasma-atomic emission spectrometry (ICP-AES). Pretreatment for measurement will be described below. After alkali fusion with sodium peroxide, the melt was dissolved in hydrochloric acid and was diluted with pure water to determine the Si content. After alkali fusion with lithium tetraborate and sodium carbonate, the melt was dissolved in hydrochloric acid and was diluted with pure water to determine the La, Al, and Ce contents. Table 15 shows the results.

TABLE 15

| | La | Ce | Al | Si |
|---|---|---|---|---|
| Example 11 | 48.5 mass % | 4.00 mass % | 4.89 mass % | 20.5 mass % |
| Comparative example 3 | 50.6 mass % | 4.26 mass % | 0 mass % | 23.1 mass % |

Table 15 shows that Example 11 contained Al.

Table 16 lists the mole fraction of each element when the total Al and Si content is assumed to be 6 mol.

TABLE 16

| | La | Ce | Al | Si |
|---|---|---|---|---|
| Example 11 | 2.30 mol | 0.19 mol | 1.19 mol | 4.81 mol |
| Comparative example 3 | 2.66 mol | 0.22 mol | 0 mol | 6 mol |

Table 16 shows that the total La and Ce content of each sample of Example 11 and Comparative Example 3 is smaller than the stoichiometric composition (3 mol). This is probably because the starting materials LaN and CeN are decomposed during firing. As long as light can be emitted, La and Ce may be less than the stoichiometric composition. For example, the total La and Ce content may be in a range from 2 to 3 mol.

The nitrogen and oxygen contents were then measured. The samples of Example 11 and Comparative Example 3 were melted at 2300° C. in an inert gas. The oxygen content was measured by a non-dispersive infrared absorption method (NDIR). The nitrogen content was measured by a thermal conductivity method (TCD). Table 17 shows the results.

TABLE 17

| | O | N |
|---|---|---|
| Example 11 | 0.5 mass % | 21.4 mass % |
| Comparative example 3 | 1.4 mass % | 20.6 mass % |

Table 17 shows that the sample of Example 11 contained O. As long as light can be emitted, O may be contained. Because it is difficult to simultaneously absolutely quantify anions and cations, the absolute value of each element content in Tables 15 to 17 includes an error. Thus, the composition of a phosphor of the present disclosure is not limited to the absolute value of each element content listed in Tables 15 to 17.

<Evaluation of Local Structure of Ce Ligand>

The local structure of each Ce ligand of Example 11 and Comparative Example 3 was analyzed by X-ray absorption fine structure spectroscopy (XAFS). The XAFS measurement was performed in National Research and Development Agency RIKEN (the Institute of Physical and Chemical Research), SPring 8 beam line 16B2.

Pretreatment for measurement will be described below. 0.16 g of the sample of Example 11 was mixed with 0.01 g of a BN powder in a mortar and was formed into pellets 8 mm in diameter using a mold. Likewise, 0.16 g of the sample of Comparative Example 3 was mixed with 0.01 g of a BN powder in a mortar and was formed into pellets 8 mm in diameter using a mold. An absorption spectrum near the K absorption edge of Ce was measured to determine the local structure of Ce and a ligand around the Ce. Extended X-ray absorption fine structure (EXAFS) oscillations were analyzed using open source EXAFS analysis software Athena to determine the radial distribution function around the Ce atom.

Table 18 lists the analysis parameters.

TABLE 18

| Background removal parameters | |
|---|---|
| E0 | 40463.755 |
| Algorithm | autobk |
| Rbkg | 1.000 |
| k-weight | 2 |
| Normalization order | 3 |
| Pre-edge range | [−150.000:−75.000] |
| Normalization range | [150.000:1400.778] |
| Spline range (k) | [0.000:12.000] |
| Spline range (E) | [0.000:548.638] |
| Edge step | 3.64E−01 |
| Standard | None |
| Lower clamp | None |
| Upper clamp | Strong |
| Forward Fourier transform parameters | |
| k-range | [3.000:17.847] |
| dk | 1.000 |

TABLE 18-continued

| Window | hanning |
|---|---|
| Arb. kw | 0.5 |
| Phase correction | no |
| Backward Fourier transform parameters | |
| R-range | [1.000:3.000] |
| dR | 0.000 |
| Window | hanning |
| Plotting parameters | |
| Plot multiplier | 1.00E+00 |
| y offset | 0.000 |

Figure 23:
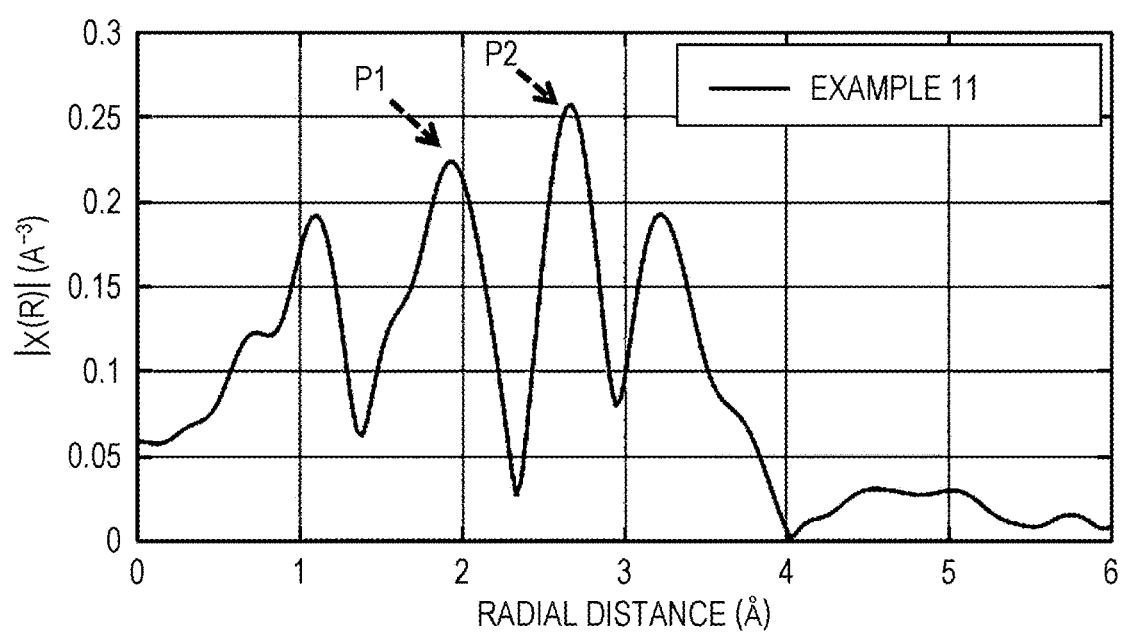
FIG. 23 is a graph of the radial distribution function around a Ce atom in Example 11.
Figure 24:
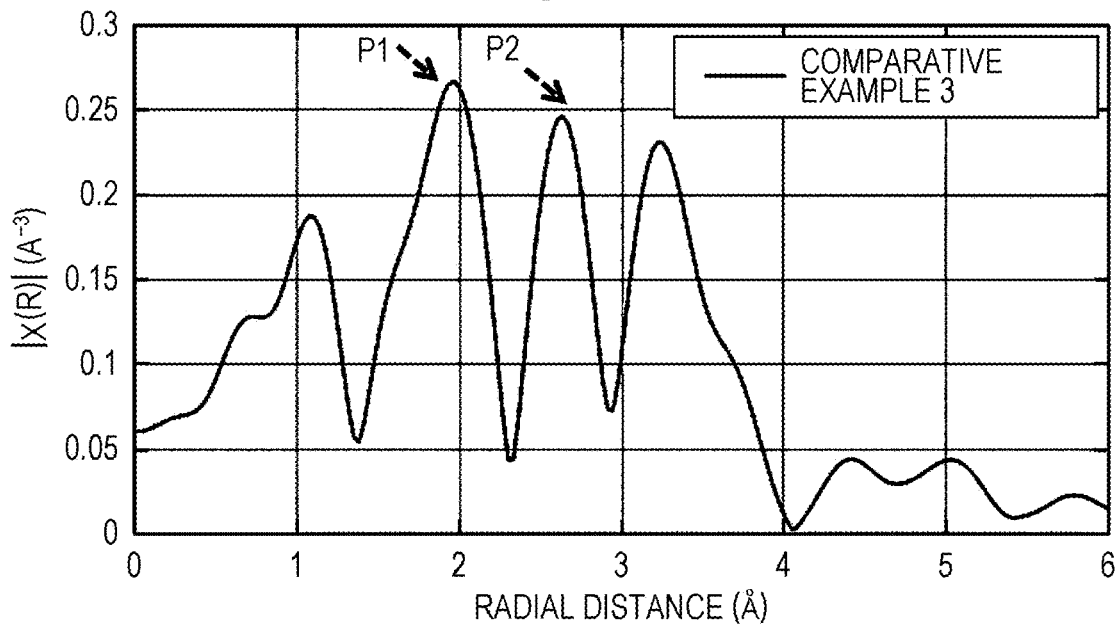
FIG. 24 is a graph of the radial distribution function around a Ce atom in Comparative Example 3.

FIG. 23 is a graph of the radial distribution function of Example 11. FIG. 24 is a graph of the radial distribution function of Comparative Example 3. In general, the horizontal axis (radial distance) of the radial distribution function corresponds to the distance to an adjacent atom. The vertical axis (peak height) represents the coordination number n. In FIGS. 23 and 24, the peak at approximately 1.1 angstroms is a ghost peak due to measurement signal noise. The peak at approximately 1.9 angstroms (P1) is a peak of the first neighbor shell of Ce. The peak at approximately 2.6 angstroms (P2) is a peak of the second neighbor shell of Ce. The peak at approximately 3.3 angstroms is a peak of the third neighbor shell of Ce.

As is clear from FIG. 24, in Comparative Example 3, the peak (P1) height of the first neighbor shell is higher than the peak (P2) height of the second neighbor shell. As is clear from FIG. 23, in Example 11, the peak (P1) height of the first neighbor shell is lower than the peak (P2) height of the second neighbor shell (approximately 0.84 times). The P2 height in Example 11 is almost the same as the P2 height in Comparative Example 3. On the other hand, the P1 height in Example 11 is obviously lower than the P1 height in Comparative Example 3.

These results show that the coordination number of the first neighbor shell of Ce in Example 11 is smaller than the coordination number of the first neighbor shell of Ce in Comparative Example 3.

The radial distribution functions in FIGS. 23 and 24 were analyzed with respect to the coordination atoms using open source EXAFS analysis software Artemis. It was found that both the Ce atom in Example 11 and the Ce atom in Comparative Example 3 are substituted for La at an A site of the crystal structure. It was also found that eight nitrogen atoms are coordinated to the first neighbor shell of Ce in Comparative Example 3, but only seven nitrogen atoms are coordinated to the first neighbor shell of Ce in Example 11.

These results show that the coordination structure around Ce in Comparative Example 3 includes coordination of eight nitrogen atoms as in an A site of La in $La_3Si_6N_{11}$ and has relatively high symmetry. It was also found that the coordination structure around Ce in Example 11 has a nitrogen defect around an A site of La in $La_3Si_6N_{11}$ and is a coordination structure of seven coordination with low symmetry.

Thus, in Example 11, low symmetry of the coordination structure around Ce, for example, due to a Frenkel defect probably resulted in large splitting of the 5d orbital and a decreased energy difference from the 4f orbital. This increased the emission wavelength and provided a Ce phosphor that can emit red light.

The phosphors of Examples 1 to 11 had almost the same crystal structure as a crystal represented by the general formula $La_3Si_6N_{11}$ but emitted red light with a longer wavelength than light emitted from known LSN:Ce yellow phosphors. Although the reason for this is not clear, for example, the following is a possible reason. The phosphors of Examples 1 to 11 might have emitted red light, unlike known phosphors, due to Al (for example, an AlN powder) contained in the raw materials. The phosphors of Examples 1 to 11 might have emitted red light, for example, because the phosphors have a crystal structure including substitution of Ce for part of the A sites of La in the $La_3Si_6N_{11}$ crystal, substitution of Al for part of Si around Ce (or substitution of Al—O for part of Si—N), and a loss of part of N.

<Projector>

Next, the projector of the first embodiment will be described below. As described above, the projector of the first embodiment includes the light source unit, the spatial light modulator that controls light from the light source unit for each pixel to form an optical image, and the projection optical system that projects the optical image formed by the spatial light modulator onto a target screen. The light source unit includes a solid-state light source and a wavelength convertor, which converts the wavelength of output light emitted from the solid-state light source.

The solid-state light source emits at least blue light and green light. The blue light has a peak wavelength in the range of 430 to 470 nm. The green light has a peak wavelength in the range of 480 to 550 nm, desirably 510 to 540 nm.

The solid-state light source is a LED or LD, for example. The solid-state light source may be a GaN LED or LD, desirably a GaN LD. The solid-state light source may include a GaN semiconductor laser that emits blue light and a YAG:Nd solid-state laser that emits green light and that includes a second harmonic generator.

The solid-state light source may include a blue laser that emits blue light and a green laser that emits green light. In this case, the projector of the present embodiment may further include a dichroic mirror by which blue light and green light are coaxially multiplexed to be incident on the wavelength convertor. The term "coaxially multiplex", as used herein, refers to mixing of light beams such that the light beams have the same central axis.

The wavelength convertor contains at least a red phosphor including Ce as a luminescent center. The red phosphor including the Ce luminescent center has been described in detail above.

The wavelength convertor may include a first phosphor layer containing at least a red phosphor including Ce as a luminescent center and a second phosphor layer containing at least one selected from a yellow phosphor and a yellow-green phosphor. The first phosphor layer may be closer to the light incident surface than the second phosphor layer. A phosphor in the second phosphor layer is a phosphor containing a crystal phase having the chemical composition $Y_3Al_5O_{12}$:Ce (YAG:Ce) or a phosphor containing a crystal phase having the chemical composition $La_3Si_6N_{11}$:Ce (LSN:Ce), for example.

The wavelength convertor may be a rotating wheel that includes a region in which at least a red phosphor including Ce as a luminescent center is disposed. The rotation of the rotating wheel can be controlled. The rotating wheel can be rotated by a motor, for example. The motor may be controlled with a control signal generator 403 described later.

As described above, the projector of the present embodiment includes the solid-state light source that emits blue light and green light and the red phosphor including the Ce luminescent center, unlike known projectors. The red phosphor including the Ce luminescent center is less likely to reach luminance saturation even when excited by strong excitation light. Thus, the red phosphor in the present embodiment can be excited even by a laser beam with a high energy density. Thus, the projector of the present embodiment can include a light source that emits light with a high light power density, such as a LD device, as a solid-state light source. Consequently, the present embodiment can provide a compact high-power projector. The projector of the present embodiment produces red light by using the red phosphor including the Ce luminescent center. Red light thus generated can produce sufficiently high power compared with red light generated by using a red phosphor including Eu as a luminescent center or red light generated, for example, by removing a green component from yellow light through a filter. Thus, the projector of the present embodiment can produce not only blue light and green light but also sufficiently high-power red light.

The red phosphor including the Ce luminescent center in the wavelength convertor in the present embodiment may have a 1/e emission lifetime of 100 ns or less. The emission lifetime has an influence on the luminance saturation characteristics. Phosphors containing Eu, such as a known red phosphor CASN:Eu, have a longer emission lifetime than phosphors containing Ce. Thus, phosphors containing Eu are likely to reach luminance saturation due to a decrease in quantum efficiency during high-energy excitation. Thus, the red phosphor including the Ce luminescent center is expected to be a red phosphor with higher quantum efficiency than known red phosphors even at high power. Each of all phosphors in the wavelength convertor in the present embodiment may have a 1/e emission lifetime of 100 ns or less. In this case, the wavelength convertor does not contain a phosphor that has decreased emission quantum efficiency when excited by high-power light and therefore can further increase the power of the projector of the present embodiment.

With such a structure, the projector of the present embodiment can produce higher power than known systems.

Second Embodiment

A second embodiment describes as an example of a projector of the present disclosure a projector that includes a LD that emits blue light and a LD that emits green light.

Figure 25:
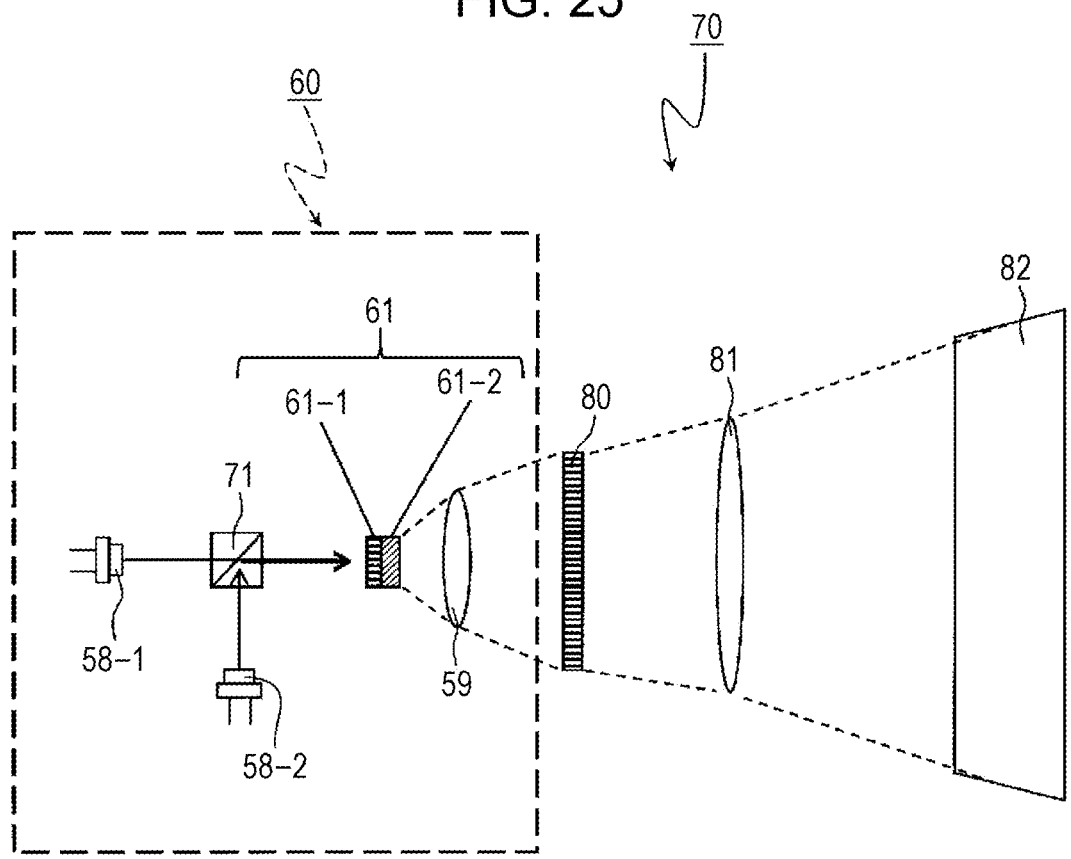
FIG. 25 is a schematic view of a projector according to a second embodiment.

FIG. 25 is a schematic view of a projector 70 according to the second embodiment.

The projector 70 of the present embodiment includes a projector light source 60 as an example of a light source unit, a spatial light modulator 80, and a projection lens 81 as a projection optical system.

The projector light source 60 includes a LD device 58-1 and a LD device 58-2 as examples of a solid-state light source, a dichroic mirror 71, a wavelength conversion member 61 as an example of a wavelength convertor, and a lens 59 as an incident optical system.

The LD device 58-1 is a LD that emits blue light. The LD device 58-2 is a LD that emits green light The LD device 58-1 emits light in a blue region and has an emission spectrum peak in the wavelength range of 430 to 470 nm. More specifically, the LD device 58-1 is a LD device that emits blue light. The LD device 58-1 may be a GaN semiconductor laser, that is, a GaN LD. The LD device 58-2 emits light in a green region and has an emission spectrum peak in the wavelength range of 480 to 550 nm, desirably 510 to 540 nm. More specifically, the LD device 58-2 is a LD device that emits green light. The LD device 58-2 may be a GaN semiconductor laser, that is, a GaN LD. The LD device 58-2 may also be a YAG:Nd solid-state laser with a second harmonic generator.

Blue light emitted from the LD device 58-1 and green light emitted from the LD device 58-2 are coaxially multiplexed by the dichroic mirror 71 and are incident on the wavelength conversion member 61. Thus, the dichroic mirror 71 is disposed on the optical path between the LD devices 58-1 and 58-2 and the wavelength conversion member 61 (on the common optical path of blue light and green light).

The wavelength conversion member 61 has a layered structure composed of a first phosphor layer 61-1 containing a red phosphor including Ce as a luminescent center and a second phosphor layer 61-2 containing a yellow-green phosphor. In the wavelength conversion member 61 in the present embodiment, the first phosphor layer 61-1 is disposed on the light incident side. The red phosphor including the Ce luminescent center is described in the first embodiment and is not described in detail here. For example, the yellow-green phosphor can be a phosphor including Ce as a luminescent center, such as YAG:Ce. The red phosphor in the first phosphor layer 61-1 is excited by green light and emits red light. The yellow-green phosphor in the second phosphor layer 61-2 is excited by blue light and emits yellow-green light. Thus, these phosphors convert output light emitted from the LD device 58-1 and the LD device 58-2 to light with a longer wavelength.

Next, the operation of the projector light source 60 in the projector 70 of the present embodiment will be described below. Blue light emitted from the LD device 58-1 and green light emitted from the LD device 58-2 are coaxially multiplexed by the dichroic mirror 71 and are incident on the first phosphor layer 61-1 of the wavelength conversion member 61. Green light in the incident light excites the red phosphor in the first phosphor layer 61-1, and the first phosphor layer 61-1 emits red light. Light passing through the first phosphor layer 61-1 without absorption and red light emitted from the first phosphor layer 61-1 are incident on the second phosphor layer 61-2. Blue light in the incident light excites the yellow-green phosphor in the second phosphor layer 61-2, and the second phosphor layer 61-2 emits yellow-green light. Red light emitted from the first phosphor layer 61-1, yellow-green light emitted from the second phosphor layer 61-2, and blue light and green light not absorbed by the first phosphor layer 61-1 and the second phosphor layer 61-2 are emitted outward through the lens 59 as output light from the projector light source 60. These light beams emitted outward are mixed to produce white light. Thus, white light emitted from the projector light source 60 is incident on the spatial light modulator 80.

The projector light source 60 of the present embodiment can include a LD device as a solid-state light source. In the projector light source 60, the red phosphor in the wavelength conversion member 61 is a phosphor including Ce as a luminescent center and is less likely to reach luminance saturation even when excited by strong excitation light. Unlike known red phosphors including Eu as a luminescent center, therefore, the red phosphor in the present embodiment can be excited by a laser beam with a high energy density. Thus, the projector 70 of the present embodiment can include as a solid-state light source a LD device that emits light with a higher light power density than LEDs. Consequently, the projector light source 60 of the present embodiment can be compact and produce high power.

The spatial light modulator 80 in the present embodiment is composed of a liquid crystal panel including a color filter for each of red (R), green (G), and blue (B) pixels. The spatial light modulator 80 can modulate white light emitted from the projector light source 60 according to the pixel information of each of the RGB colors of an image signal to project an image on a screen 82 through the projection lens 81. The projection lens 81 is an objective lens, for example.

As described above, the projector light source 60 can emit high-power white light. Thus, the projector 70 of the present embodiment including the light source 60 can produce higher power.

Third Embodiment

A third embodiment describes as an example of a projector of the present disclosure a projector that includes a LD that emits blue light, a LD that emits green light, and a transmission-type rotating wheel including a wavelength convertor.

Figure 26:
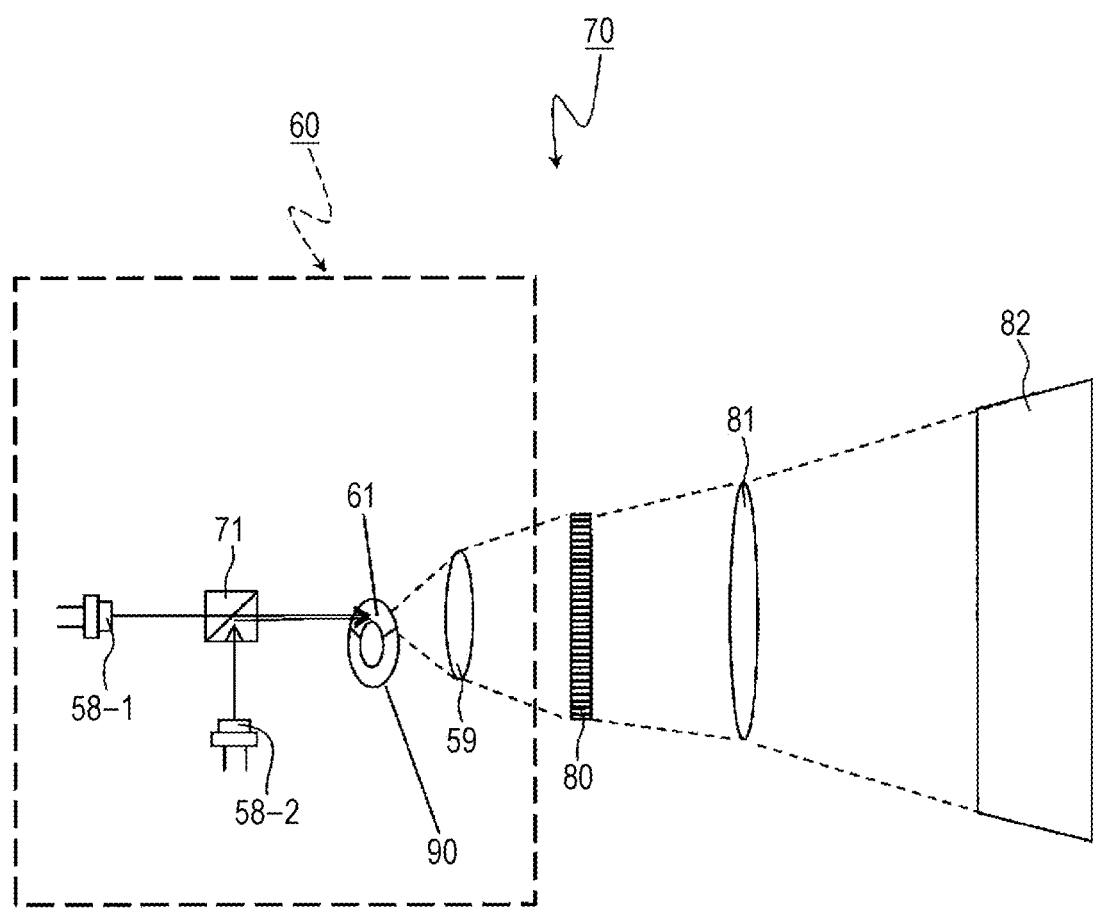
FIG. 26 is a schematic view of a projector according to a third embodiment.

FIG. 26 is a schematic view of a projector 70 according to the third embodiment.

The projector 70 of the present embodiment includes a projector light source 60, a spatial light modulator 80, and a projection lens 81 as a projection optical system.

The projector light source 60 includes the LD device 58-1 and the LD device 58-2, the dichroic mirror 71, and a transmission-type rotating wheel 90 including the wavelength conversion member 61. The projector light source 60 may further include the lens 59 between the wavelength conversion member 61 and the spatial light modulator 80.

The LD device 58-1 is a LD that emits blue light. The LD device 58-2 is a LD that emits green light The LD device 58-1 has an emission spectrum with a peak in the wavelength range of 430 to 470 nm. The LD device 58-1 may be a GaN semiconductor laser (GaN LD). The LD device 58-2 has an emission spectrum with a peak in the wavelength range of 480 to 550 nm, desirably 510 to 540 nm. The LD device 58-2 may be a GaN semiconductor laser (GaN LD). The LD device 58-2 may also be a YAG:Nd solid-state laser with a second harmonic generator.

Blue light emitted from the LD device 58-1 and green light emitted from the LD device 58-2 are coaxially multiplexed by the dichroic mirror 71 and are incident on the transmission-type rotating wheel 90 including the wavelength conversion member 61. Thus, the dichroic mirror 71 is disposed on the optical path between the LD devices 58-1 and 58-2 and the transmission-type rotating wheel 90 (on the common optical path of blue light and green light).

Figure 27:
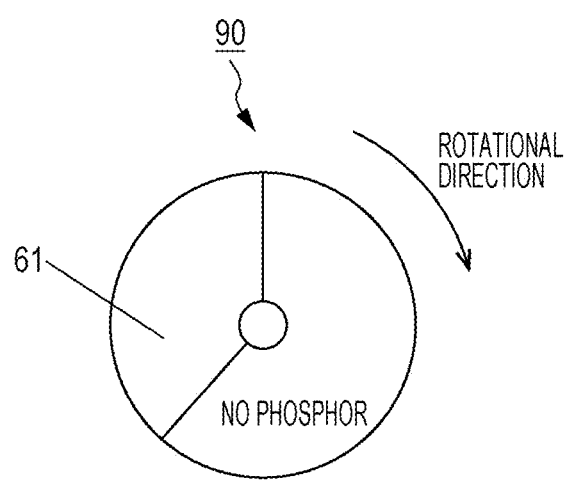
FIG. 27 is a schematic view of an example of a rotating wheel in the projector according to the third embodiment.

The wavelength conversion member 61 contains a red phosphor including Ce as a luminescent center. The red phosphor including the Ce luminescent center is described in the first embodiment and is not described in detail here. FIG. 27 is a schematic view of the transmission-type rotating wheel 90. The transmission-type rotating wheel 90 includes a transmission region and a red phosphor region including the wavelength conversion member 61. The wavelength conversion member 61 is only disposed in a region corresponding to approximately one third of the circumference of the transmission-type rotating wheel 90. More specifically, the wavelength conversion member 61 is disposed on a sector with an arc of approximately one third (120 degrees) of the circumferential angle 360 degrees of the rotating wheel 90 except the central portion of the circle. The region of the rotating wheel 90 other than the region of the wavelength conversion member 61 contains no phosphor. The transmission region transmits light emitted from the LD device 58-1 and the LD device 58-2 (that is, blue light and green light). The transmission region may be an opening or glass or a resin.

Figure 28:
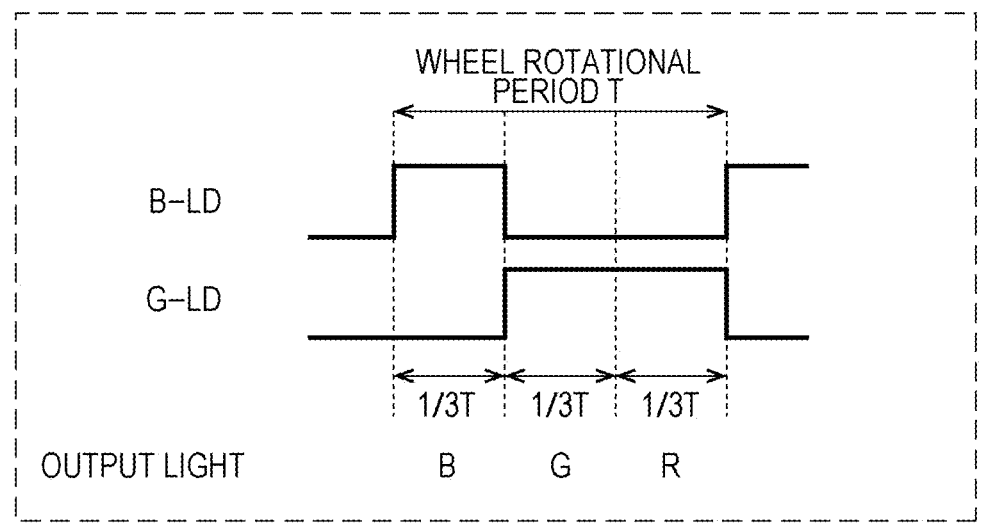
FIG. 28 is a drive pulse timing chart for illustrating an example of a method for driving the projector according to the third embodiment.

FIG. 28 illustrates an example of a control method for controlling the color tone of output light of the projector light source 60. The control is performed by pulse control units 401 and 402 and a control signal generator 403 described later. The drive pulses of the LD device 58-1 that emits blue light and the LD device 58-2 that emits green light are synchronized with the rotational period T of the transmission-type rotating wheel 90. More specifically, for example, in the initial ⅓T period, only the LD device that emits blue light (B-LD) 58-1 is driven to transmit only blue light through the transmission-type rotating wheel 90, thereby displaying the image information of the B pixel. In the following ⅓T period, only the LD device that emits green light (G-LD) 58-2 is driven to transmit only green light through the transmission-type rotating wheel 90, thereby displaying the image information of the G pixel. In the final ⅓T period, only the LD device that emits green light (G-LD) 58-2 is driven to allow green light to be incident on the wavelength conversion member 61. The red phosphor in the wavelength conversion member 61 is excited by the green light and emits red light. Thus, the wavelength conversion member 61 emits red light. The red light displays the image information of the R pixel.

With such a structure, the projector light source 60 emits blue light, green light, and red light in a time-divided manner. A blue reflecting/green-red transmitting dichroic mirror and the LD device 58-1 may be disposed behind the transmission-type rotating wheel 90. Two lenses 59 may be disposed just behind the LD devices 58-1 and 58-2. In this case, the LD device 58-2 is disposed such that green light passing through the lens 59 is incident on the transmission-type rotating wheel 90. Green light passing through the transmission-type rotating wheel 90 and red light from the wavelength conversion member 61 are incident on the spatial light modulator 80 through the blue reflecting/green-red transmitting dichroic mirror. Since the LD device 58-1 is disposed behind the transmission-type rotating wheel 90, blue light does not pass through the transmission-type rotating wheel 90. Blue light emitted from the LD device 58-1 passes through the lens 59, is reflected by the blue reflecting/green-red transmitting dichroic mirror, and is incident on the spatial light modulator 80.

The spatial light modulator 80 in the present embodiment is composed of a liquid crystal panel or a digital mirror device (DMD) that adjusts the amount of transmitted light for each pixel. The spatial light modulator 80 can modulate RGB light emitted from the projector light source 60 according to the pixel information of each of RGB of an image signal to form an optical image and can project the optical image on the screen 82.

With such a structure, the high-power projector 70 including a LD device as a solid-state light source can be provided. The projector 70 of the present embodiment can project red light using a red phosphor including Ce as a luminescent center without luminance saturation of the red phosphor by strong excitation light emitted from a LD device. Thus, the projector 70 of the present embodiment can be utilized as a low-heat-generating compact efficient high-power projector for use in projection mapping.

Although the red phosphor region including the wavelength conversion member 61 corresponds to approximately one third of the circumference of the transmission-type rotating wheel 90 in the present embodiment, the present disclosure is not limited to this embodiment. Depending on the color tone of a display image, the red phosphor region may be a region corresponding to at least one third or less than one third of the circumference of the transmission-type rotating wheel 90.

Although the period for which each of three RGB colors is displayed is equally ⅓T in the driving method of the present embodiment, the present disclosure is not limited to this embodiment. The period may be ⅓T or more or less than ⅓T depending on the area of the wavelength conversion member 61 of the transmission-type rotating wheel 90.

Although the LD devices are driven at a constant drive current throughout the period ⅓T for which each of three RGB colors is displayed in the driving method of the present embodiment, the present disclosure is not limited to this embodiment. Depending on the color tone of a display image, the drive currents of the LD device 58-1 that emits blue light and the LD device 58-2 that emits green light may be changed.

Although the LD devices are driven at a constant voltage pulse throughout the period ⅓T for which each of three RGB colors is displayed in the driving method of the present embodiment, the present disclosure is not limited to this embodiment. The LD devices may be driven at different pulse voltages for the period for which each of RGB is displayed, and the drive pulse of each of RGB may be controlled by PWM according to the color tone of a display image.

Fourth Embodiment

A fourth embodiment describes as an example of a projector of the present disclosure a projector that includes a LD that emits blue light, a LD that emits green light, and a reflection-type rotating wheel including a wavelength convertor. The projector of the present embodiment has the same structure as the projector 70 of the third embodiment except the projector light source 60. Thus, only the projector light source 60 will be described in detail below.

Figure 29:
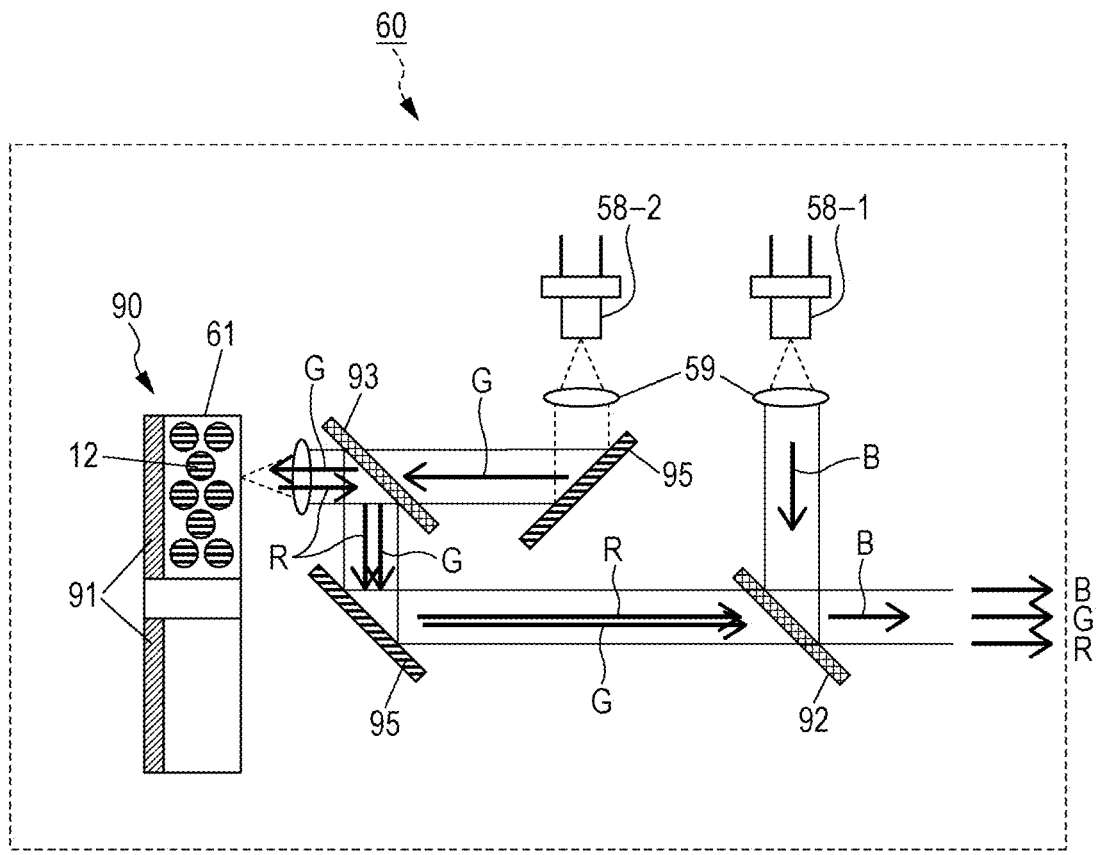
FIG. 29 is a schematic view of a projector according to a fourth embodiment.

FIG. 29 is a schematic view of the projector light source 60 in the present embodiment. In the figure, B denotes blue light, G denotes green light, and R denotes red light.

The projector light source 60 includes the LD device 58-1 and the LD device 58-2, the lens 59 as an incident optical system, the reflection-type rotating wheel 90 including the wavelength conversion member 61, a blue reflecting/green-red transmitting dichroic mirror 92, a half-mirror 93, and a mirror 95.

The LD device 58-1 is a LD that emits blue light. The LD device 58-2 is a LD that emits green light The LD device 58-1 emits light in a blue region and has an emission spectrum peak in the wavelength range of 430 to 470 nm. More specifically, the LD device 58-1 is a LD device that emits blue light. The LD device 58-1 may be a GaN semiconductor laser, that is, a GaN LD. The LD device 58-2 emits light in a green region and has an emission spectrum peak in the wavelength range of 480 to 550 nm, desirably 510 to 540 nm. More specifically, the LD device 58-2 is a LD device that emits green light. The LD device 58-2 may be a GaN semiconductor laser, that is, a GaN LD. The LD device 58-2 may also be a YAG:Nd solid-state laser with a second harmonic generator.

Figure 30:
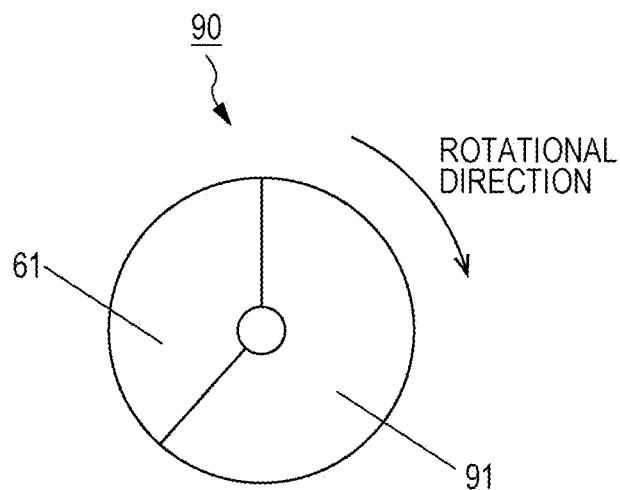
FIG. 30 is a schematic view of an example of a rotating wheel of the projector according to the fourth embodiment.

The wavelength conversion member 61 contains the red phosphor 12 including the Ce luminescent center. The red phosphor including the Ce luminescent center is described in the first embodiment and is not described in detail here. As described above, the wavelength conversion member 61 is disposed in the reflection-type rotating wheel 90. The wavelength conversion member 61 has a first surface on which green light as excitation light is incident and a second surface opposite the first surface. The reflection-type rotating wheel 90 includes a reflective layer 91. The reflective layer 91 includes a first region on the second surface side of the wavelength conversion member 61 and a second region different from the first region. FIG. 30 is a schematic view of the reflection-type rotating wheel 90. The wavelength conversion member 61 is only disposed in a region corresponding to approximately one third of the circumference of the reflection-type rotating wheel 90. More specifically, the wavelength conversion member 61 is disposed on a sector with an arc of approximately one third (120 degrees) of the circumferential angle 360 degrees of the rotating wheel 90 except the central portion of the circle. The region of the rotating wheel 90 other than the region of the wavelength conversion member 61 contains no phosphor. When red light from the wavelength conversion member 61 is incident on the first region of the reflective layer 91, the first region reflects the red light. The red light reflected from the first region and passing through the wavelength conversion member 61 is emitted from the first surface. When green light is incident on the second region of the reflective layer 91, the second region reflects the green light. The reflective surface of the second region may include a transparent layer, such as glass or a resin.

Figure 31:
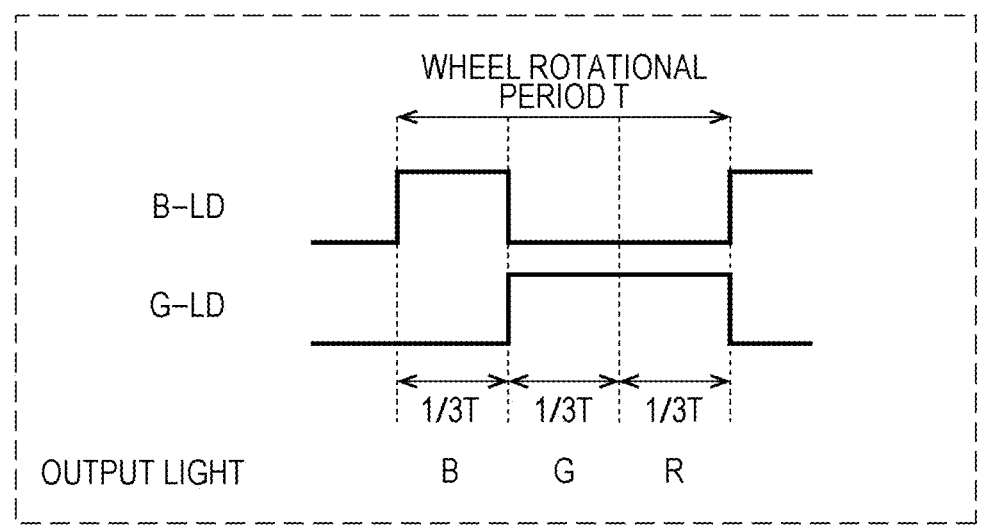
FIG. 31 is a drive pulse timing chart for illustrating an example of a method for driving the projector according to the fourth embodiment.

FIG. 31 illustrates an example of a control method for controlling the color tone of output light of the projector light source 60. The control is performed by the pulse control units 401 and 402 and the control signal generator 403 described later. The drive pulses of the LD device 58-1 that emits blue light and the LD device 58-2 that emits green light are synchronized with the rotational period T of the reflection-type rotating wheel 90. More specifically, for example, in the initial ⅓T period, only the LD device that emits blue light (B-LD) 58-1 is driven to reflect blue light emitted from the LD device 58-1 by the blue reflecting/green-red transmitting dichroic mirror 92 and to emit the blue light from the projector light source 60, thereby displaying the image information of the B pixel. In the following ⅓T period, only the LD device that emits green light (G-LD) 58-2 is driven to reflect green light emitted from the LD device 58-2 by the second region of the reflection-type rotating wheel 90 in which the wavelength conversion member 61 is not disposed, thereby displaying the image information of the G pixel. In the final ⅓T period, only the LD device that emits green light (G-LD) 58-2 is driven to allow green light to be incident on the wavelength conversion member 61. The red phosphor 12 in the wavelength conversion member 61 is excited by the green light and emits red light. Thus, the wavelength conversion member 61 emits red light. The red light displays the image information of the R pixel.

With such a structure, the high-power projector 70 including a LD device as a solid-state light source can be provided. The projector of the present embodiment can project red light using a red phosphor including Ce as a luminescent center without luminance saturation of the red phosphor by strong excitation light emitted from a LD device. Thus, the projector of the present embodiment can be utilized as a low-heat-generating compact efficient high-power projector for use in projection mapping.

Although the red phosphor region including the wavelength conversion member 61 corresponds to approximately one third of the circumference of the reflection-type rotating wheel 90 in the present embodiment, the present disclosure is not limited to this embodiment. Depending on the color tone of a display image, the red phosphor region may be a region corresponding to at least one third or less than one third of the circumference of the reflection-type rotating wheel 90.

Although the period for which each of three RGB colors is displayed is equally ⅓T in the driving method of the present embodiment, the present disclosure is not limited to this embodiment. The period may be ⅓T or more or less than ⅓T depending on the area of the wavelength conversion member 61 of the reflection-type rotating wheel 90.

Although the LD devices are driven at a constant drive current throughout the period ⅓T for which each of three RGB colors is displayed in the driving method of the present embodiment, the present disclosure is not limited to this embodiment. Depending on the color tone of a display image, the drive currents of the LD device 58-1 that emits blue light and the LD device 58-2 that emits green light may be changed.

Although the LD devices are driven at a constant voltage pulse throughout the period ⅓T for which each of three RGB colors is displayed in the driving method of the present embodiment, the present disclosure is not limited to this embodiment. The LD devices may be driven at different pulse voltages for the period for which each of RGB is displayed, and the drive pulse of each of RGB may be controlled by PWM according to the color tone of a display image.

Fifth Embodiment

A fifth embodiment describes as an example of a projector of the present disclosure a projector that includes a LD that emits blue light, a LD that emits green light, and a reflection-type rotating wheel including a wavelength convertor. The projector of the present embodiment has the same structure as the projector 70 of the third embodiment except the projector light source 60. Thus, only the projector light source 60 will be described in detail below.

Figure 32:
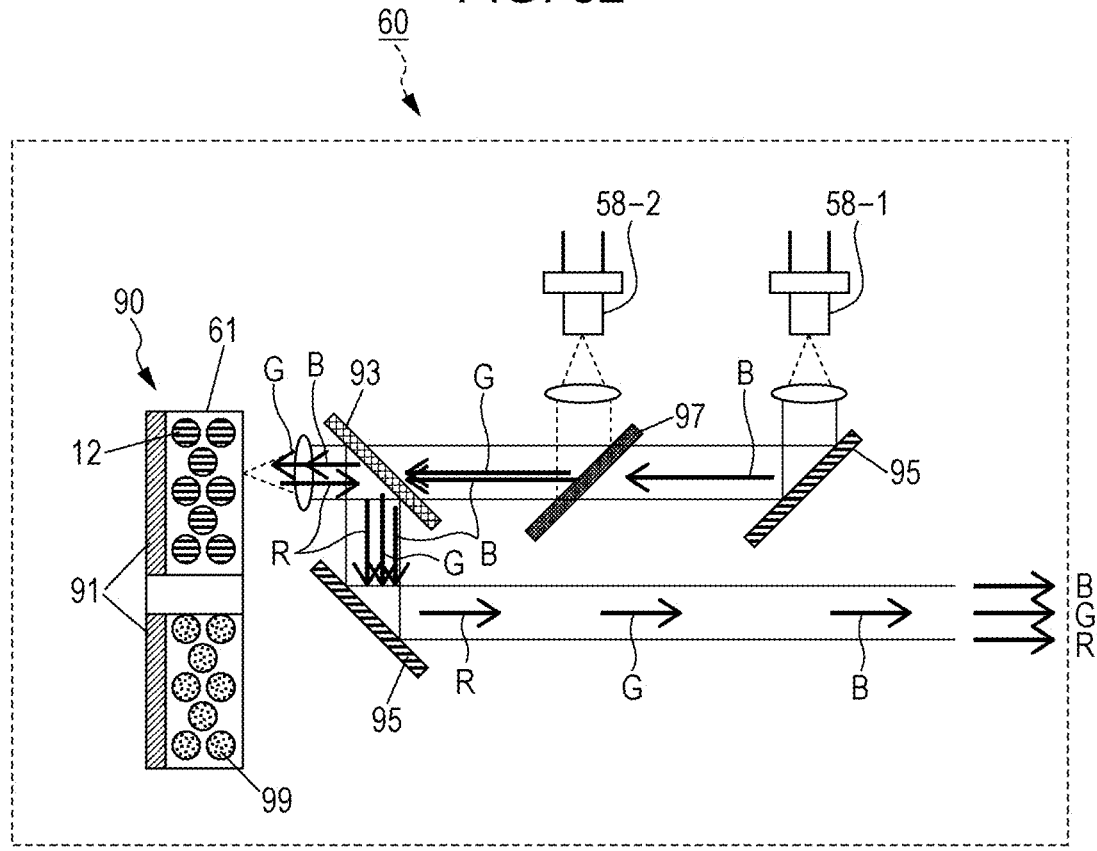
FIG. 32 is a schematic view of a projector according to a fifth embodiment.

FIG. 32 is a schematic view of the projector light source 60 in the present embodiment. In the figure, B denotes blue light, G denotes green light, and R denotes red light.

The projector light source 60 includes the LD device 58-1 and the LD device 58-2, the lens 59 as an incident optical system, the reflection-type rotating wheel 90 including the wavelength conversion member 61, a green reflecting/blue transmitting dichroic mirror 97, the half-mirror 93, and the mirror 95.

The LD device 58-1 is a LD that emits blue light. The LD device 58-2 is a LD that emits green light The LD device 58-1 emits light in a blue region and has an emission spectrum peak in the wavelength range of 430 to 470 nm. More specifically, the LD device 58-1 is a LD device that emits blue light. The LD device 58-1 may be a GaN semiconductor laser, that is, a GaN LD. The LD device 58-2 emits light in a green region and has an emission spectrum peak in the wavelength range of 480 to 550 nm. More specifically, the LD device 58-2 is a LD device that emits green light. The LD device 58-2 may be a GaN semiconductor laser, that is, a GaN LD. The LD device 58-2 may also be a YAG:Nd solid-state laser with a second harmonic generator.

Figure 33:
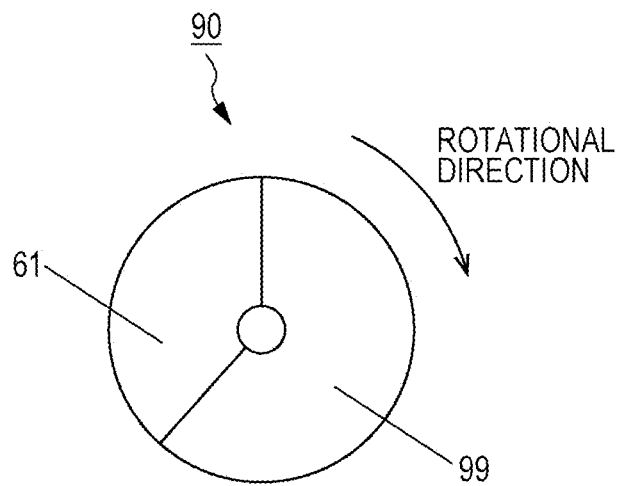
FIG. 33 is a schematic view of an example of a rotating wheel of the projector according to the fifth embodiment.

The wavelength conversion member 61 contains the red phosphor 12 including the Ce luminescent center. The red phosphor including the Ce luminescent center is described in the first embodiment and is not described in detail here. As described above, the wavelength conversion member 61 is disposed in the reflection-type rotating wheel 90. The wavelength conversion member 61 has a first surface on which green light as excitation light is incident and a second surface opposite the first surface. The reflection-type rotating wheel 90 includes a reflective layer 91. The reflective layer 91 includes a first region on the second surface side of the wavelength conversion member 61 and a second region different from the first region. FIG. 33 is a schematic view of the reflection-type rotating wheel 90. The wavelength conversion member 61 is only disposed in a region corresponding to approximately one third of the circumference of the transmission-type rotating wheel 90. More specifically, the wavelength conversion member 61 is disposed on a sector with an arc of approximately one third (120 degrees) of the circumferential angle 360 degrees of the rotating wheel 90 except the central portion of the circle. The rotating wheel 90 further includes a scattering region containing a scatterer 99. The scattering region contains no phosphor. The scattering region has a third surface on which green light and blue light are incident and a fourth surface opposite the third surface. The second region of the reflective layer 91 is disposed on the fourth surface side of the scattering region. When blue light passing through the scattering region is incident on the second region of the reflective layer 91, the second region reflects the blue light. When green light passing through the scattering region is incident on the second region of the reflective layer 91, the second region reflects the green light. Blue light and green light reflected from the second region and passing through the scattering region are emitted from the third surface of the scattering region.

Figure 34:
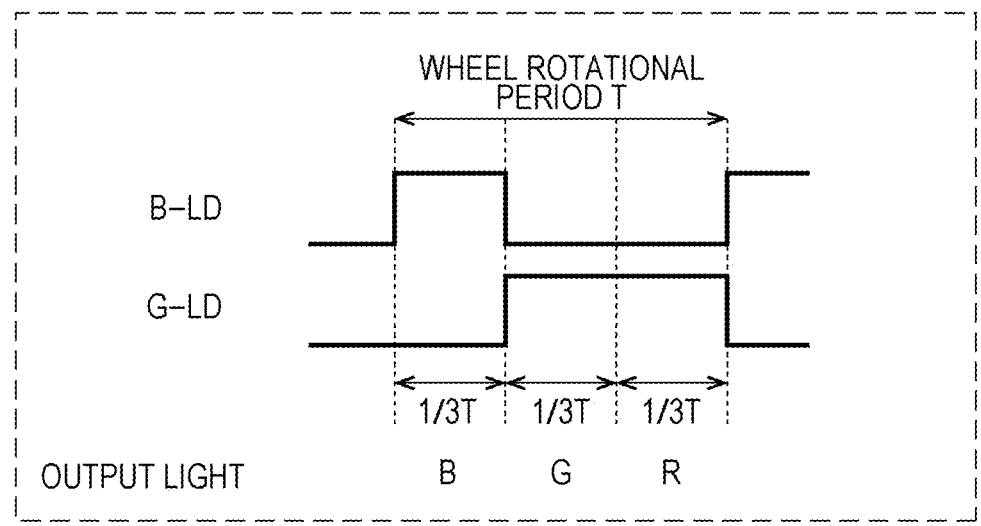
FIG. 34 is a drive pulse timing chart for illustrating an example of a method for driving the projector according to the fifth embodiment.

FIG. 34 illustrates an example of a control method for controlling the color tone of output light of the projector light source 60. The control is performed by the pulse control units 401 and 402 and the control signal generator 403 described later. The drive pulses of the LD device 58-1 that emits blue light and the LD device 58-2 that emits green light are synchronized with the rotational period T of the reflection-type rotating wheel. More specifically, in the initial ⅓T period, only the LD device that emits blue light (B-LD) 58-1 is driven. Blue light emitted from the LD device 58-1 is reflected by the mirror 95, passes through the green reflecting/blue transmitting dichroic mirror 97, and is incident on the scattering region of the reflection-type rotating wheel 90 through the half-mirror 93. The blue light incident on the scattering region of the reflection-type rotating wheel 90 is scattered in the scattering region, is reflected by the reflective layer 91, is emitted from the reflection-type rotating wheel 90, and is then emitted from the projector light source 60 through the half-mirror 93 and the mirror 95. Blue light emitted from the projector light source 60 displays the image information of the B pixel. In the following ⅓T period, only the LD device that emits green light (G-LD) 58-2 is driven. Green light emitted from the LD device 58-2 is reflected by the green reflecting/blue transmitting dichroic mirror 97 and is incident on the scattering region of the reflection-type rotating wheel 90 through the half-mirror 93. The green light incident on the scattering region of the reflection-type rotating wheel 90 is scattered in the scattering region, is reflected by the reflective layer 91, is emitted from the reflection-type rotating wheel 90, and is then emitted from the projector light source 60 through the half-mirror 93 and the mirror 95. Green light emitted from the projector light source 60 displays the image information of the G pixel. In the final ⅓T period, only the LD device that emits green light (G-LD) 58-2 is driven, and green light emitted from the LD device 58-2 is incident on the wavelength conversion member 61 through the half-mirror 93. The red phosphor in the wavelength conversion member 61 is excited by the green light and emits red light. Thus, the wavelength conversion member 61 emits red light. The red light is emitted from the projector light source 60 through the half-mirror 93 and the mirror 95. The red light displays the image information of the R pixel.

With such a structure, a high-power projector including a LD device as a solid-state light source can be provided. The projector of the present embodiment can project red light using a red phosphor including Ce as a luminescent center without luminance saturation of the red phosphor by strong excitation light emitted from a LD device. Thus, the projector of the present embodiment can be utilized as a low-heat-generating compact efficient high-power projector for use in projection mapping. Furthermore, the projector of the present embodiment can output blue light and green light as incoherent light through the scattering region containing the scatterer 99 and can be used as an eye-safe high-power projector.

Although the red phosphor region including the wavelength conversion member 61 corresponds to approximately one third of the circumference of the reflection-type rotating wheel 90 in the present embodiment, the present disclosure is not limited to this embodiment. Depending on the color tone of a display image, the red phosphor region may be a region corresponding to at least one third or less than one third of the circumference of the reflection-type rotating wheel 90.

Although the period for which each of three RGB colors is displayed is equally ⅓T in the driving method of the present embodiment, the present disclosure is not limited to this embodiment. The period may be ⅓T or more or less than ⅓T depending on the area of the wavelength conversion member 61 of the reflection-type rotating wheel 90.

Although the LD devices are driven at a constant drive current throughout the period ⅓T for which each of three RGB colors is displayed in the driving method of the present embodiment, the present disclosure is not limited to this embodiment. Depending on the color tone of a display image, the drive currents of the LD device 58-1 that emits blue light and the LD device 58-2 that emits green light may be changed.

Although the LD devices are driven at a constant voltage pulse throughout the period ⅓T for which each of three RGB colors is displayed in the driving method of the present embodiment, the present disclosure is not limited to this embodiment. The LD devices may be driven at different pulse voltages for the period for which each of RGB is displayed, and the drive pulse of each of RGB may be controlled by PWM according to the color tone of a display image.

Figure 35:
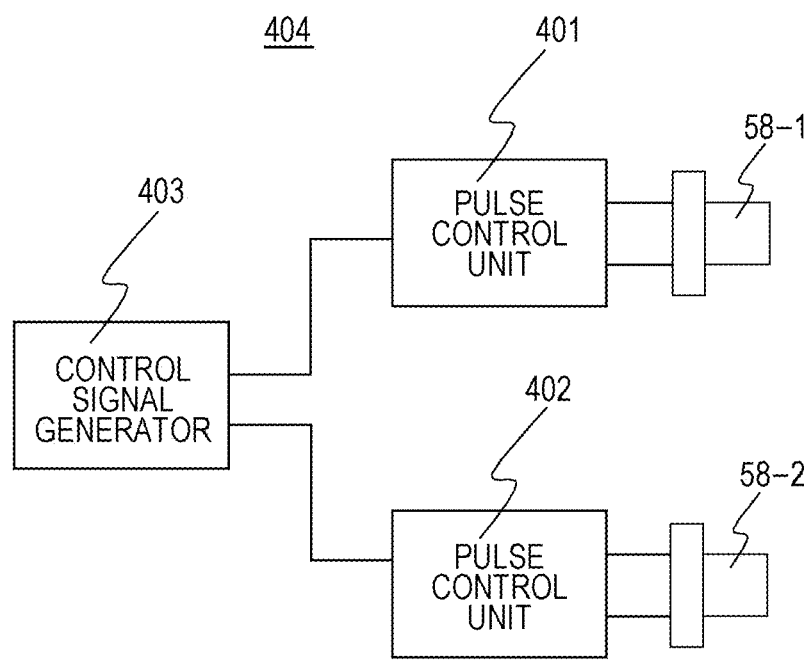
FIG. 35 is a block diagram of an example of a light source drive unit.

FIG. 35 is a block diagram of an example of a light source drive unit of the present embodiment. A light source drive unit 404 can be applied to any of the embodiments described above and can drive any of the light sources described above. The light source drive unit 404 includes the LD device 58-1 as a blue light source, the LD device 58-2 as a green light source, the pulse control units 401 and 402, and the control signal generator 403. The pulse control units 401 and 402 and the control signal generator 403 are examples of control circuits. The pulse control unit 401 outputs a drive pulse to the LD device 58-1 and drives the LD device 58-1. The pulse control unit 402 outputs a drive pulse to the LD device 58-2 and drives the LD device 58-2. The control signal generator 403 outputs a control signal to the pulse control units 401 and 402 and independently controls the pulse width of a drive pulse output from the pulse control units 401 and 402. Thus, light output of the LD devices 58-1 and 58-2 can be independently controlled.

In the present disclosure, all or part of a unit, an apparatus, a member, or a portion, or all or part of a functional block illustrated in a figure may be implemented by one or more electronic circuits including a semiconductor device, a semiconductor integrated circuit (IC), or a large scale integration (LSI). LSI or IC may be integrated on one chip or a plurality of chips. For example, a functional block other than a memory device may be integrated on one chip. LSI or IC herein may also be a system LSI, a very large scale integration (VLSI), or an ultralarge scale integration (ULSI), depending on the degree of integration. A field programmable gate array (FPGA) programmed after the manufacture of LSI or a reconfigurable logic device, which allows reconfiguration of the junction relationship in LSI or setup of a circuit block in LSI, can also be used for the same purpose.

Furthermore, the function or operation of all or part of a unit, an apparatus, a member, or a portion may be performed by software processing. In this case, software is stored on one or a plurality of nontemporary recording media, such as a ROM, an optical disk, or a hard disk drive. When the software runs on a processing unit (processor), the function specified by the software is performed by the processing unit (processor) and a peripheral device. A system or apparatus may include one or a plurality of nontemporary recording media on which software is stored, a processing unit (processor), and a required hardware device, for example, an interface.

At least two selected from the group consisting of embodiments, modified examples, and examples of the present disclosure may be appropriately combined.

A projector of the present disclosure can be utilized in various projectors and, in particular, can also be used as a projector for projection mapping, which requires high efficiency and high power.

What is claimed is:
1. A projector comprising:
a light source unit;
a spatial light modulator configured to control light from the light source unit for each pixel to form an optical image; and
a projection optical system configured to project the optical image formed by the spatial light modulator onto a target, wherein:
the light source unit includes a solid-state light source and a wavelength convertor,
the solid-state light source is configured to emit first light, the first light including blue light with a peak wavelength in a range of 430 to 470 nm, inclusive, and green light with a peak wavelength in a range of 480 to 550 nm, inclusive,
the wavelength convertor contains at least a red phosphor including Ce as a luminescent center,
the red phosphor is configured to emit second light upon receiving the green light, and
the second light has a spectrum with a peak wavelength in a range of 600 to 700 nm, inclusive, and
the red phosphor contains a crystal phase having a chemical composition $Ce_xM_{3-x-y}\beta_6\gamma_{11-z}$,
M denotes one or two or more elements selected from the group consisting of Sc, Y, La, Pr, Nd, Sm, Eu, Gd, Tb, Dy, Ho, Er, Tm, Yb, and Lu,
β includes Si in an amount of not less than 50% by mole,
γ includes N in an amount of not less than 80% by mole, and
x, y and z satisfies $0<x\leq0.6$, $0\leq y\leq1.0$, and $0\leq z\leq1.0$.

2. The projector according to claim 1, wherein
the peak wavelength of the green light emitted from the solid-state light source is in a range of 510 to 540 nm, inclusive.

3. The projector according to claim 1, wherein
the solid-state light source includes a GaN semiconductor laser.

4. The projector according to claim 3, wherein
the GaN semiconductor laser is configured to emit the blue light, and
the solid-state light source further includes a YAG:Nd solid-state laser that is configured to emit the green light and that includes a second harmonic generator.

5. The projector according to claim 1, wherein
the red phosphor has a 1/e afterglow value of 100 ns or less.

6. The projector according to claim 1, wherein:
the wavelength convertor further contains at least one phosphor different from the red phosphor, and
each of all phosphors in the wavelength convertor has a 1/e afterglow value of not more than 100 ns.

7. The projector according to claim 1, wherein
the red phosphor contains a host material, the host material containing Y or a lanthanoid element other than Ce.

8. The projector according to claim 1, wherein
the red phosphor contains a host material having a tetragonal crystal structure.

9. The projector according to claim 1, wherein
the red phosphor contains a crystal phase having a chemical composition $Ce_xM_{3-x}Si_{6-q}Al_qN_{11-z}$, where q satisfies $0 \leq q \leq 2.0$.

10. The projector according to claim 9, wherein
the red phosphor contains a crystal phase having a chemical composition $Ce_xLa_{3-x}Si_{6-q}Al_qN_{11-z}$, where q satisfies $0 < q \leq 2.0$.

11. The projector according to claim 9, wherein
the red phosphor contains a crystal phase having a chemical composition $Ce_xY_pLa_{3-x-p}Si_6N_{11}$, where x and p satisfy $(1.5-x) \leq p \leq (3-x)$.

12. The projector according to claim 1, wherein
the wavelength convertor further contains a phosphor containing a garnet crystal including Ce as a luminescent center.

13. A projector comprising:
a light source unit
a spatial light modulator configured to control light from the light source unit for each pixel to form an optical image; and
a projection optical system configured to project the optical image formed by the spatial light modulator onto a target, wherein:
the light source unit includes a solid-state light source and a wavelength convertor,
the solid-state light source is configured to emit first light, the first light including blue light with a peak wavelength in a range of 430 to 470 nm, inclusive, and green light with a peak wavelength in a range of 480 to 550 nm, inclusive,
the wavelength convertor contains at least a red phosphor including Ce as a luminescent center,
the red phosphor is configured to emit second light upon receiving the green light,
the second light has a spectrum with a peak wavelength in a range of 600 to 700 nm, inclusive,
the solid-state light source includes a blue laser that is configured to emit the blue light and a green laser that is configured to emit the green light, and
the projector further includes a dichroic mirror by which the blue light and the green light are coaxially multiplexed to be incident on the wavelength convertor.

14. The projector according to claim 1, wherein
the wavelength convertor includes a first phosphor layer containing the red phosphor and a second phosphor layer containing at least one selected from the group consisting of a yellow phosphor and a yellow-green phosphor.

15. A projector comprising:
a light source unit
a spatial light modulator configured to control light from the light source unit for each pixel to form an optical image; and
a projection optical system configured to project the optical image formed by the spatial light modulator onto a target, wherein:
the light source unit includes a solid-state light source and a wavelength convertor,
the solid-state light source is configured to emit first light, the first light including blue light with a peak wavelength in a range of 430 to 470 nm, inclusive, and green light with a peak wavelength in a range of 480 to 550 nm, inclusive,
the wavelength convertor contains at least a red phosphor including Ce as a luminescent center,
the red phosphor is configured to emit second light upon receiving the green light,
the second light has a spectrum with a peak wavelength in a range of 600 to 700 nm, inclusive,
the wavelength convertor includes a first phosphor layer containing the red phosphor and a second phosphor layer containing at least one selected from the group consisting of a yellow phosphor and a yellow-green phosphor,
an excitation efficiency of the red phosphor is lower for the blue light than for the green light,
the second phosphor is excited upon receiving the blue light, and
the first phosphor layer in the wavelength convertor is closer to a light incident side of the wavelength convertor than the second phosphor layer.

16. A projector comprising:
a light source unit;
a spatial light modulator configured to control light from the light source unit for each pixel to form an optical image;
a projection optical system configured to project the optical image formed by the spatial light modulator onto a target; and
a control circuit configured to control the light source unit, wherein:
the light source unit includes a solid-state light source and a wavelength convertor,
the solid-state light source is configured to emit first light, the first light including blue light with a peak wavelength in a range of 430 to 470 nm, inclusive, and green light with a peak wavelength in a range of 480 to 550 nm, inclusive,
the wavelength convertor contains at least a red phosphor including Ce as a luminescent center,
the red phosphor is configured to emit second light upon receiving the green light,
the second light has a spectrum with a peak wavelength in a range of 600 to 700 nm, inclusive,
the light source unit further includes a transmission-type wheel, the transmission-type wheel includes a transmission region and a red phosphor region, the red phosphor region including the wavelength convertor, the solid-state light source includes a blue laser that is configured to emit the blue light and a green laser that is configured to emit the green light, the control circuit is configured to control the blue laser and the green laser to emit the blue light and the green light, respectively, in a time-divided manner in synchronism with rotation of the transmission-type wheel, the transmission region is configured to transmit at least the green light, and the spatial light modulator is configured to control the light including the blue light, the green light, and the second light emitted from the light source unit for each pixel.

17. The projector according to claim 1, further comprising: a control circuit configured to control the light source unit, wherein the light source unit further includes a reflection-type wheel, the reflection-type wheel includes a red phosphor region including the wavelength convertor, the solid-state light source includes a blue laser that is configured to emit the blue light and a green laser that is configured to emit the green light, the red phosphor region has a first surface disposed such that the green light is incident on the first surface, the red phosphor region further has a second surface opposite the first surface, the reflection-type wheel further includes a reflective layer, the reflective layer includes a first region disposed on a second surface side of the red phosphor region and a second region different from the first region, the first region configured to reflect the second light when the second light is incident on the first region, the second region configured to reflect the green light when the green light is incident on the second region, the control circuit is configured to control the blue laser and the green laser to emit the blue light and the green light, respectively, in a time-divided manner in synchronism with rotation of the reflection-type wheel, and the spatial light modulator controls the light including the blue light, the green light, and the second light emitted from the light source unit for each pixel.

18. A projector comprising:

a light source unit a control circuit configured to control the light source unit;

a spatial light modulator configured to control light from the light source unit for each pixel to form an optical image; and a projection optical system configured to project the optical image formed by the spatial light modulator onto a target, wherein:

the light source unit includes a solid-state light source and a wavelength convertor, the solid-state light source is configured to emit first light, the first light including blue light with a peak wavelength in a range of 430 to 470 nm, inclusive, and green light with a peak wavelength in a range of 480 to 550 nm, inclusive, the wavelength convertor contains at least a red phosphor including Ce as a luminescent center, the red phosphor is configured to emit second light upon receiving the green light, the second light has a spectrum with a peak wavelength in a range of 600 to 700 nm, inclusive, the light source unit further includes a reflection-type wheel, the reflection-type wheel includes a red phosphor region including the wavelength convertor, the solid-state light source includes a blue laser that is configured to emit the blue light and a green laser that is configured to emit the green light, the red phosphor region has a first surface disposed such that the green light is incident on the first surface, the red phosphor region further has a second surface opposite the first surface, the reflection-type wheel further includes a reflective layer, the reflective layer includes a first region disposed on a second surface side of the red phosphor region and a second region different from the first region, the first region configured to reflect the second light when the second light is incident on the first region, the second region configured to reflect the green light when the green light is incident on the second region, the control circuit is configured to control the blue laser and the green laser to emit the blue light and the green light, respectively, in a time-divided manner in synchronism with rotation of the reflection-type wheel, the spatial light modulator controls the light including the blue light, the green light, and the second light emitted from the light source unit for each pixel, the reflection-type wheel further includes a scattering region containing a scatterer, the scattering region has a third surface disposed such that the green light and the blue light are incident on the third surface, the scattering region further has a fourth surface opposite the third surface, the second region of the reflective layer is disposed on a fourth surface side of the scattering region and configured to reflect the blue light when the blue light is incident on the second region, and the control circuit is configured to control the blue laser and the green laser to emit the blue light and the green light, respectively, in a time-divided manner in synchronism with rotation of the reflection-type wheel such that (a) in case of red projection, the green light is incident on the red phosphor region of the reflection-type wheel, (b) in case of blue projection, the blue light is incident on the scattering region of the reflection-type wheel, and (c) in case of green projection, the green light is incident on the scattering region of the reflection-type wheel.

19. The projector according to claim 1, wherein the red phosphor contains a nitride or an oxynitride as a host material.

* * * * *